(12) United States Patent
Iwashita et al.

(10) Patent No.: US 8,586,281 B2
(45) Date of Patent: Nov. 19, 2013

(54) POSITIVE RESIST COMPOSITION AND METHOD OF FORMING RESIST PATTERN

(75) Inventors: Jun Iwashita, Kawasaki (JP); Masahito Yahagi, Kawasaki (JP); Kenri Konno, Kawasaki (JP); Isamu Takagi, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 218 days.

(21) Appl. No.: 13/156,159

(22) Filed: Jun. 8, 2011

(65) Prior Publication Data

US 2011/0311912 A1     Dec. 22, 2011

(30) Foreign Application Priority Data

Jun. 17, 2010   (JP) ............................... P2010-138536

(51) Int. Cl.
*G03F 7/028* (2006.01)
*G03F 7/039* (2006.01)
*G03F 7/26* (2006.01)

(52) U.S. Cl.
USPC ......... 430/270.1; 430/326; 430/921; 430/925

(58) Field of Classification Search
USPC ............... 430/270.1, 326, 921, 925
See application file for complete search history.

(56) References Cited

U.S. PATENT DOCUMENTS

| | | | |
|---|---|---|---|
| 5,945,517 | A | 8/1999 | Nitta et al. |
| 6,153,733 | A | 11/2000 | Yukawa et al. |
| 6,492,085 | B1 | 12/2002 | Shimatani et al. |
| 7,423,102 | B2 * | 9/2008 | Lee et al. ............ 526/200 |
| 7,482,108 | B2 | 1/2009 | Matsumaru et al. |
| 2007/0149702 | A1 * | 6/2007 | Ando et al. ............ 524/556 |
| 2007/0166641 | A1 * | 7/2007 | Shimizu et al. ............ 430/270.1 |
| 2010/0055606 | A1 | 3/2010 | Mimura et al. |
| 2010/0248144 | A1 * | 9/2010 | Iwai et al. ............ 430/285.1 |

FOREIGN PATENT DOCUMENTS

| | | |
|---|---|---|
| JP | A-09-208554 | 8/1997 |
| JP | A-10-221852 | 8/1998 |
| JP | A-2001-051411 | 8/1998 |
| JP | A-11-035551 | 2/1999 |
| JP | A-11-035552 | 2/1999 |
| JP | A-11-035573 | 2/1999 |
| JP | A-11-035652 | 2/1999 |
| JP | A-11-322707 | 11/1999 |
| JP | A-2001-051411 | 2/2001 |
| JP | A-2006-045311 | 2/2006 |
| WO | WO 2004/074242 | 9/2004 |

* cited by examiner

*Primary Examiner* — Anca Eoff
(74) *Attorney, Agent, or Firm* — Knobbe Martens Olson & Bear LLP

(57) ABSTRACT

A positive resist composition including:
a base component; and
a sensitizer which a polymeric compound having a core portion that includes a hydrocarbon group or a heterocycle of two or more valences and at least one arm portion bonded to the core portion and represented by formula (1), and a polymeric compound having a core portion including a polymer having a molecular weight of 500 to 20,000 and at least one arm portion bonded to the core portion and represented by formula (1); and either the base component includes a resin component that generates acid upon exposure and exhibits increased solubility in an alkali developing solution under action of acid, or the positive resist composition further contains an acid generator component including a compound that generates acid upon exposure:

—(X)—Y    (1)

in which X represents a divalent linking group having an acid dissociable group; and Y represents a polymer chain.

3 Claims, No Drawings

POSITIVE RESIST COMPOSITION AND METHOD OF FORMING RESIST PATTERN

BACKGROUND OF THE INVENTION

1. Field of the Invention

The present invention relates to a positive resist composition and a method of forming a resist pattern that uses the positive resist composition.

Priority is claimed on Japanese Patent Application No. 2010-138536, filed Jun. 17, 2010, the content of which is incorporated herein by reference.

2. Description of Related Art

In lithography techniques, for example, a resist film composed of a resist material is formed on a substrate, and the resist film is subjected to selective exposure of radial rays such as light or electron beam through a mask having a predetermined pattern, followed by development, thereby forming a resist pattern having a predetermined shape on the resist film.

A resist material in which the exposed portions become soluble in a developing solution is called a positive-type, and a resist material in which the exposed portions become insoluble in a developing solution is called a negative-type.

In recent years, in the production of semiconductor elements and liquid crystal display elements, advances in lithography techniques have led to rapid progress in the field of pattern miniaturization.

Typically, these miniaturization techniques involve shortening the wavelength (and increasing the energy) of the exposure light source. Conventionally, ultraviolet radiation typified by g-line and i-line radiation of emission lines of mercury has been used, but nowadays KrF excimer lasers and ArF excimer lasers are now starting to be introduced in mass production. Furthermore, research is also being conducted into lithography techniques that use an exposure light source having a shorter wavelength (and higher energy) than these excimer lasers, such as electron beam, extreme ultraviolet radiation (EUV), and X ray.

Resist materials for use with these types of exposure light sources require lithography properties such as a high resolution capable of reproducing patterns of minute dimensions, and a high level of sensitivity to these types of exposure light sources.

As a resist material which satisfies these conditions, a chemically amplified resist composition is used, which includes a base component that exhibits a changed solubility in an alkali developing solution under the action of acid and an acid generator that generates acid upon exposure.

For example, a chemically amplified positive resist typically contains a resin component (base resin) that exhibits increased solubility in an alkali developing solution under the action of acid, and an acid generator component. If the resist film formed using this resist composition is selectively exposed during formation of a resist pattern, then acid is generated from the acid generator within the exposed portions, and the action of this acid causes an increase in the solubility of the resin component in an alkali developing solution, making the exposed portions soluble in the alkali developing solution.

Currently, resins that contain structural units derived from (meth)acrylate esters within the main chain (acrylic resins) are widely used as base resins for resists that use ArF excimer laser lithography and the like, as they exhibit excellent transparency in the vicinity of 193 nm (for example, see Patent Document 1). Here, the term "(meth)acrylic acid" is a generic term that includes either or both of acrylic acid having a hydrogen atom bonded to the α-position and methacrylic acid having a methyl group bonded to the α-position. The term "(meth)acrylate ester" is a generic term that includes either or both of the acrylate ester having a hydrogen atom bonded to the α-position and the methacrylate ester having a methyl group bonded to the α-position. The term "(meth)acrylate" is a generic term that includes either or both of the acrylate having a hydrogen atom bonded to the α-position and the methacrylate having a methyl group bonded to the α-position.

Further, in order to improve various lithography properties, a resin having a plurality of structural units is currently used as the base resin for a chemically amplified resist. For example, in the case of a positive resist composition, a resin containing a structural unit having an acid dissociable, dissolution inhibiting group that is dissociated by the action of acid generated from the acid generator, as well as a structural unit having a polar group such as a hydroxyl group, a structural unit having a lactone structure or the like is typically used. Among these structural units, a structural unit having a lactone structure is generally considered as being effective in improving the adhesion between the resist film and the substrate, and increasing the compatibility with an alkali developing solution, thereby contributing to improvement in various lithography properties.

In recent years, base resins that include a structural unit which functions as an acid generator have also been used (see, for example, Patent Documents 1 and 2).

Further, sensitizers such as polyphenol compounds have been known for improving the sensitivity to the exposure light sources as those described above (see, for example, Patent Document 3).

PRIOR ART DOCUMENTS

Patent Documents

[Patent Document 1] Japanese Unexamined Patent Application, First Publication No. Hei 10-221852

[Patent Document 2] Japanese Unexamined Patent Application, First Publication No. 2006-045311

[Patent Document 3] Japanese Unexamined Patent Application, First Publication No. 2001-051411

SUMMARY OF THE INVENTION

In those cases where a chemically amplified resist composition containing a base resin as those described in the above Patent Documents 1 and 2 is used, a sensitizer may be used in combination (paragraph [0124] in Patent Document 1). However, the effects of improving sensitivity by the conventional sensitizers as those described in the above Patent Documents 1 and 3 have been inadequate. Further, the resolution deteriorated when a conventional sensitizer was used.

Furthermore, the conventional sensitizers as those described above do not cause polarity change by the action of acid in the exposed portions of a chemically amplified resist composition. As a result, while exhibiting a sensitizing action, conventional sensitizers do not contribute to the dissolution contrast (i.e., the difference in the solubility in an alkali developing solution between the unexposed portions and the exposed portions) which is important for the lithography properties. Thus, addition of sensitizers does not improve the lithography properties. Accordingly, sensitizers that exhibit a sensitizing action, and may also contribute to the improvements of dissolution contrast are required.

In the future, as further progress is made in lithography techniques and the potential application fields for lithography techniques continue to expand, demands will grow for novel materials capable of being used in these lithography applications. For example, further progress in pattern miniaturization will result in ever greater demands for improvements in resist materials, both in terms of sensitivity and in terms of various lithography properties such as the resolution, exposure latitude (EL) margin and line edge roughness (LER).

The present invention takes the above circumstances into consideration, with an object of providing a positive resist composition exhibiting excellent sensitivity and lithography properties, and a method of forming a resist pattern that uses the positive resist composition.

In order to achieve the above object, the present invention adopts the aspects described below.

That is, a first aspect of the present invention is a positive resist composition that includes a base component (A) that exhibits increased solubility in an alkali developing solution under the action of acid and a sensitizer (G), wherein the sensitizer (G) is at least one compound selected from the group consisting of a polymeric compound (G1) having a core portion that includes a hydrocarbon group or a heterocycle of two or more valences and also at least one arm portion that is bonded to the core portion and is represented by general formula (1) shown below, and a polymeric compound (G2) having a core portion that includes a polymer having a molecular weight of 500 or more and 20,000 or less and also at least one arm portion that is bonded to the core portion and is represented by general formula (1) shown below; and either the base component (A) includes a resin component (A1) that generates acid upon exposure and also exhibits increased solubility in an alkali developing solution under the action of acid, or the positive resist composition further contains an acid generator component (B) that includes a compound that generates acid upon exposure.

[Chemical Formula 1]

$$—(X)—Y \quad (1)$$

In the formula, X represents a divalent linking group having an acid dissociable group, and Y represents a polymer chain.

A second aspect of the present invention is a method of forming a resist pattern, including: applying a resist composition of the first aspect to a substrate to form a resist film on the substrate; conducting exposure of the resist film; and alkali-developing the resist film to form a resist pattern.

In the present description and claims, the term "aliphatic" is a relative concept used in relation to the term "aromatic", and defines a group or compound or the like that has no aromaticity.

An "alkyl group", unless otherwise specified, includes linear, branched and cyclic, monovalent saturated hydrocarbon groups.

The term "alkylene group" includes linear, branched and cyclic divalent saturated hydrocarbon groups, unless otherwise specified. The same applies for the "alkyl group within an alkoxy group".

A "halogenated alkyl group" is a group in which part or all of the hydrogen atoms of an alkyl group have been substituted with a halogen atom. Examples of the halogen atom include a fluorine atom, a chlorine atom, a bromine atom and an iodine atom.

A "fluorinated alkyl group" or a "fluorinated alkylene group" is a group in which part or all of the hydrogen atoms of an alkyl group or an alkylene group have been substituted with a fluorine atom.

The term "structural unit" refers to a monomer unit that contributes to the formation of a polymeric compound (namely, a resin, polymer or copolymer).

A "structural unit derived from an acrylate ester" refers to a structural unit that is formed by the cleavage of the ethylenic double bond of an acrylate ester.

The term "acrylate ester" is a generic term that includes acrylate esters having a hydrogen atom bonded to the carbon atom on the α-position, and acrylate esters having a substituent (an atom other than a hydrogen atom or a group) bonded to the carbon atom on the α-position. Examples of the substituent bonded to the carbon atom on the α-position include an alkyl group of 1 to 5 carbon atoms, a halogenated alkyl group of 1 to 5 carbon atoms and a hydroxyalkyl group of 1 to 5 carbon atoms or the like.

A carbon atom on the α-position of an acrylate ester refers to the carbon atom bonded to the carbonyl group, unless specified otherwise.

The term "hydroxystyrene derivative" is a generic term that includes both the narrow definition of hydroxystyrene, as well as compounds in which the α-position hydrogen atom of the narrowly defined hydroxystyrene has been substituted with a substituent group such as an alkyl group or a halogenated alkyl group or the like, and derivatives thereof. Furthermore, unless stated otherwise, a carbon atom on the α-position of hydroxystyrene refers to the carbon atom to which the benzene ring is bonded.

The expression "structural unit derived from a hydroxystyrene derivative" describes a structural unit that is formed by the cleavage of the ethylenic double bond of the hydroxystyrene derivative.

The term "styrene" refers to a general concept including styrene itself, as well as structures in which the hydrogen atom at the α-position in styrene has been substituted by another substituent group such as an alkyl group.

The term "structural unit derived from styrene" refers to a structural unit which is formed by the cleavage of the ethylenic double bond of styrene. In the styrene, the hydrogen atom of the phenyl group may be substituted with a substituent such as an alkyl group of 1 to 5 carbon atoms.

The term "exposure" is used as a general concept that includes irradiation with any form of radiation, including an ArF excimer laser, KrF excimer laser, $F_2$ excimer laser, extreme ultraviolet rays (EUV), vacuum ultraviolet rays (VUV), electron beam (EB), X-rays or soft X-rays.

According to the present invention, there are provided a positive resist composition exhibiting excellent sensitivity and lithography properties, and a method of forming a resist pattern that uses the positive resist composition.

DETAILED DESCRIPTION OF THE INVENTION

<<Positive Resist Composition>>

A positive resist composition of the present invention (hereafter, frequently referred to simply as a "resist composition") includes a base component (A) (hereafter, referred to as a "component (A)") that exhibits increased solubility in an alkali developing solution under the action of acid and a sensitizer (G) (hereafter, referred to as a "component (G)").

Furthermore, in the positive resist composition of the present invention, either the aforementioned component (A) includes a resin component (A1) (hereafter, referred to as a "component (A1)") that generates acid upon exposure and also exhibits increased solubility in an alkali developing solution under the action of acid, or the positive resist composition further contains an acid generator component (B) (hereafter, referred to as a "component (B)") including a compound that generates acid upon exposure.

In the positive resist composition, when radial rays are irradiated (when exposure is conducted), acid is generated from either one of the component (A1) or the component (B), and the component (A) (component (A1)) exhibits increased solubility in an alkali developing solution by the action of this acid. Therefore, in the formation of a resist pattern, by conducting selective exposure of a resist film formed by using the positive resist composition, the solubility of the exposed portions in an alkali developing solution is increased, whereas the solubility of the unexposed portions of this resist film in an alkali developing solution is unchanged, and hence, a resist pattern can be formed by alkali developing.

Here, the term "base component" refers to an organic compound capable of forming a film. As the base component, an organic compound having a molecular weight of 500 or more can be preferably used. When the organic compound has a molecular weight of 500 or more, the film-forming ability is improved, and a nano level resist pattern can be easily formed.

The "organic compounds having a molecular weight of 500 or more" which can be used as the base component can be broadly classified into non-polymers and polymers.

In general, as a non-polymer, any of those compounds having a molecular weight of at least 500 but less than 4,000 may be used. Hereafter, a non-polymer having a molecular weight in the range of 500 to less than 4,000 is referred to as a "low molecular weight compound".

In general, as a polymer, any of those compounds having a molecular weight of 1,000 or more may be used. Hereafter, a polymer having a molecular weight of 1,000 or more is referred to as a "polymeric compound". In the case of a polymeric compound, the "molecular weight" refers to the polystyrene-equivalent weight average molecular weight value determined by gel permeation chromatography (GPC). Hereafter, a polymeric compound is frequently referred to as simply a "resin".

<Component (A)>

As the component (A), either a single organic compound that has been typically used as a base component for a positive resist composition, or a mixture of two or more such organic compounds, may be used.

Of the various possibilities, the component (A) in the present invention is preferably at least one component selected from the group consisting of the resin component (A1) that generates acid upon exposure and also exhibits increased solubility in an alkali developing solution by the action of acid, and a resin component (A2) (hereafter, referred to as a "component (A2)") that does not generate acid upon exposure and also exhibits increased solubility in an alkali developing solution by the action of acid.

The components (A1) and (A2) in the present invention may have the same structures as those of the polymeric compounds (G1) and (G2) of the component (G) to be described later, as long as they are resin components that exhibit increased solubility in an alkali developing solution by the action of acid. However, structures of the component (A1) and (A2) are preferably different from those of the component (G), and include an arm portion and a core portion in the component (G), but not a main chain decomposition type polymeric compound in which an acid dissociable group in the arm portion is cleaved by the action of acid.

[Component (A1)]

As the component (A1), either a single resin component that generates acid upon exposure and also exhibits increased solubility in an alkali developing solution by the action of acid, or a mixture of two or more such resin components, may be used.

In the present invention, as the component (A1), a resin component containing a structural unit derived from an acrylate ester is preferred.

In the present invention, it is particularly desirable that the component (A1) have a structural unit (a0-2) that generates acid upon exposure, and a structural unit (a1) derived from an acrylate ester containing an acid dissociable, dissolution inhibiting group.

Further, the component (A1) may have at least one type of structural unit (a2) selected from the group consisting of a structural unit derived from an acrylate ester containing a $—SO_2$-containing cyclic group and a structural unit derived from an acrylate ester containing a lactone-containing cyclic group, as well as the structural unit (a0-2) and the structural unit (a1).

Moreover, in addition to the structural units (a0-2) and (a1), or in addition to the structural units (a0-2), (a1) and (a2), the component (A1) may also have a structural unit (a3) derived from an acrylate ester that contains a polar group-containing aliphatic hydrocarbon group.

In the present descriptions and the claims, the term "structural unit derived from an acrylate ester" refers to a structural unit which is formed by the cleavage of the ethylenic double bond of an acrylate ester.

The term "acrylate ester" is a generic term that includes acrylate esters having a hydrogen atom bonded to the carbon atom on the α-position, and acrylate esters having a substituent (an atom other than a hydrogen atom or a group) bonded to the carbon atom on the α-position. Examples of the substituent bonded to the carbon atom on the α-position include an alkyl group of 1 to 5 carbon atoms, a halogenated alkyl group of 1 to 5 carbon atoms and a hydroxyalkyl group of 1 to 5 carbon atoms.

A carbon atom on the α-position of an acrylate ester refers to the carbon atom bonded to the carbonyl group, unless specified otherwise.

With respect to the acrylate ester, specific examples of the alkyl group of 1 to 5 carbon atoms for the substituent at the α-position include linear or branched alkyl groups of 1 to 5 carbon atoms such as a methyl group, ethyl group, propyl group, isopropyl group, n-butyl group, isobutyl group, tert-butyl group, pentyl group, isopentyl group and neopentyl group.

Specific examples of the halogenated alkyl group of 1 to 5 carbon atoms for the substituent at the α-position include groups in which some or all of the hydrogen atoms of the aforementioned "alkyl group of 1 to 5 carbon atoms for the substituent at the α-position" are substituted with halogen atoms. Examples of the halogen atom include a fluorine atom, a chlorine atom, a bromine atom and an iodine atom, and a fluorine atom is particularly desirable.

It is preferable that a hydrogen atom, an alkyl group of 1 to 5 carbon atoms or a halogenated alkyl group of 1 to 5 carbon atoms is bonded to the α-position of the acrylate ester, and more preferably a hydrogen atom, an alkyl group of 1 to 5 carbon atoms or a fluorinated alkyl group of 1 to 5 carbon atoms. In terms of industrial availability, a hydrogen atom or a methyl group is the most desirable.

(Structural Unit (a0-2))

A structural unit (a0-2) is a structural unit that generates acid upon exposure.

There are no particular limitations on the structural unit (a0-2), as long as it is a structural unit that generates acid upon exposure. For example, a structural unit in which a compound proposed as an acid generator for conventional chemically amplified resists has been introduced to a structural unit that is copolymerizable with the structural unit (a1) described later can be used.

Preferred examples of the structural units that are copolymerizable with the structural unit (a1) include structural units derived from (meth)acrylate esters and structural units derived from hydroxystyrene or the like.

Preferred examples of the compounds proposed as an acid generator for conventional chemically amplified resists include the component (B) described later.

Of the various possibilities, the structural unit (a0-2) of the present invention preferably includes a group represented by general formula (a0-2-10) or (a0-2-20) shown below.

[Chemical Formula 2]

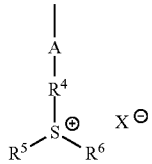
(a0-2-10)

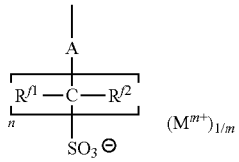
(a0-2-20)

In the formulas, A represents a single bond or a divalent linking group; $R^4$ represents an arylene group which may have a substituent; each of $R^5$ and $R^6$ independently represents an organic group, wherein $R^5$ and $R^6$ may be mutually bonded to form a ring with the sulfur atom in the formula; $X^-$ represents a counter anion; each of $R^{f1}$ and $R^{f2}$ independently represents a hydrogen atom, an alkyl group, a fluorine atom or a fluorinated alkyl group, provided that at least one of $R^{f1}$ and $R^{f2}$ represents a fluorine atom or a fluorinated alkyl group; n represents an integer of 1 to 8; $M^{m+}$ represents a counter cation; and m represents an integer of 1 to 3.

In formulas (a0-2-10) or (a0-2-20), A represents a single bond or a divalent linking group.

Preferred examples of the divalent linking group for A include divalent hydrocarbon groups which may have a substituent, and divalent linking groups containing a hetero atom or the like.

The description that the hydrocarbon group "may have a substituent" means that some or all of the hydrogen atoms within the hydrocarbon group may be substituted with an atom other than a hydrogen atom or with a group.

The hydrocarbon group is preferably an aliphatic hydrocarbon group, but may be an aromatic hydrocarbon group. An "aliphatic hydrocarbon group" refers to a hydrocarbon group that has no aromaticity.

The aliphatic hydrocarbon group may be saturated or unsaturated, but in general, is preferably saturated.

Specific examples of the aliphatic hydrocarbon group include linear and branched aliphatic hydrocarbon groups, and aliphatic hydrocarbon groups containing a ring in the structure thereof.

The linear or branched aliphatic hydrocarbon group is preferably a group of 1 to 10 carbon atoms, more preferably 1 to 8 carbon atoms, still more preferably 1 to 5 carbon atoms, and most preferably 1 or 2 carbon atoms.

The linear aliphatic hydrocarbon group is preferably a linear alkylene group, and specific examples include a methylene group [—$CH_2$—], ethylene group [—$(CH_2)_2$—], trimethylene group [—$(CH_2)_3$—], tetramethylene group [—$(CH_2)_4$—], or pentamethylene group [—$(CH_2)_5$—].

As the branched aliphatic hydrocarbon group, a branched alkylene group is preferable, and specific examples include alkylalkylene groups, including alkylmethylene groups such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$— and —$C(CH_2CH_3)_2$—, alkylethylene groups such as —$CH(CH_3)CH_2$—, —$CH(CH_3)CH(CH_3)$—, —$C(CH_3)_2CH_2$—, —$CH(CH_2CH_3)CH_2$— and —$C(CH_2CH_3)_2$—$CH_2$—, alkyltrimethylene groups such as —$CH(CH_3)CH_2CH_2$— and —$CH_2CH(CH_3)CH_2$—, and alkyltetramethylene groups such as —$CH(CH_3)CH_2CH_2CH_2$— and —$CH_2CH(CH_3)CH_2CH_2$—. As the alkyl group within the alkylalkylene group, a linear alkyl group of 1 to 5 carbon atoms is preferable.

The chain-like aliphatic hydrocarbon group may or may not have a substituent. Examples of the substituent include a fluorine atom, a fluorinated alkyl group of 1 to 5 carbon atoms have been substituted with a fluorine atom, and an oxygen atom (=O).

Examples of the aliphatic hydrocarbon group containing a ring in the structure thereof include cyclic aliphatic hydrocarbon groups (groups in which two hydrogen atoms have been removed from an aliphatic hydrocarbon ring), and groups in which this type of cyclic aliphatic hydrocarbon group is either bonded to the terminal of an aforementioned chain-like aliphatic hydrocarbon group, or interposed within the chain of an aforementioned chain-like aliphatic hydrocarbon group.

The cyclic aliphatic hydrocarbon group preferably has 3 to 20 carbon atoms, and more preferably 3 to 12 carbon atoms.

The cyclic aliphatic hydrocarbon group may be either a polycyclic group or a monocyclic group. As the monocyclic group, a group in which two hydrogen atoms have been removed from a monocycloalkane of 3 to 6 carbon atoms is preferable. Specific examples of the monocycloalkane include cyclopentane and cyclohexane.

As the polycyclic group, a group in which two hydrogen atoms have been removed from a polycycloalkane of 7 to 12 carbon atoms is preferable. Specific examples of the polycycloalkane include adamantane, norbornane, isobornane, tricyclodecane and tetracyclododecane.

The cyclic aliphatic hydrocarbon group may or may not have a substituent. Examples of the substituent include an alkyl group of 1 to 5 carbon atoms, a fluorine atom, a fluorinated alkyl group of 1 to 5 carbon atoms have been substituted with a fluorine atom, and an oxygen atom (=O).

Examples of the aromatic hydrocarbon group include divalent aromatic hydrocarbon groups in which an additional hydrogen atom has been removed from the nucleus of a monovalent aromatic hydrocarbon group such as a phenyl group, biphenyl group, fluorenyl group, naphthyl group, anthryl group or phenanthryl group;

aromatic hydrocarbon groups in which a portion of the carbon atoms that constitute the ring of an aforementioned divalent aromatic hydrocarbon group have been substituted with a hetero atom such as an oxygen atom, sulfur atom or nitrogen atom; and aromatic hydrocarbon groups in which an additional hydrogen atom has been removed from the nucleus of an arylalkyl group such as a benzyl group, phenethyl group, 1-naphthylmethyl group, 2-naphthylmethyl group, 1-naphthylethyl group or 2-naphthylethyl group.

The aromatic hydrocarbon group may or may not have a substituent. Examples of the substituent include an alkyl group of 1 to 5 carbon atoms, a fluorine atom, a fluorinated alkyl group of 1 to 5 carbon atoms have been substituted with a fluorine atom, and an oxygen atom (=O).

With respect to a divalent linking group containing a hetero atom, a hetero atom is an atom other than a carbon atom or hydrogen atom, and examples thereof include an oxygen atom, a nitrogen atom, a sulfur atom and a halogen atom or the like.

Specific examples of the divalent linking group containing a hetero atom include —O—, —C(=O)—, —C(=O)—O—, a carbonate bond (—O—C(=O)—O—), —NH—, —NR$^{04}$— (R$^{04}$ represents an alkyl group of 1 to 5 carbon atoms), —NH—C(=O)—, and =N—. Further, a combination of any one of these "divalent linking groups containing a hetero atom" with a divalent hydrocarbon group can also be used. As examples of the divalent hydrocarbon group, the same groups as those described above for the hydrocarbon group which may have a substituent can be given, and a linear or branched aliphatic hydrocarbon group is preferable.

The divalent linking group may or may not have an acid dissociable portion in the structure thereof. An "acid dissociable portion" refers to a portion within the organic group which is dissociated from the organic group by action of acid generated upon exposure. When the divalent linking group has an acid dissociable portion, it preferably has an acid dissociable portion having a tertiary carbon atom.

In the present invention, as the divalent linking group for A, an alkylene group, a divalent aliphatic cyclic group or a divalent linking group containing a hetero atom is preferable. Among these, an alkylene group is particularly desirable.

In those cases where A represents an alkylene group, the alkylene group preferably has 1 to 10 carbon atoms, more preferably 1 to 6 carbon atoms, still more preferably 1 to 4 carbon atoms, and most preferably 1 to 3 carbon atoms. Specific examples of alkylene groups include the same linear alkylene groups and branched alkylene groups as those described above.

In those cases where A represents a divalent aliphatic cyclic group, as the aliphatic cyclic group, the same aliphatic cyclic groups as those described above for the "aliphatic hydrocarbon group containing a ring in the structure thereof" can be used.

As the aliphatic cyclic group, a group in which two or more hydrogen atoms have been removed from cyclopentane, cyclohexane, norbornane, isobornane, adamantane, tricyclodecane or tetracyclododecane is particularly desirable.

In those cases where A represents a divalent linking group containing a hetero atom, preferred examples of the linking groups include —O—, —C(=O)—O—, —C(=O)—, —O—C(=O)—O—, —C(=O)—NH—, —NH— (H may be replaced with a substituent such as an alkyl group, an acyl group or the like), —S—, —S(=O)$_2$—, —S(=O)$_2$—O—, a group represented by formula -A$_1$-O—B$_1$—, and a group represented by formula -[A$_1$-C(=O)—O]$_m$B$_1$—. Herein, each of A$_1$ and B$_1$ independently represents a divalent hydrocarbon group which may have a substituent, and m represents an integer of 0 to 3.

In those cases where A represents —NH—, H may be replaced with a substituent such as an alkyl group, an acyl group or the like. The substituent (an alkyl group, an acyl group or the like) preferably has 1 to 10 carbon atoms, more preferably 1 to 8 carbon atoms, and most preferably 1 to 5 carbon atoms.

In the group represented by the formula -A$_1$-O—B$_1$— or -[A$_1$-C(=O)—O]$_m$—B$_1$—, each of A$_1$ and B$_1$ independently represents a divalent hydrocarbon group which may have a substituent.

Examples of divalent hydrocarbon groups for A$_1$ and B$_1$ which may have a substituent include the same groups as those described above for the "divalent hydrocarbon group which may have a substituent" usable as A.

As A$_1$, a linear aliphatic hydrocarbon group is preferable, more preferably a linear alkylene group, still more preferably a linear alkylene group of 1 to 5 carbon atoms, and a methylene group or an ethylene group is particularly desirable.

As B$_1$, a linear or branched aliphatic hydrocarbon group is preferable, and a methylene group, an ethylene group or an alkylmethylene group is more preferable. The alkyl group within the alkylmethylene group is preferably a linear alkyl group of 1 to 5 carbon atoms, more preferably a linear alkyl group of 1 to 3 carbon atoms, and most preferably a methyl group.

Further, in the group represented by the formula -[A$_1$-C(=O)—O]$_m$—B$_1$—, m represents an integer of 0 to 3, preferably an integer of 0 to 2, more preferably 0 or 1, and most preferably 1.

In formula (a0-2-10), R$^4$ represents an arylene group which may have a substituent. The R$^4$ group may have one substituent, or a plurality of substituents.

The arylene group for R$^4$ is not particularly limited. For example, an arylene group having 6 to 20 carbon atoms can be used, in which part or all of the hydrogen atoms of the arylene group may be substituted. For example, the arylene group may or may not be substituted with an alkyl group, an alkoxy group, a halogen atom, a hydroxyl group or the like.

The arylene group is preferably an arylene group of 6 to 10 carbon atoms because it can be synthesized at a low cost. Specific examples thereof include a phenylene group and a naphthylene group. Of these, a phenylene group is particularly desirable.

The alkyl group, with which hydrogen atoms of the arylene group may be substituted, is preferably an alkyl group having 1 to 5 carbon atoms, more preferably a methyl group, an ethyl group, a propyl group, an n-butyl group, or a tert-butyl group, and most preferably a methyl group.

The alkoxy group, with which hydrogen atoms of the arylene group may be substituted, is preferably an alkoxy group having 1 to 5 carbon atoms, more preferably a methoxy group, an ethoxy group, an n-propoxy group, an iso-propoxy group, an n-butoxy group or a tert-butoxy group.

The halogen atom, with which hydrogen atoms of the arylene group may be substituted, is preferably a fluorine atom.

In formula (a0-2-10), each of R$^5$ and R$^6$ independently represents an organic group.

The organic group for R$^5$ and R$^6$ refers to a group containing a carbon atom, and may include atoms other than carbon atoms (e.g., a hydrogen atom, an oxygen atom, a nitrogen atom, a sulfur atom, a halogen atom (such as a fluorine atom or a chlorine atom) and the like).

The organic group for R$^5$ and R$^6$ is preferably an aryl group or an alkyl group.

The aryl group for R$^5$ and R$^6$ is not particularly limited. For example, an aryl group having 6 to 20 carbon atoms can be used, in which part or all of the hydrogen atoms of the aryl group may be substituted. For example, the aryl group may or may not be substituted with an alkyl group, an alkoxy group, a halogen atom, a hydroxyl group or the like.

The aryl group is preferably an aryl group having 6 to 10 carbon atoms because it can be synthesized at a low cost. Specific examples thereof include a phenyl group and a naphthyl group. Of these, a phenyl group is particularly desirable.

As examples of the alkyl group, alkoxy group and halogen atom with which the hydrogen atoms of the aryl group may be substituted, the same alkyl group, alkoxy group and halogen atom as those with which the arylene group for $R^4$ may be substituted can be given.

The alkyl group for $R^5$ and $R^6$ is not particularly limited and includes, for example, a linear, branched or cyclic alkyl group having 1 to 10 carbon atoms. In terms of achieving excellent resolution, the alkyl group preferably has 1 to 5 carbon atoms. Specific examples include a methyl group, an ethyl group, an n-propyl group, an isopropyl group, an n-butyl group, an isobutyl group, an n-pentyl group, a cyclopentyl group, a hexyl group, a cyclohexyl group, a nonyl group and a decanyl group or the like. Among these, a methyl group is preferable because it is excellent in resolution and can be synthesized at a low cost.

In formula (a0-2-10), $R^5$ and $R^6$ may be mutually bonded to form a ring with the sulfur atom in the formula.

In such a case, the ring including the sulfur atom is preferably a 3- to 10-membered ring, and more preferably a 5- to 7-membered ring.

The ring structure formed with the sulfur atom may include a hetero atom such as a sulfur atom or an oxygen atom (—O—, =O).

Specific examples of the ring formed include a benzene ring, a naphthalene ring, an anthracene ring, a phenanthrene ring, a fluorene ring, a triphenylene ring, a naphthacene ring, a biphenyl ring, a pyrrole ring, a furan ring, a thiophene ring, an imidazole ring, an oxazole ring, a thiazole ring, a pyridine ring, a pyrazine ring, a pyrimidine ring, a pyridazine ring, an indolizine ring, an indole ring, a benzofuran ring, a benzothiophene ring, an isobenzofuran ring, a quinolizine ring, a quinoline ring, a phthalazine ring, a naphthyridine ring, a quinoxaline ring, a quinoxazoline ring, an isoquinoline ring, a carbazole ring, a phenanthridine ring, an acridine ring, a phenanthroline ring, a thianthrene ring, a chromene ring, a xanthene ring, a phenoxathiin ring, a phenothiazine ring and a phenazine ring or the like.

In formula (a0-2-10), $X^-$ represents a counter anion.

The counter anion for $X^-$ is not particularly limited, and examples thereof include an anion moiety ($R^{4''}SO_3^-$) of the onium salt-based acid generator represented by general formula (b-1) or (b-2) in the component (B) described later; and an anion moiety represented by general formula (b-3) or (b-4) in the component (B) described later. In particular, the counter anion for $X^-$ is preferably $R^{4''}SO_3^-$, and more preferably a fluorinated alkylsulfonate ion of 1 to 8 carbon atoms (preferably 1 to 4 carbon atoms) or at least one member selected from those represented by general formulas (b1) to (b8) to be described later.

In formula (a0-2-20), each of $R^{f1}$ and $R^{f2}$ independently represents a hydrogen atom, an alkyl group, a fluorine atom or a fluorinated alkyl group, provided that at least one of $R^{f1}$ and $R^{f2}$ represents a fluorine atom or a fluorinated alkyl group.

The alkyl group for $R^{f1}$ and $R^{f2}$ is preferably an alkyl group of 1 to 5 carbon atoms, and specific examples thereof include a methyl group, an ethyl group, a propyl group, an isopropyl group, an n-butyl group, an isobutyl group, a tert-butyl group, a pentyl group, an isopentyl group and a neopentyl group or the like.

The fluorinated alkyl group for $R^{f1}$ and $R^{f2}$ is preferably a group in which part or all of the hydrogen atoms within the aforementioned alkyl group for $R^{f1}$ and $R^{f2}$ have been substituted with a fluorine atom.

In the present invention, $R^{f1}$ and $R^{f2}$ is preferably a fluorine atom.

In formula (a0-2-20), n represents an integer of 1 to 8, preferably an integer of 1 to 4, and more preferably 1 or 2.

In formula (a0-2-20), $M^{m+}$ represents a counter cation, and m represents an integer of 1 to 3.

Examples of the counter cation for $M^{m+}$ include a metal cation and an onium cation.

Examples of the metal ion for $M^{m+}$ include alkali metal ions such as sodium, potassium and lithium; alkaline earth metal ions such as magnesium and calcium; an iron ion; and an aluminum ion or the like. Among these examples, in terms of ease in ion exchange to a sulfonate, a sodium ion, a potassium ion or a lithium ion is preferable.

Examples of the onium cation for $M^{m+}$ include a sulfonium cation, an iodonium cation, a phosphonium cation, a diazonium cation, an ammonium cation and a pyridinium cation or the like. Among these, cations which are the same as the cation moieties of an onium salt-based acid generator represented by general formula (b-1) or (b-2) in the component (B) described later are preferred.

Specific examples of the group represented by formula (a0-2-10) or (a0-2-20) are shown below.

[Chemical Formula 3]

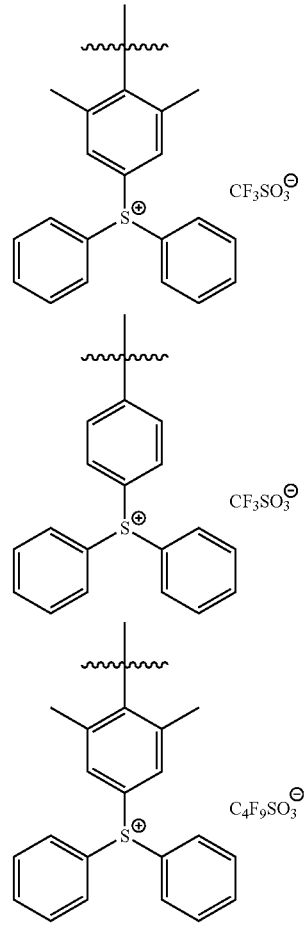

-continued
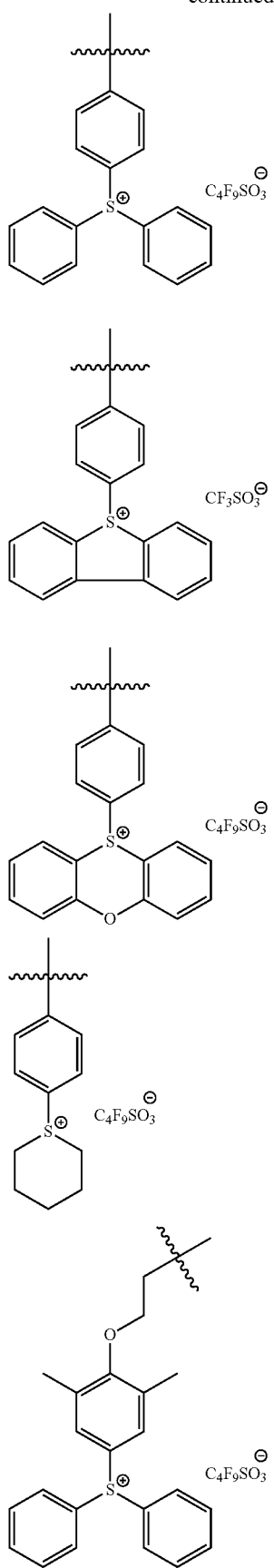
[Chemical Formula 4]
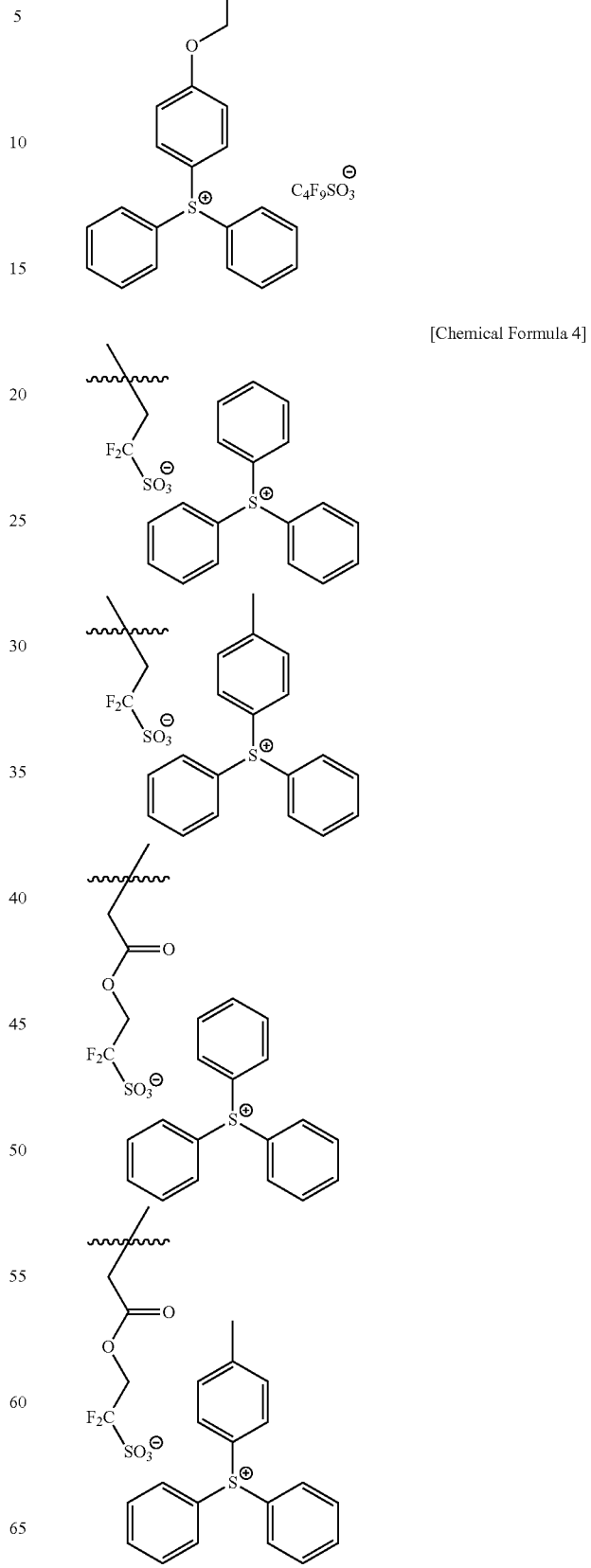

In the present invention, the structural unit (a0-2) is preferably a structural unit (a0-2-1) represented by general formula (a0-2-1) shown below or a structural unit (a0-2-2) represented by general formula (a0-2-2) shown below.

[Chemical Formula 5]

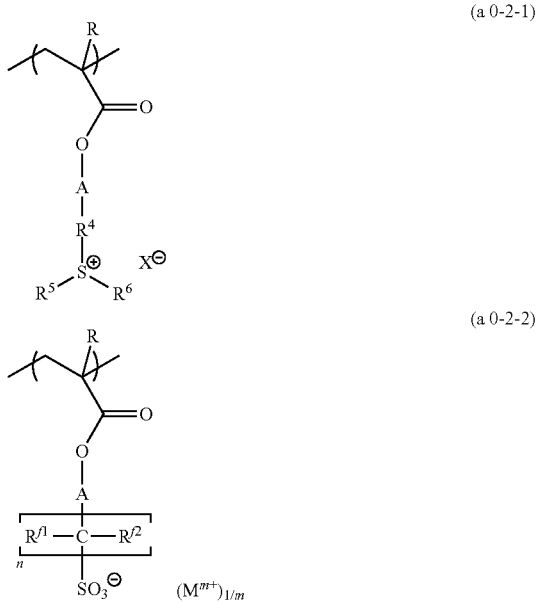

In the formulas, R represents a hydrogen atom, an alkyl group of 1 to 5 carbon atoms or a halogenated alkyl group of 1 to 5 carbon atoms; A represents a single bond or a divalent linking group; $R^4$ represents an arylene group which may have a substituent; each of $R^5$ and $R^6$ independently represents an organic group, wherein $R^5$ and $R^6$ may be mutually bonded to form a ring with the sulfur atom in the formula; $X^-$ represents a counter anion; each of $R^{f1}$ and $R^{f2}$ independently represents a hydrogen atom, an alkyl group, a fluorine atom or a fluorinated alkyl group, provided that at least one of $R^{f1}$ and $R^{f2}$ represents a fluorine atom or a fluorinated alkyl group; n represents an integer of 1 to 8; $M^{m+}$ represents a counter cation; and m represents an integer of 1 to 3.

In formulas (a0-2-1) and (a0-2-2), R represents a hydrogen atom, an alkyl group of 1 to 5 carbon atoms or a halogenated alkyl group of 1 to 5 carbon atoms.

The alkyl group for R is preferably a linear or branched alkyl group of 1 to 5 carbon atoms, and specific examples thereof include a methyl group, an ethyl group, a propyl group, an isopropyl group, an n-butyl group, an isobutyl group, a tert-butyl group, a pentyl group, an isopentyl group and a neopentyl group.

The halogenated alkyl group of 1 to 5 carbon atoms for R is a group in which some or all of the hydrogen atoms of the alkyl group of 1 to 5 carbon atoms have been substituted with halogen atoms. Examples of the halogen atom include a fluorine atom, a chlorine atom, a bromine atom and an iodine atom, and a fluorine atom is particularly desirable.

R is preferably a hydrogen atom, an alkyl group of 1 to 5 carbon atoms or a fluorinated alkyl group of 1 to 5 carbon atoms. In terms of industrial availability, a hydrogen atom or a methyl group is the most desirable.

In formulas (a0-2-1) and (a0-2-2), A, $R^4$, $R^5$, $R^6$, $X^-$, $R^{f1}$, $R^{f2}$, n, $M^{m+}$ and m are respectively the same as defined for A, $R^4$, $R^5$, $R^6$, $X^-$, $R^{f1}$, $R^{f2}$, n, $M^{m+}$ and m in the aforementioned formulas (a0-2-10) and (a0-2-20).

In the component (A 1), as the structural unit (a0-2), one type of structural unit may be used alone, or two or more types of structural units may be used in combination.

In the component (A1), the amount of the structural unit (a0-2) based on the combined total of all structural units constituting the component (A1) is preferably 1 to 40 mol %, more preferably 1 to 35 mol %, and still more preferably 3 to 30 mol %. When the amount of the structural unit (a0-2) is within the above-mentioned range, the effects of the present invention are improved.

(Structural Unit (a1))

The structural unit (a1) is a structural unit derived from an acrylate ester containing an acid dissociable, dissolution inhibiting group.

The "acid dissociable, dissolution inhibiting group" is a group having an alkali dissolution-inhibiting effect that renders the entire component (A1) insoluble in an alkali developing solution prior to dissociation, and also acid dissociability to dissociate by the action of acid generated from at least one member selected from the group consisting of the component (A1) and the component (B) upon exposure. When the acid dissociable, dissolution inhibiting group in the structural unit (a1) dissociates, the solubility of the entire component (A1) in an alkali developing solution increases.

As the acid dissociable, dissolution inhibiting group in the structural unit (a 1), any of those that have been proposed as acid dissociable, dissolution inhibiting groups for a base resin of a chemically amplified resist can be used. Generally, groups that form either a cyclic or chain-like tertiary alkyl ester with the carboxyl group of the (meth)acrylic acid, and acetal-type acid dissociable, dissolution inhibiting groups such as alkoxyalkyl groups are widely known. Here, the term "(meth)acrylate ester" is a generic term that includes either or both of the acrylate ester having a hydrogen atom bonded to the α-position and the methacrylate ester having a methyl group bonded to the α-position.

Here, a tertiary alkyl ester describes a structure in which an ester is formed by substituting the hydrogen atom of a carboxyl group with a chain-like or cyclic tertiary alkyl group, and a tertiary carbon atom within the chain-like or cyclic tertiary alkyl group is bonded to the oxygen atom at the terminal of the carbonyloxy group (—C(O)—O—). In this tertiary alkyl ester, the action of acid causes cleavage of the bond between the oxygen atom and the tertiary carbon atom.

The chain-like or cyclic alkyl group may have a substituent.

Hereafter, for the sake of simplicity, groups that exhibit acid dissociability as a result of the formation of a tertiary alkyl ester with a carboxyl group are referred to as "tertiary alkyl ester-type acid dissociable, dissolution inhibiting groups".

Examples of tertiary alkyl ester-type acid dissociable, dissolution inhibiting groups include aliphatic branched, acid dissociable, dissolution inhibiting groups and aliphatic cyclic group-containing acid dissociable, dissolution inhibiting groups.

Here, the term "aliphatic branched" refers to a branched structure having no aromaticity. The "aliphatic branched acid dissociable, dissolution inhibiting group" is not limited to structures constituted of only carbon atoms and hydrogen atoms (not limited to hydrocarbon groups), but is preferably a hydrocarbon group. Further, the "hydrocarbon group" may be either saturated or unsaturated, but is preferably saturated.

As an example of the aliphatic branched, acid dissociable, dissolution inhibiting group, for example, a group represented by the formula —C($R^{71}$)($R^{72}$)($R^{73}$) can be given (in the formula, each of $R^{71}$ to $R^{73}$ independently represents a linear alkyl group of 1 to 5 carbon atoms). The group represented by the formula —C($R^{71}$)($R^{72}$)($R^{73}$) preferably has 4 to 8 carbon atoms, and specific examples include a tert-butyl group, a 2-methyl-2-butyl group, a 2-methyl-2-pentyl group and a 3-methyl-3-pentyl group or the like. Among these, a tert-butyl group is particularly desirable.

The term "aliphatic cyclic group" refers to a monocyclic group or polycyclic group that has no aromaticity.

In the "aliphatic cyclic group-containing acid dissociable, dissolution inhibiting group", the "aliphatic cyclic group" may or may not have a substituent. Examples of the substituent include an alkyl group of 1 to 5 carbon atoms, an alkoxy group of 1 to 5 carbon atoms, a fluorine atom, a fluorinated alkyl group of 1 to 5 carbon atoms have been substituted with a fluorine atom, and an oxygen atom (=O) or the like.

The basic ring of the "aliphatic cyclic group" exclusive of substituents is not limited to structures constituted from only carbon and hydrogen (not limited to hydrocarbon groups), but is preferably a hydrocarbon group. Further, the hydrocarbon group may be either saturated or unsaturated, but is preferably saturated.

The aliphatic cyclic group may be either a monocyclic group or a polycyclic group.

Examples of the aliphatic cyclic group include groups in which one or more hydrogen atoms have been removed from a monocycloalkane or a polycycloalkane such as a bicycloalkane, tricycloalkane or tetracycloalkane, which may or may not be substituted with an alkyl group of 1 to 5 carbon atoms, a fluorine atom or a fluorinated alkyl group. Specific examples of aliphatic cyclic hydrocarbon groups include groups in which one or more hydrogen atoms have been removed from a monocycloalkane such as cyclopentane or cyclohexane; and groups in which one or more hydrogen atoms have been removed from a polycycloalkane such as adamantane, norbornane, isobornane, tricyclodecane or tetracyclododecane. In these aliphatic cyclic hydrocarbon groups, part of the carbon atoms constituting the ring may be replaced with an ether group (—O—).

Examples of aliphatic cyclic group-containing acid dissociable, dissolution inhibiting groups include (i) a group which forms a tertiary carbon atom on the ring structure of a monovalent aliphatic cyclic group in which a substituent (a group or an atom other than hydrogen) is bonded to the carbon atom to which an atom adjacent to the acid dissociable, dissolution inhibiting group (e.g., "—O—" within "—C(=O)—O— group") is bonded t; and (ii) a group which has a branched alkylene group containing a tertiary carbon atom, and a monovalent aliphatic cyclic group to which the tertiary carbon atom is bonded.

In the group (i), as the substituent bonded to the carbon atom to which an atom adjacent to the acid dissociable, dissolution inhibiting group is bonded on the ring skeleton of the aliphatic cyclic group, an alkyl group can be mentioned. Examples of the alkyl group include the same groups as those represented by $R^{14}$ in formulas (1-1) to (1-9) described later.

Specific examples of the group (i) include groups represented by general formulas (1-1) to (1-9) shown below.

Specific examples of the group (ii) include groups represented by general formulas (2-1) to (2-6) shown below.

[Chemical Formula 6]

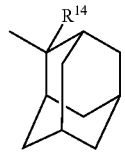
(1-1)

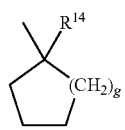
(1-2)

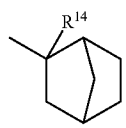
(1-3)

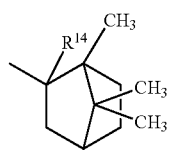
(1-4)

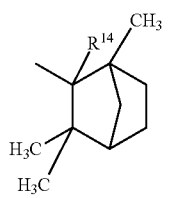
(1-5)

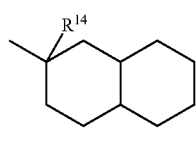
(1-6)

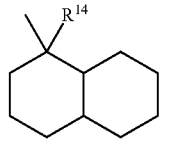
(1-7)

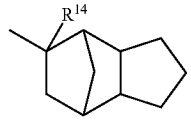
(1-8)

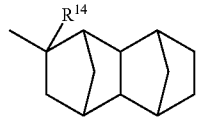
(1-9)

In the formulas, $R^{14}$ represents an alkyl group; and g represents an integer of 0 to 8.

[Chemical Formula 7]

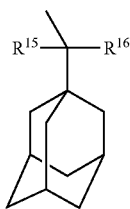
(2-1)

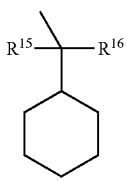
(2-2)

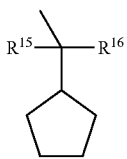
(2-3)

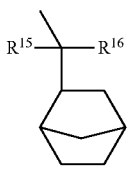
(2-4)

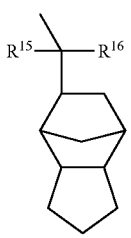
(2-5)

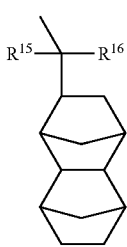
(2-6)

In the formulas, each of $R^{15}$ and $R^{16}$ independently represents an alkyl group.

As the alkyl group for $R^{14}$, a linear or branched alkyl group is preferable.

The linear alkyl group preferably has 1 to 5 carbon atoms, more preferably 1 to 4 carbon atoms, and still more preferably 1 or 2 carbon atoms. Specific examples include a methyl group, an ethyl group, an n-propyl group, an n-butyl group and an n-pentyl group. Among these, a methyl group, an ethyl group or an n-butyl group is preferable, and a methyl group or an ethyl group is more preferable.

The branched alkyl group preferably has 3 to 10 carbon atoms, and more preferably 3 to 5 carbon atoms. Specific examples of such branched alkyl groups include an isopropyl group, an isobutyl group, a tert-butyl group, an isopentyl group and a neopentyl group, and an isopropyl group is particularly desirable.

g is preferably an integer of 0 to 3, more preferably an integer of 1 to 3, and still more preferably 1 or 2.

As the alkyl group for $R^{15}$ and $R^{16}$, the same alkyl groups as those for $R^{14}$ can be used.

In formulas (1-1) to (1-9) and (2-1) to (2-6) above, part of the carbon atoms constituting the ring may be replaced with an ethereal oxygen atom (—O—).

Further, in formulas (1-1) to (1-9) and (2-1) to (2-6), one or more of the hydrogen atoms bonded to the carbon atoms constituting the ring may be substituted with a substituent. Examples of the substituent include an alkyl group of 1 to 5 carbon atoms, a fluorine atom and a fluorinated alkyl group.

An "acetal-type acid dissociable, dissolution inhibiting group" generally substitutes a hydrogen atom at the terminal of an alkali-soluble group such as a carboxy group or hydroxyl group, so as to be bonded with an oxygen atom. When acid is generated upon exposure, the generated acid acts to break the bond between the acetal-type acid dissociable, dissolution inhibiting group and the oxygen atom to which the acetal-type, acid dissociable, dissolution inhibiting group is bonded.

Examples of acetal-type acid dissociable, dissolution inhibiting groups include groups represented by general formula (p1) shown below.

[Chemical Formula 8]

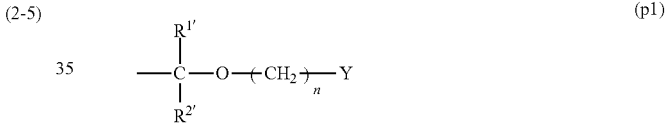
(p1)

In the formula, each of $R^{1'}$ and $R^{2'}$ independently represents a hydrogen atom or an alkyl group of 1 to 5 carbon atoms; n represents an integer of 0 to 3; and Y represents an alkyl group of 1 to 5 carbon atoms or an aliphatic cyclic group.

In general formula (p1), n is preferably an integer of 0 to 2, more preferably 0 or 1, and most preferably 0.

As the alkyl group for $R^{1'}$ and $R^{2'}$, the same alkyl groups as those described above for the substituent on the α-position of the aforementioned acrylate ester can be used, although a methyl group or ethyl group is preferable, and a methyl group is particularly desirable.

In the present invention, it is preferable that at least one of $R^{1'}$ and $R^{2'}$ be a hydrogen atom. That is, it is preferable that the acid dissociable, dissolution inhibiting group (p1) is a group represented by general formula (p1-1) shown below.

[Chemical Formula 9]

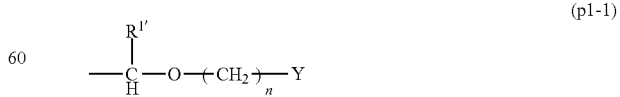
(p1-1)

In the formula, $R^{1'}$ represents a hydrogen atom or an alkyl group of 1 to 5 carbon atoms; n represents an integer of 0 to 3; and Y represents an alkyl group of 1 to 5 carbon atoms or an aliphatic cyclic group.

As the alkyl group for Y, the same alkyl groups as those described above for the substituent on the α-position of the aforementioned acrylate ester can be used.

As the aliphatic cyclic group for Y, any of the aliphatic monocyclic or polycyclic groups that have been proposed for conventional ArF resists and the like can be appropriately selected for use. For example, the same aliphatic cyclic groups as those described above in connection with the "aliphatic cyclic group-containing acid dissociable, dissolution inhibiting group" can be used.

Further, as the acetal-type, acid dissociable, dissolution inhibiting group, groups represented by general formula (p2) shown below can also be used.

[Chemical Formula 10]

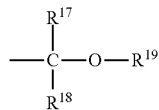

(p2)

In the formula, $R^{17}$ and $R^{18}$ each independently represents a linear or branched alkyl group or a hydrogen atom; and $R^{19}$ represents a linear, branched or cyclic alkyl group; or each of $R^{17}$ and $R^{19}$ may independently represents a linear or branched alkylene group, wherein $R^{17}$ is bonded to $R^{19}$ to form a ring.

The alkyl group for $R^{17}$ and $R^{18}$ preferably has 1 to 15 carbon atoms, and may be either linear or branched. As the alkyl group, an ethyl group or a methyl group is preferable, and a methyl group is most preferable.

It is particularly desirable that either one of $R^{17}$ and $R^{18}$ be a hydrogen atom, and the other be a methyl group.

$R^{19}$ represents a linear, branched or cyclic alkyl group which preferably has 1 to 15 carbon atoms, and may be any of linear, branched or cyclic.

When $R^{19}$ represents a linear or branched alkyl group, it is preferably an alkyl group of 1 to 5 carbon atoms, more preferably an ethyl group or methyl group, and most preferably an ethyl group.

When $R^{19}$ represents a cyclic alkyl group, it preferably has 4 to 15 carbon atoms, more preferably 4 to 12 carbon atoms, and most preferably 5 to 10 carbon atoms. As examples of the cyclic alkyl group, groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group, may be used. Specific examples include groups in which one or more hydrogen atoms have been removed from a monocycloalkane such as cyclopentane and cyclohexane; and groups in which one or more hydrogen atoms have been removed from a polycycloalkane such as adamantane, norbornane, isobornane, tricyclodecane or tetracyclododecane. Among these, a group in which one or more hydrogen atoms have been removed from adamantane is preferable.

Further, in general formula (p2) above, each of $R^{17}$ and $R^{19}$ may independently represent a linear or branched alkylene group (preferably an alkylene group of 1 to 5 carbon atoms), wherein $R^{19}$ is bonded to $R^{17}$.

In such a case, a cyclic group is formed by $R^{17}$, $R^{19}$, the oxygen atom having $R^{19}$ bonded thereto, and the carbon atom having the oxygen atom and $R^{17}$ bonded thereto. Such a cyclic group is preferably a 4- to 7-membered ring, and more preferably a 4- to 6-membered ring. Specific examples of the cyclic group include a tetrahydropyranyl group and a tetrahydrofuranyl group.

Specific examples of acetal-type acid dissociable, dissolution inhibiting groups include groups represented by formulas (p3-1) to (p3-12) shown below.

[Chemical Formula 11]

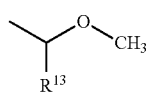

(p3-1)

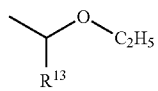

(p3-2)

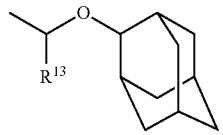

(p3-3)

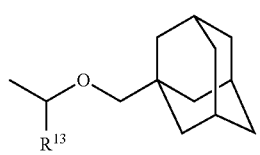

(p3-4)

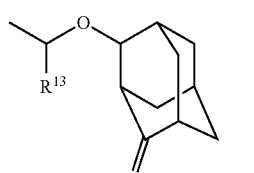

(p3-5)

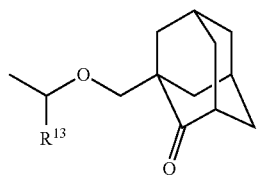

(p3-6)

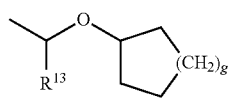

(p3-7)

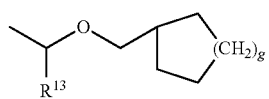

(p3-8)

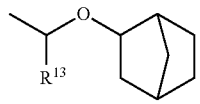

(p3-9)

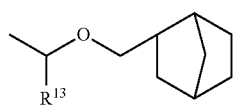

(p3-10)

-continued

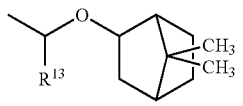
(p3-11)

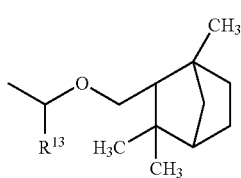
(p3-12)

In the formulas, $R^{13}$ represents a hydrogen atom or a methyl group; and g represents an integer of 0 to 8.

Specific examples of the structural unit (a1) include a structural unit represented by general formula (a1-0-1) shown below and a structural unit represented by general formula (a1-0-2) shown below.

[Chemical Formula 12]

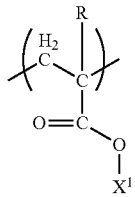
(a1-0-1)

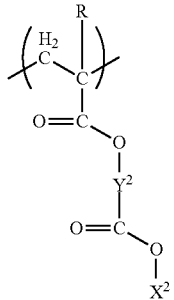
(a1-0-2)

In the formulas, R represents a hydrogen atom, an alkyl group of 1 to 5 carbon atoms or a halogenated alkyl group of 1 to 5 carbon atoms; $X^1$ represents an acid dissociable, dissolution inhibiting group; $Y^2$ represents a divalent linking group; and $X^2$ represents an acid dissociable, dissolution inhibiting group.

In general formula (a1-0-1), as the alkyl group or halogenated alkyl group for R, the same as those defined above for the alkyl group or halogenated alkyl group for the substituent on the α-position of an aforementioned acrylate ester can be used. R is preferably a hydrogen atom, an alkyl group of 1 to 5 carbon atoms or a fluorinated alkyl group of 1 to 5 carbon atoms, and is most preferably a hydrogen atom or a methyl group.

$X^1$ is not particularly limited as long as it is an acid dissociable, dissolution inhibiting group. Examples thereof include the aforementioned tertiary alkyl ester-type acid dissociable, dissolution inhibiting groups and acetal-type acid dissociable, dissolution inhibiting groups, and tertiary alkyl ester-type acid dissociable, dissolution inhibiting groups are preferable.

In general formula (a1-0-2), R is the same as defined above for R in formula (a1-0-1).

$X^2$ is the same as defined for $X^1$ in general formula (a1-0-1).

Examples of the divalent linking groups for $Y^2$ include the same divalent linking groups as those described above for A in general formula (a0-2). Of these, the divalent linking group for $Y^2$ is preferably a group represented by the formula -$A_1$-O-$B_1$— or -[$A_1$-C(=O)—O]$_m$—$B_1$—, more preferably a group represented by the formula -[$A_1$-C(=O)—O]$_m$—$B_1$—, still more preferably a group in which m is 1 in the formula above, and most preferably a group represented by formula —(CH$_2$)$_a$—C(=O)—O—(CH$_2$)$_b$—.

a is an integer of 1 to 10, preferably an integer of 1 to 8, more preferably an integer of 1 to 5, still more preferably 1 or 2, and most preferably 1.

b is an integer of 1 to 10, preferably an integer of 1 to 8, more preferably an integer of 1 to 5, still more preferably 1 or 2, and most preferably 1.

Specific examples of the structural unit (a1) include structural units represented by general formulas (a1-1) to (a1-4) shown below.

[Chemical Formula 13]

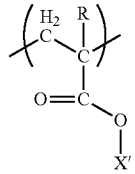
(a1-1)

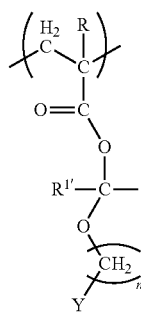
(a1-2)

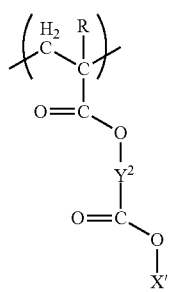
(a1-3)

-continued (a1-4)

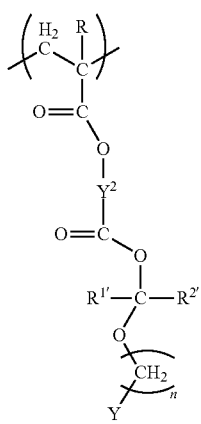

In the formulas, R represents a hydrogen atom, an alkyl group of 1 to 5 carbon atoms or a halogenated alkyl group of 1 to 5 carbon atoms; each of $R^{1'}$ and $R^{2'}$ independently represents a hydrogen atom or an alkyl group of 1 to 5 carbon atoms; n represents an integer of 0 to 3; Y represents an alkyl group of 1 to 5 carbon atoms or an aliphatic cyclic group; $Y^2$ represents a divalent linking group; and X' represents a tertiary alkyl ester-type acid dissociable, dissolution inhibiting group.

In the formulas, examples of X' include the same tertiary alkyl ester-type acid dissociable, dissolution inhibiting groups as those described above.

Examples of $R^{1'}$, $R^{2'}$, n and Y include the same groups and numbers as those listed above for $R^{1'}$, $R^{2'}$, n and Y in general formula (p1) described above in connection with the "acetal-type acid dissociable, dissolution inhibiting groups".

Examples of $Y^2$ include the same groups as those listed above for $Y^2$ in general formula (a1-0-2).

Specific examples of structural units represented by general formula (a1-1) to (a1-4) are shown below.

In each of the following formulas, $R^\alpha$ represents a hydrogen atom, a methyl group or a trifluoromethyl group.

[Chemical Formula 14]

(a1-1-1)

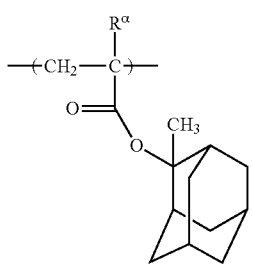

(a1-1-2)

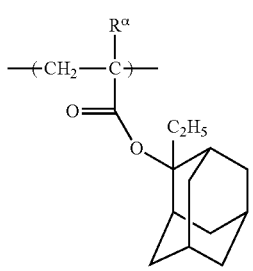

-continued (a1-1-3)

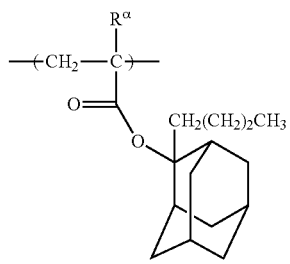

(a1-1-4)

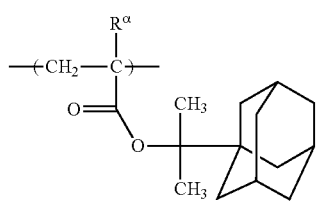

(a1-1-5)

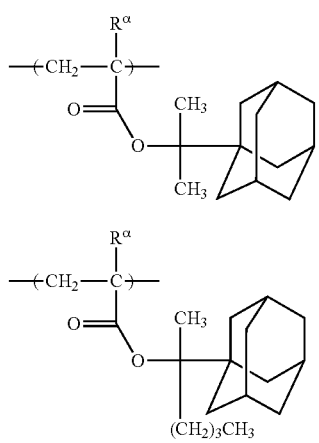

(a1-1-6)

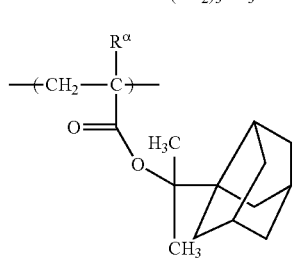

(a1-1-7)

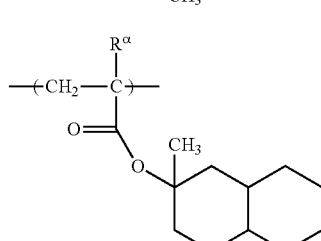

(a1-1-8)

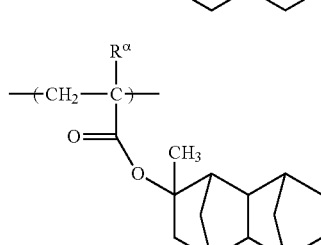

(a1-1-9)

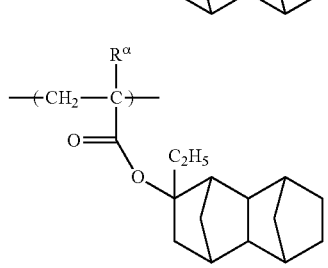

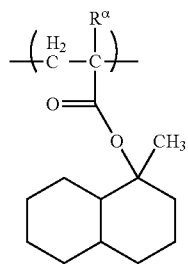 (a1-1-10)
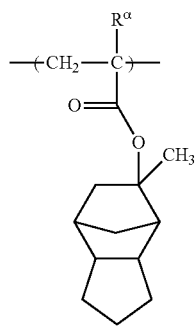 (a1-1-11)
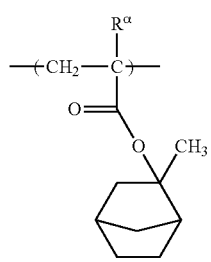 (a1-1-12)
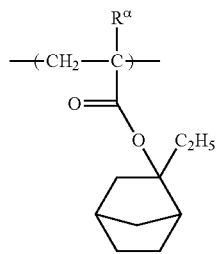 (a1-1-13)
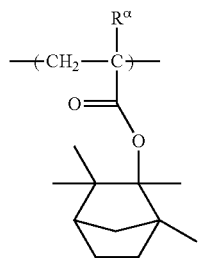 (a1-1-14)
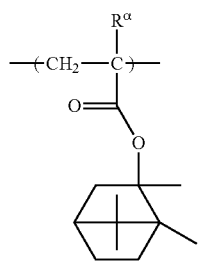 (a1-1-15)
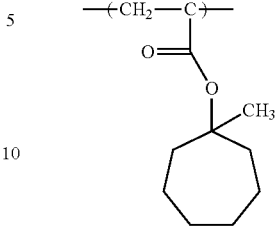 (a1-1-16)
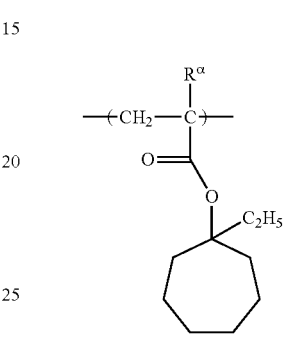 (a1-1-17)
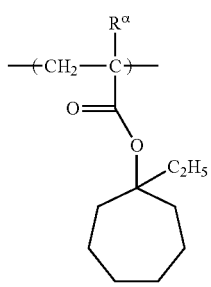 (a1-1-18)
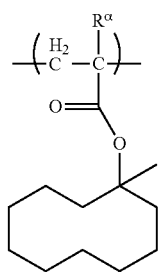 (a1-1-19)
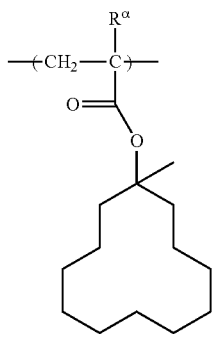 
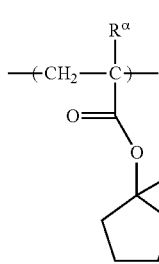 (a1-1-20)

(a1-1-21) 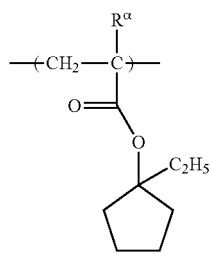
[Chemical Formula 15]
(a1-1-22) 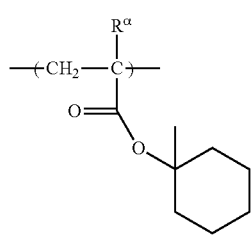
(a1-1-23) 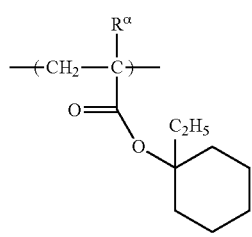
(a1-1-24) 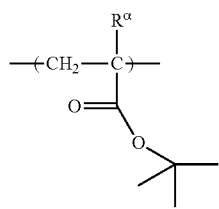
(a1-1-25) 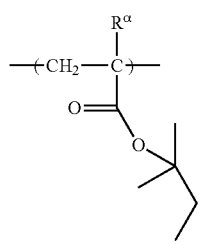
(a1-1-26) 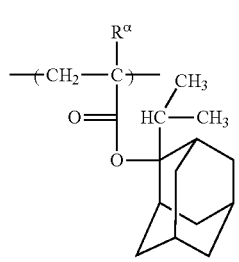
(a1-1-27) 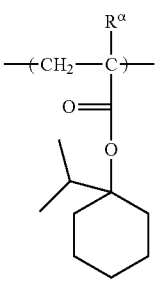
(a1-1-28) 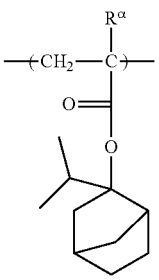
(a1-1-29) 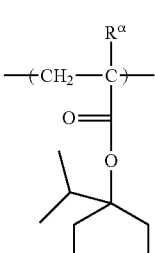
(a1-1-30) 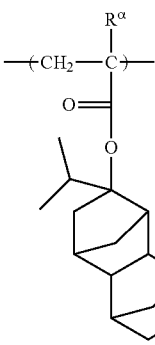
(a1-1-31) 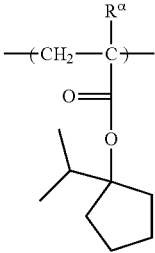

[Chemical Formula 16]
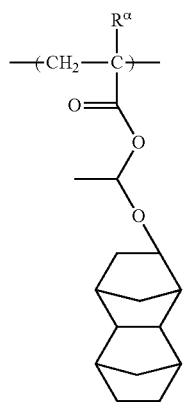 (a1-2-1)
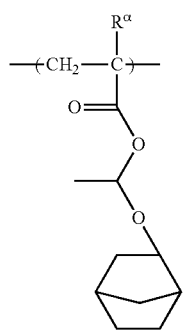 (a1-2-2)
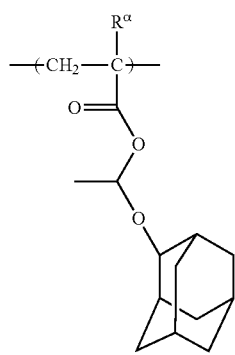 (a1-2-3)
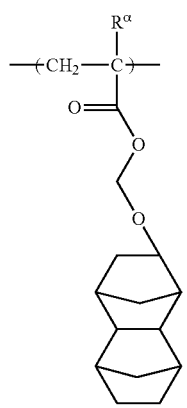 (a1-2-4)
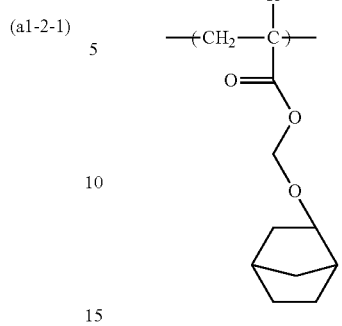 (a1-2-5)
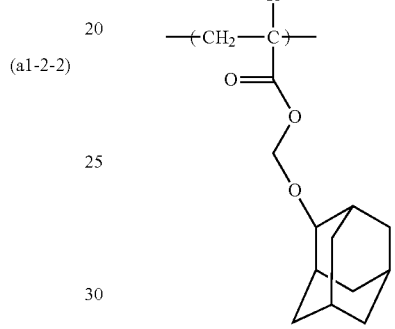 (a1-2-6)
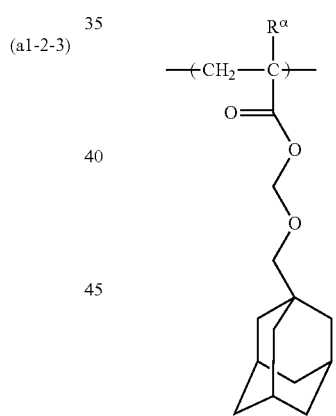 (a1-2-7)
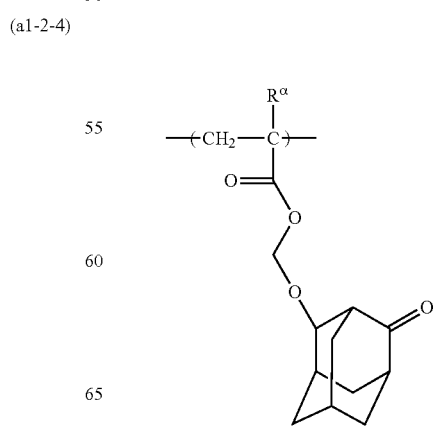 (a1-2-8)

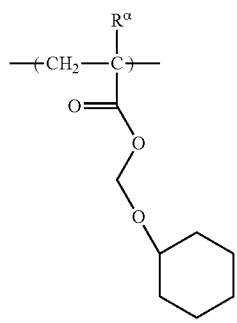 (a1-2-9)
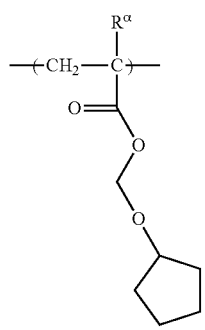 (a1-2-10)
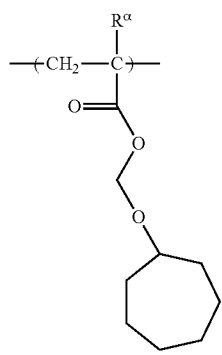 (a1-2-11)
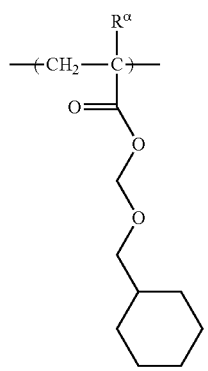 (a1-2-12)
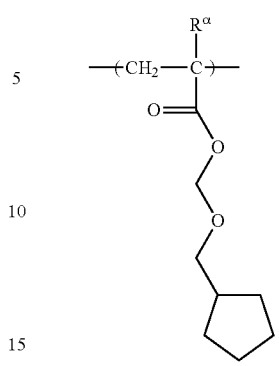 (a1-2-13)
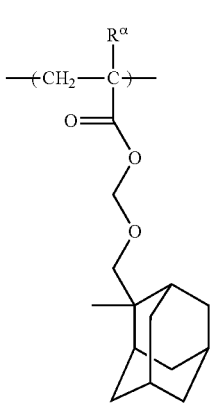 (a1-2-14)
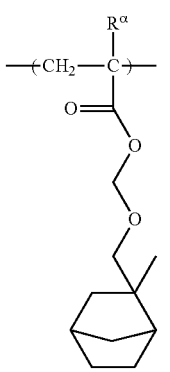 (a1-2-15)
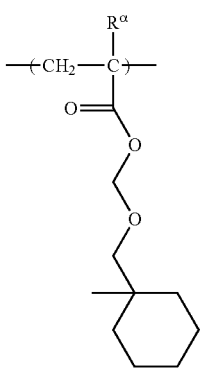 (a1-2-16)

(a1-2-17) 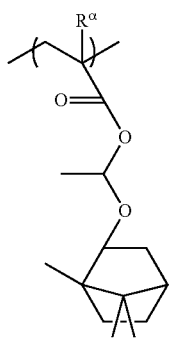
(a1-2-18) 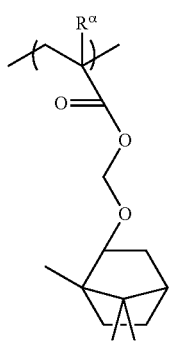
(a1-2-19) 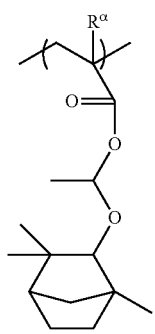
(a1-2-20) 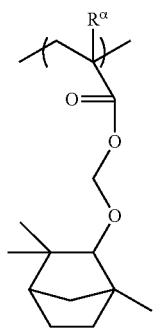
(a1-2-21) 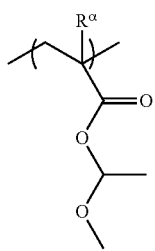
(a1-2-22) 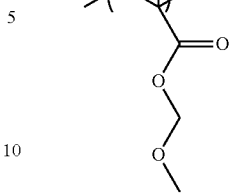
(a1-2-23) 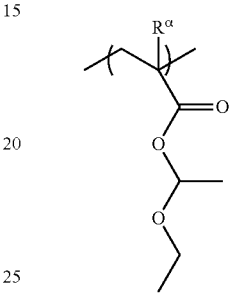
(a1-2-24) 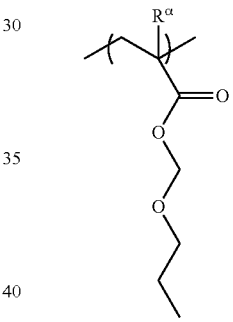
[Chemical Formula 17]
(a1-3-1) 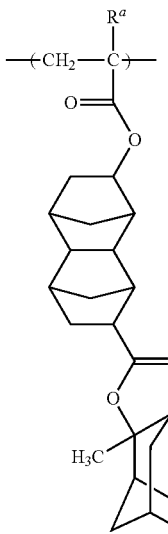

(a1-3-2)
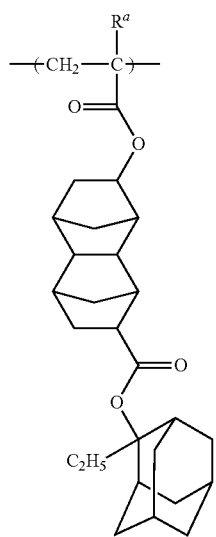
(a1-3-5)
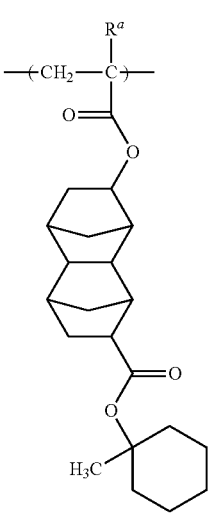
(a1-3-3)
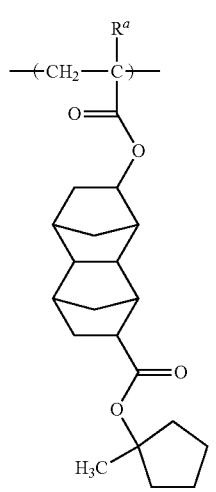
(a1-3-6)
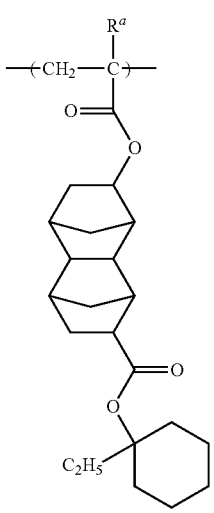
(a1-3-4)
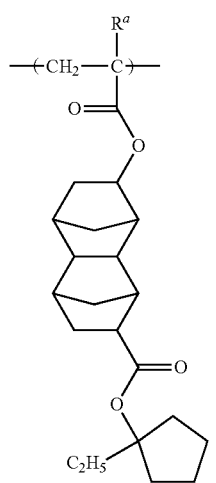
(a1-3-7)
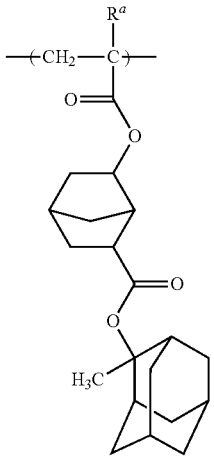

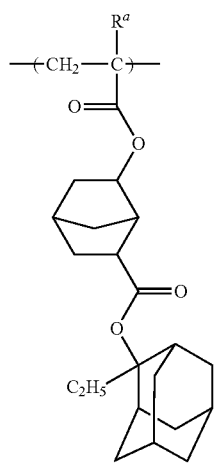
(a1-3-8)
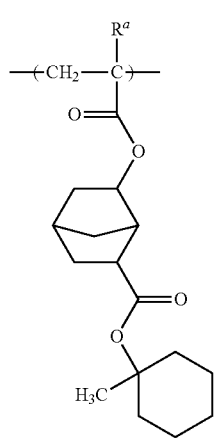
(a1-3-9)
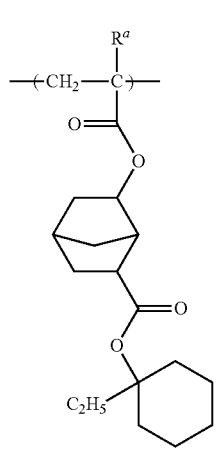
(a1-3-10)
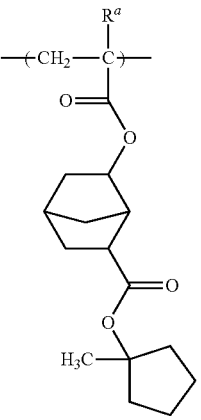
(a1-3-11)
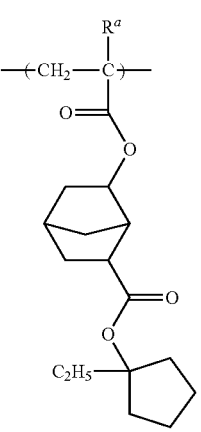
(a1-3-12)
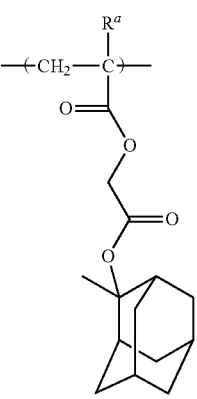
(a1-3-13)
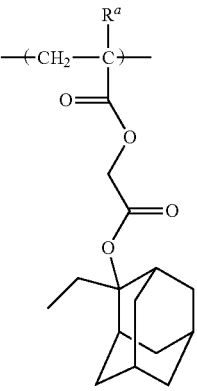
(a1-3-14)

(a1-3-15)
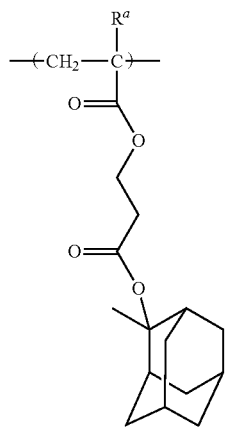
(a1-3-16)
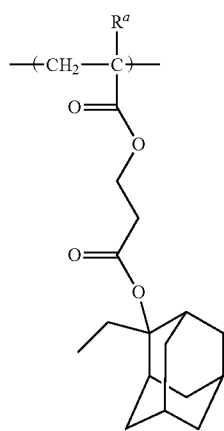
(a1-3-17)
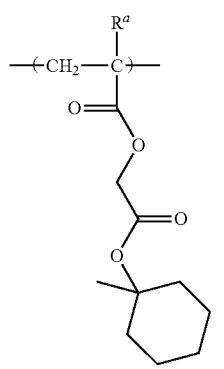
(a1-3-18)
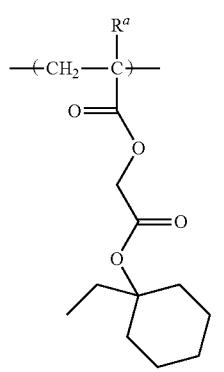
[Chemical Formula 18]
(a1-3-19)
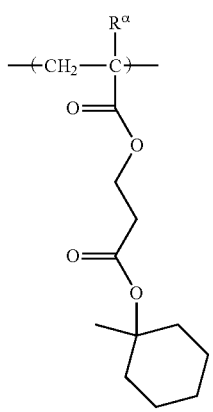
(a1-3-20)
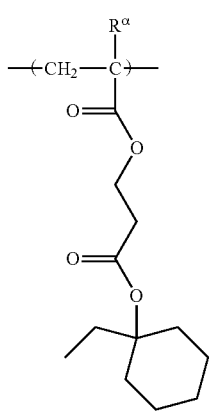
(a1-3-21)
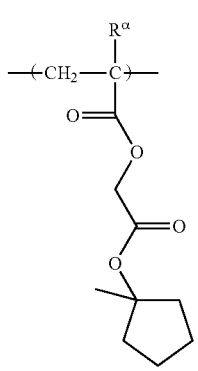
(a1-3-22)
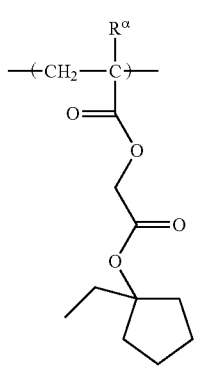

(a1-3-23)
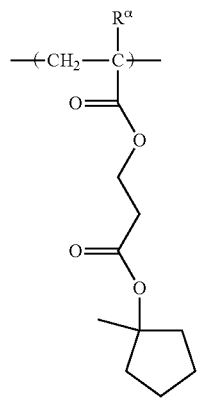
(a1-3-24)
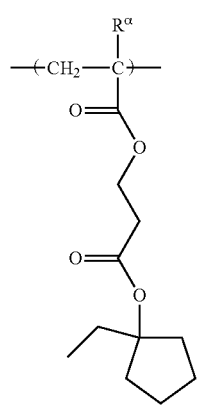
[Chemical Formula 19]
(a1-3-25)
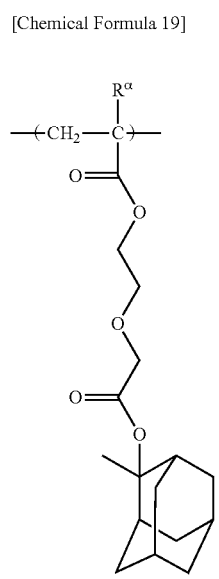
(a1-3-26)
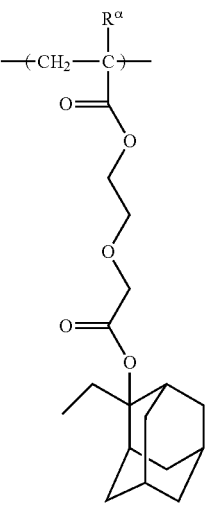
(a1-3-27)
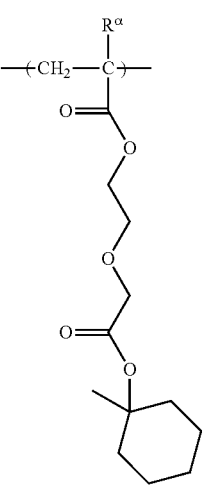
(a1-3-28)
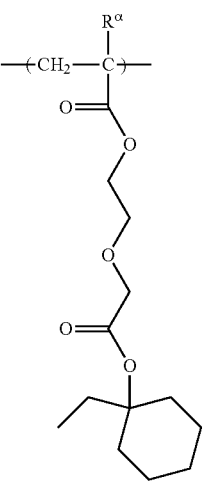

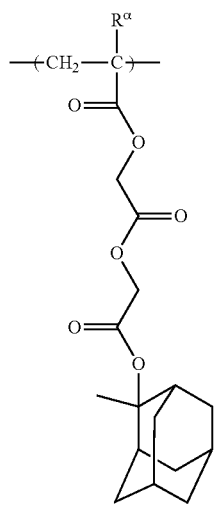 (a1-3-29)
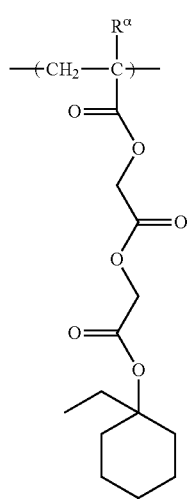 (a1-3-30)
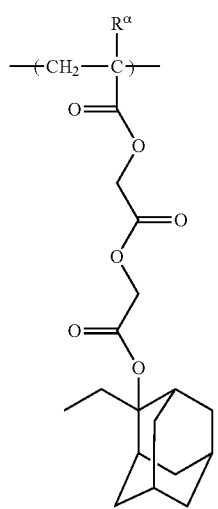 (a1-3-31)
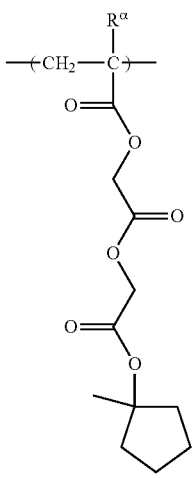 (a1-3-32)
[Chemical Formula 20]
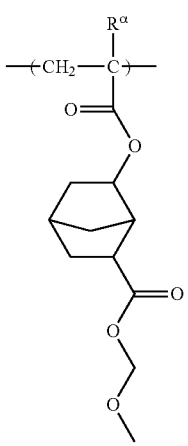 (a1-4-1)
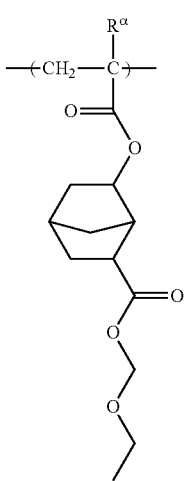 (a1-4-2)

(a1-4-3)
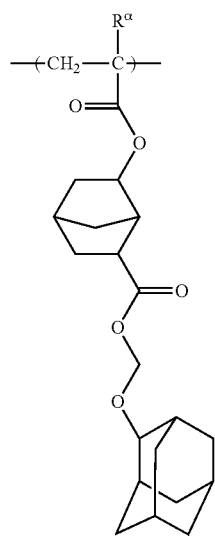
(a1-4-4)
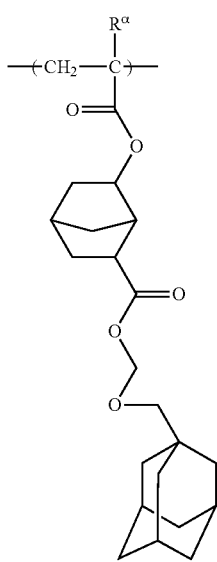
(a1-4-5)
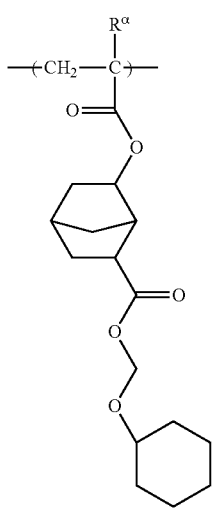
(a1-4-6)
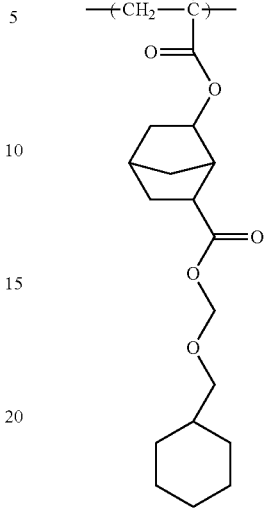
(a1-4-7)
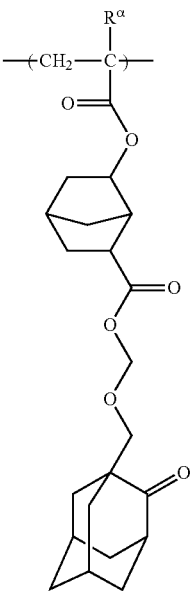

(a1-4-8)
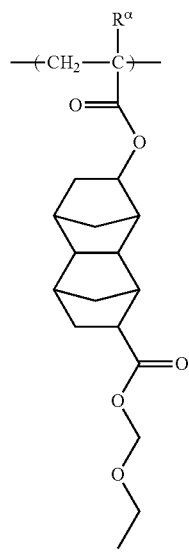
(a1-4-10)
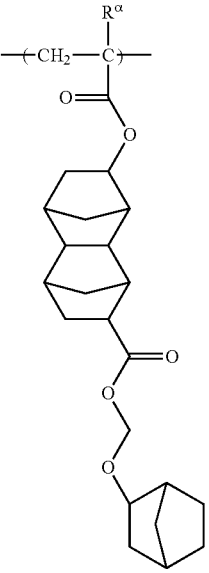
(a1-4-9)
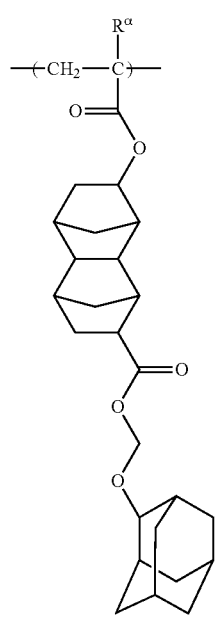
(a1-4-11)
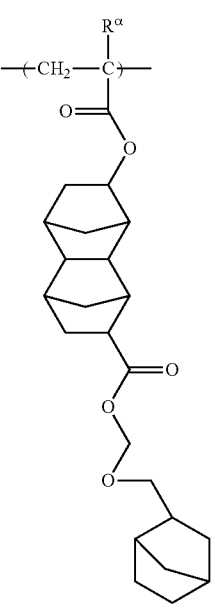

(a1-4-12)
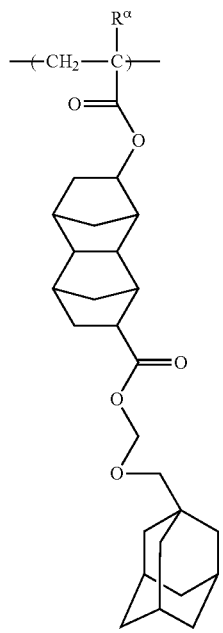

(a1-4-13)
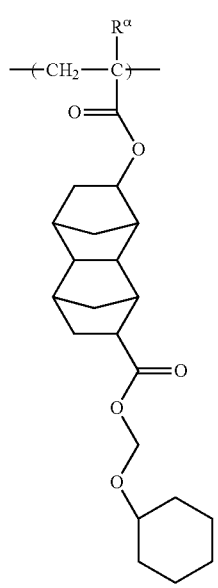

(a1-4-14)
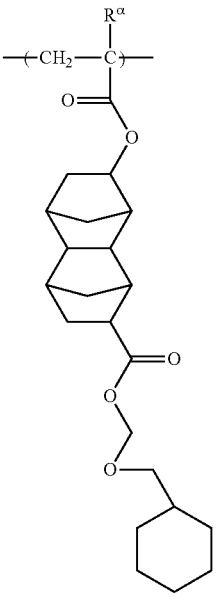

(a1-4-15)
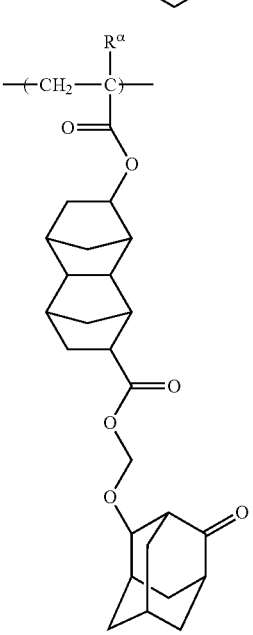

As the structural unit (a1), one type of structural unit may be used alone, or two or more types of structural units may be used in combination.

Among these, structural units represented by general formula (a1-1) or (a1-3) are preferred as the structural unit (a1). More specifically, at least one structural unit selected from the group consisting of structural units represented by formulas (a1-1-1) to (a-1-1-4), (a1-1-20) to (a1-1-23) and (a1-3-25) to (a1-3-32) is more preferable.

Further, as the structural unit (a1), structural units represented by general formula (a1-1-01) shown below which includes the structural units represented by formulas (a1-1-1) to (a1-1-3); structural units represented by general formula (a1-1-02) shown below which includes the structural units represented by formulas (a1-1-16), (a1-1-17) and (a1-1-20) to (a1-1-23); structural units represented by general formula (a1-3-01) shown below which include the structural units represented by formulas (a1-3-25) and (a1-3-26); structural units represented by general formula (a1-3-02) shown below which include the structural units represented by formulas (a1-3-27) and (a1-3-28); and structural units represented by general formula (a1-3-03) shown below which include the structural units represented by formulas (a1-3-29) to (a1-3-32) are also preferable.

[Chemical Formula 21]

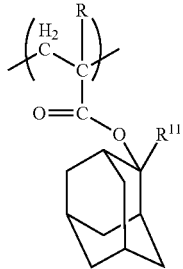

(a1-1-01)

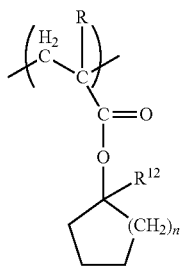

(a1-1-02)

In the formulas, R represents a hydrogen atom, an alkyl group of 1 to 5 carbon atoms or a halogenated alkyl group of 1 to 5 carbon atoms; $R^{11}$ represents an alkyl group of 1 to 5 carbon atoms; $R^{12}$ represents an alkyl group of 1 to 5 carbon atoms; and h represents an integer of 1 to 6.

In general formula (a1-1-01), R is the same as defined above for R in formula (a1-0-1).

The alkyl group for $R^{11}$ is the same as defined above for the alkyl group for R in formula (a1-0-1), and a methyl group, an ethyl group or an isopropyl group is preferable.

In general formula (a1-1-02), R is the same as defined above for R in formula (a1-0-1).

The alkyl group for $R^{12}$ is the same as defined above for the alkyl group for R, and a methyl group, an ethyl group or an isopropyl group is preferable.

h is preferably 1 or 2, and most preferably 2.

[Chemical Formula 22]

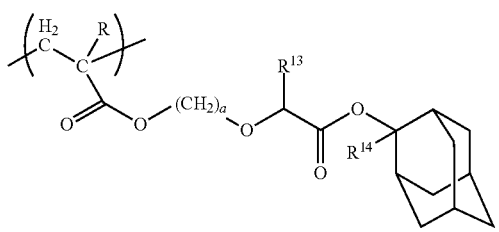

(a1-3-01)

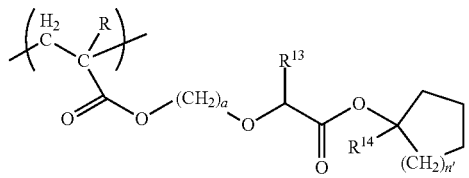

(a1-3-02)

In the formulas, R represents a hydrogen atom, an alkyl group of 1 to 5 carbon atoms or a halogenated alkyl group of 1 to 5 carbon atoms; $R^{14}$ represents an alkyl group of 1 to 5 carbon atoms; $R^{13}$ represents a hydrogen atom or a methyl group; a represents an integer of 1 to 10; and n' represents an integer of 1 to 6.

In general formulas (a1-3-01) and (a1-3-02), R is the same as defined above for R in formula (a1-0-1).

$R^{13}$ is preferably a hydrogen atom.

The alkyl group for $R^{14}$ is the same as defined above for $R^{14}$ in formulas (1-1) to (1-9), and a methyl group, an ethyl group or an isopropyl group is preferable.

a is preferably an integer of 1 to 8, more preferably an integer of 2 to 5, and most preferably 2.

n' is most preferably 1 or 2.

[Chemical Formula 23]

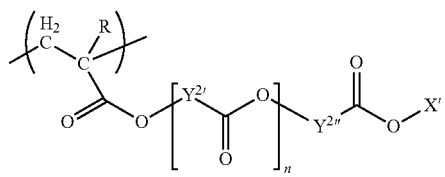

(a1-3-03)

In the formula, R represents a hydrogen atom, an alkyl group of 1 to 5 carbon atoms or a halogenated alkyl group of 1 to 5 carbon atoms; each of $Y^{2'}$ and $Y^{2''}$ independently represents a divalent linking group; X' represents an acid dissociable, dissolution inhibiting group; and n represents an integer of 0 to 3.

In general formula (a1-3-03), as the divalent linking groups for $Y^{2'}$ and $Y^{2''}$, the same groups as those described above for $Y^2$ in general formula (a1-3) can be used.

As $Y^{2'}$, a divalent hydrocarbon group which may have a substituent is preferable, a linear aliphatic hydrocarbon group is more preferable, and a linear alkylene group is still more preferable. Among linear alkylene groups, a linear alkylene group of 1 to 5 carbon atoms is preferable, and a methylene group or an ethylene group is particularly desirable.

As $Y^{2''}$, a divalent hydrocarbon group which may have a substituent is preferable, a linear aliphatic hydrocarbon group is more preferable, and a linear alkylene group is still more preferable. Among linear alkylene groups, a linear alkylene group of 1 to 5 carbon atoms is preferable, and a methylene group or an ethylene group is particularly desirable.

As the acid dissociable, dissolution inhibiting group for X', the same groups as those described above can be used. X' is preferably a tertiary alkyl ester-type acid dissociable, dissolution inhibiting group, more preferably the aforementioned group which has a tertiary carbon atom on the ring structure of a monovalent aliphatic cyclic group. Among these, a group represented by the aforementioned general formula (1-1) is particularly desirable.

n represents an integer of 0 to 3, preferably an integer of 0 to 2, more preferably 0 or 1, and most preferably 1.

In the component (A1), the amount of the structural unit (a1) based on the combined total of all structural units constituting the component (A1) is preferably 10 to 80 mol %, more preferably 20 to 70 mol %, and still more preferably 25 to 60 mol %. When the amount of the structural unit (a1) is at least as large as the lower limit of the above-mentioned range, a pattern can be easily formed using a resist composition prepared from the component (A1). On the other hand, when the amount of the structural unit (a1) is no more than the upper limit of the above-mentioned range, a good balance can be achieved with the other structural units.

(Structural Unit (a2))

The structural unit (a2) is at least one structural unit selected from the group consisting of a structural unit derived from an acrylate ester containing a $-SO_2$-containing cyclic group (hereafter, referred to as "structural unit ($a2^S$)") and a structural unit derived from an acrylate ester containing a lactone-containing cyclic group (hereafter, referred to as "structural unit ($a2^L$)").

By virtue of the structural unit (a2) containing a $-SO_2$-containing cyclic group or a lactone-containing cyclic group, a positive resist composition containing the component (A1) is capable of improving the adhesion of a resist film to a substrate, and increasing the compatibility with the developing solution containing water, thereby contributing to improvement of lithography properties.

Structural Unit ($a2^S$):

The structural unit ($a2^S$) is a structural unit derived from an acrylate ester containing a $-SO_2$-containing cyclic group.

The $-SO_2$-containing cyclic group refers to a cyclic group including a ring that contains $-SO_2-$ within the ring skeleton thereof, and more specifically, a cyclic group in which the sulfur atom (S) of $-SO_2-$ forms a part of the ring skeleton. This ring counted as the first ring. A cyclic group in which the only ring structure is the ring that contains $-SO_2-$ in the ring skeleton thereof is referred to as a monocyclic group, and a group containing other ring structures is described as a polycyclic group regardless of the structure of the other rings. The $-SO_2$-containing cyclic group may be either a monocyclic group or a polycyclic group.

As the $-SO_2$-containing cyclic group, a cyclic group containing $-O-SO_2-$ within the ring skeleton thereof, i.e., a cyclic group containing a sultone ring in which $-O-S-$ within the $-O-SO_2$-group forms part of the ring skeleton thereof is particularly desirable.

The $-SO_2$-containing cyclic group preferably has 3 to 30 carbon atoms, more preferably 4 to 20 carbon atoms, still more preferably 4 to 15 carbon atoms, and most preferably 4 to 12 carbon atoms. Herein, the number of carbon atoms refers to the number of carbon atoms constituting the ring skeleton, excluding the number of carbon atoms within a substituent.

The $-SO_2$-containing cyclic group may be either a $-SO_2$-containing aliphatic cyclic group or a $-SO_2$-containing aromatic cyclic group. A $-SO_2$-containing aliphatic cyclic group is preferable.

Examples of the $-SO_2$-containing aliphatic cyclic group include aliphatic cyclic groups in which part of the carbon atoms constituting the ring skeleton has been substituted with a $-SO_2$-group or a $-O-SO_2-$ group and has at least one hydrogen atom removed from the aliphatic hydrocarbon ring. Specific examples include an aliphatic hydrocarbon ring in which a $-CH_2$-group constituting the ring skeleton thereof has been substituted with a $-SO_2-$ group and has at least one hydrogen atom removed therefrom; and an aliphatic hydrocarbon ring in which a $-CH_2-CH_2-$ group constituting the ring skeleton thereof has been substituted with a $-O-SO_2$-group and has at least one hydrogen atom removed therefrom.

The alicyclic hydrocarbon group preferably has 3 to 20 carbon atoms, and more preferably 3 to 12 carbon atoms.

The alicyclic hydrocarbon group may be either a monocyclic group or a polycyclic group. As the monocyclic group, a group in which two hydrogen atoms have been removed from a monocycloalkane of 3 to 6 carbon atoms is preferable. Examples of the monocycloalkane include cyclopentane and cyclohexane. As the polycyclic group, a group in which two hydrogen atoms have been removed from a polycycloalkane of 7 to 12 carbon atoms is preferable. Specific examples of the polycycloalkane include adamantane, norbornane, isobornane, tricyclodecane and tetracyclododecane.

The $-SO_2$-containing cyclic group may have a substituent. Examples of the substituent include an alkyl group, an alkoxy group, a halogen atom, a halogenated alkyl group, a hydroxyl group, an oxygen atom (=O), $-COOR"$, $-OC(=O)R"$, a hydroxyalkyl group and a cyano group.

The alkyl group for the substituent is preferably an alkyl group of 1 to 6 carbon atoms. Further, the alkyl group is preferably a linear alkyl group or a branched alkyl group. Specific examples include a methyl group, an ethyl group, a propyl group, an isopropyl group, an n-butyl group, an isobutyl group, a tert-butyl group, a pentyl group, an isopentyl group, a neopentyl group and a hexyl group. Among these, a methyl group or ethyl group is preferable, and a methyl group is particularly desirable.

As the alkoxy group for the substituent, an alkoxy group of 1 to 6 carbon atoms is preferable. Further, the alkoxy group is preferably a linear alkoxy group or a branched alkoxy group. Specific examples of the alkoxy group include the aforementioned alkyl groups for the substituent having an oxygen atom ($-O-$) bonded thereto.

Examples of the halogen atom for the substituent include a fluorine atom, a chlorine atom, a bromine atom and an iodine atom, and a fluorine atom is preferable.

Examples of the halogenated alkyl group for the substituent include groups in which part or all of the hydrogen atoms within the aforementioned alkyl groups has been substituted with the aforementioned halogen atoms.

As examples of the halogenated alkyl group for the substituent, groups in which part or all of the hydrogen atoms of the aforementioned alkyl groups for the substituent have been substituted with the aforementioned halogen atoms can be given. As the halogenated alkyl group, a fluorinated alkyl group is preferable, and a perfluoroalkyl group is particularly desirable.

In the $-COOR"$ group and the $-OC(=O)R"$ group, $R"$ represents a hydrogen atom or a linear, branched or cyclic alkyl group of 1 to 15 carbon atoms.

When $R"$ represents a linear or branched alkyl group, it is preferably an alkyl group of 1 to 10 carbon atoms, more preferably an alkyl group of 1 to 5 carbon atoms, and most preferably a methyl group or an ethyl group.

When $R"$ is a cyclic alkyl group, it preferably has 3 to 15 carbon atoms, more preferably 4 to 12 carbon atoms, and most preferably 5 to 10 carbon atoms. As examples of the cyclic alkyl group, groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group, may be used. Specific examples include groups in which one or more hydrogen atoms have been removed from a monocycloalkane such as cyclopentane and cyclohexane; and groups in which one or more hydrogen atoms have been removed from a polycycloalkane such as adamantane, norbornane, isobornane, tricyclodecane or tetracyclododecane.

The hydroxyalkyl group for the substituent preferably has 1 to 6 carbon atoms, and specific examples thereof include the aforementioned alkyl groups for the substituent in which at least one hydrogen atom has been substituted with a hydroxyl group.

More specific examples of the —SO$_2$-containing cyclic group include groups represented by general formulas (3-1) to (3-4) shown below.

[Chemical Formula 24]

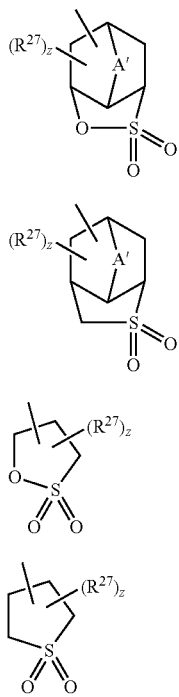

(3-1)

(3-2)

(3-3)

(3-4)

In the formulas, A' represents an oxygen atom, a sulfur atom or an alkylene group of 1 to 5 carbon atoms which may contain an oxygen atom or a sulfur atom; z represents an integer of 0 to 2; and R$^{27}$ represents an alkyl group, an alkoxy group, a halogenated alkyl group, a hydroxyl group, —COOR", —OC(=O)R", a hydroxyalkyl group or a cyano group, wherein R" represents a hydrogen atom or an alkyl group.

In general formulas (3-1) to (3-4) above, A' represents an oxygen atom (—O—), a sulfur atom (—S—) or an alkylene group of 1 to 5 carbon atoms which may contain an oxygen atom or a sulfur atom.

As the alkylene group of 1 to 5 carbon atoms represented by A', a linear or branched alkylene group is preferable, and examples thereof include a methylene group, an ethylene group, an n-propylene group and an isopropylene group.

When the alkylene group contains an oxygen atom or a sulfur atom, specific examples thereof include the aforementioned alkylene groups in which —O— or —S— is bonded to the terminal of the alkylene group or present between the carbon atoms of the alkylene group. Specific examples of such alkylene groups include —O—CH$_2$—, —CH$_2$—O—CH$_2$—, —S—CH$_2$—, —CH$_2$—S—CH$_2$—.

A' is preferably an alkylene group of 1 to 5 carbon atoms or —O—, is more preferably an alkylene group of 1 to 5 carbon atoms, and is most preferably a methylene group.

z represents an integer of 0 to 2, and is most preferably 0.

When z is 2, the plurality of R$^{27}$ may be the same or different from each other.

As the alkyl group, alkoxy group, halogenated alkyl group, —COOR", —OC(=O)R" and hydroxyalkyl group for R$^{27}$, the same alkyl groups, alkoxy groups, halogenated alkyl groups, —COOR", —OC(=O)R" and hydroxyalkyl groups as those described above as the substituent for the —SO$_2$-containing cyclic group can be mentioned.

Specific examples of the cyclic groups represented by general formulas (3-1) to (3-4) are shown below. In the formulas shown below, "Ac" represents an acetyl group.

[Chemical Formula 25]

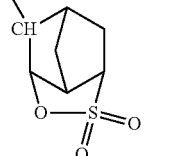

(3-1-1)

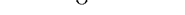

(3-1-2)

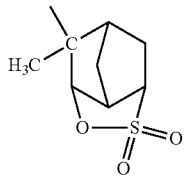

(3-1-3)

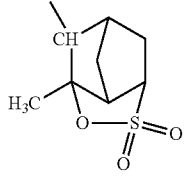

(3-1-4)

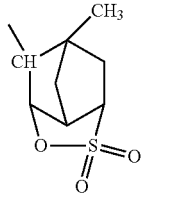

(3-1-5)

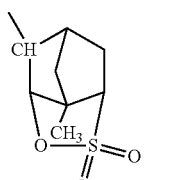

(3-1-6)

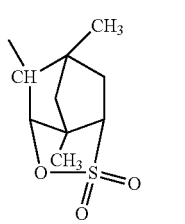

-continued
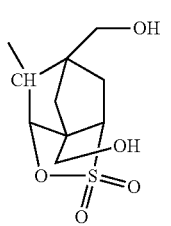 (3-1-7)
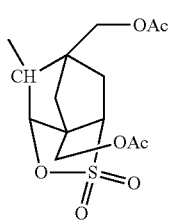 (3-1-8)
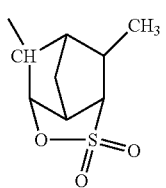 (3-1-9)
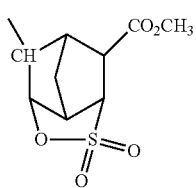 (3-1-10)
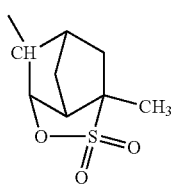 (3-1-11)
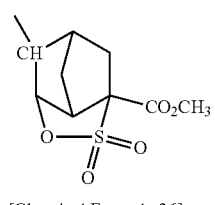 (3-1-12)
[Chemical Formula 26]
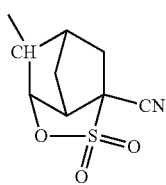 (3-1-13)
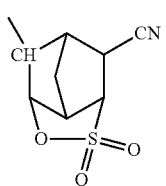 (3-1-14)
-continued
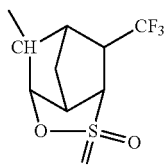 (3-1-15)
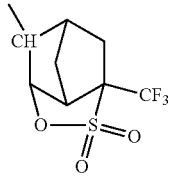 (3-1-16)
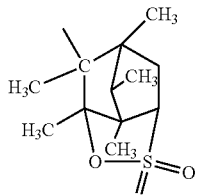 (3-1-17)
[Chemical Formula 27]
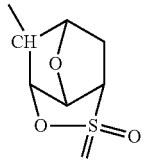 (3-1-18)
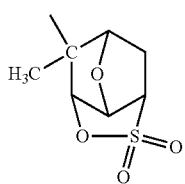 (3-1-19)
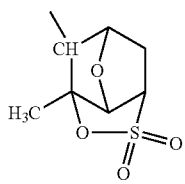 (3-1-20)
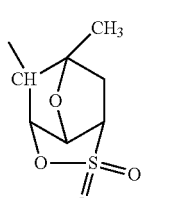 (3-1-21)
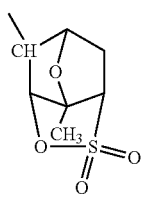 (3-1-22)

(3-1-23)
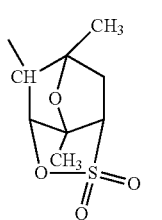
(3-1-24)
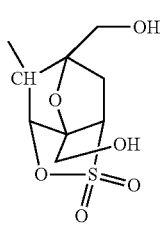
(3-1-25)
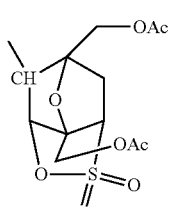
[Chemical Formula 28]
(3-1-26)
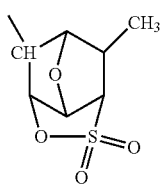
(3-1-27)
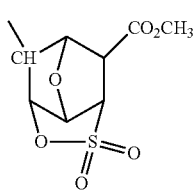
(3-1-28)
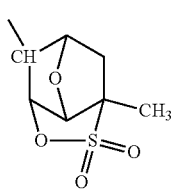
(3-1-29)
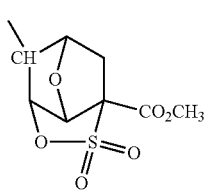
(3-1-30)
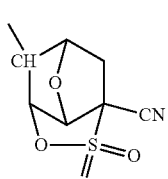
(3-1-31)
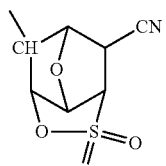
(3-1-32)
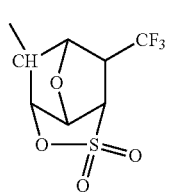
(3-1-33)
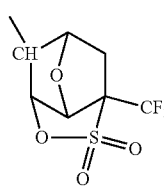
[Chemical Formula 29]
(3-2-1)
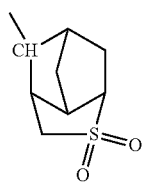
(3-2-2)
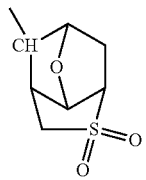
(3-3-1)
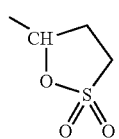
(3-4-1)
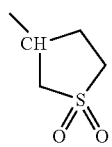
As the —SO$_2$-containing cyclic group, a group represented by the aforementioned general formula (3-1) is preferable, at least one member selected from the group consisting of groups represented by the aforementioned chemical formulas (3-1-1), (3-1-18), (3-3-1) and (3-4-1) is more preferable, and a group represented by chemical formula (3-1-1) is most preferable.

More specific examples of the structural unit (a2$^S$) include structural units represented by general formula (a2-0) shown below.

[Chemical Formula 30]

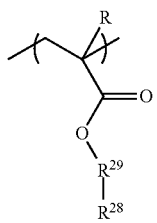

(a2-0)

In the formula, R represents a hydrogen atom, an alkyl group of 1 to 5 carbon atoms or a halogenated alkyl group of 1 to 5 carbon atoms; $R^{28}$ represents a —$SO_2$-containing cyclic group; and $R^{29}$ represents a single bond or a divalent linking group.

In genera formula (a2-0), R is the same as defined above for R in formula (a1-0-1).

$R^{28}$ is the same as defined for the aforementioned —$SO_2$-containing group.

$R^{29}$ may be either a single bond or a divalent linking group. In terms of the effects of the present invention, a divalent linking group is preferable.

The divalent linking group for $R^{29}$ is not particularly limited. For example, the same divalent linking groups as those described for $Y^2$ in general formula (a1-0-2) explained above in relation to the structural unit (a1) can be mentioned. Among these, an alkylene group or a divalent linking group containing an ester bond (—C(=O)—O—) is preferable.

As the alkylene group, a linear or branched alkylene group is preferable. Specific examples include the same linear alkylene groups and branched alkylene groups as those described above for the aliphatic hydrocarbon group represented by $Y^2$.

As the divalent linking group containing an ester bond, a group represented by general formula: —$R^{30}$—C(=O)—O— (in the formula, $R^{30}$ represents a divalent linking group) is particularly desirable. That is, the structural unit (a2$^S$) is preferably a structural unit represented by general formula (a2-0-1) shown below.

[Chemical Formula 31]

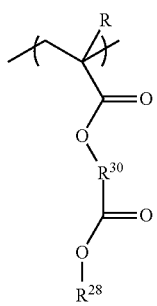

(a2-0-1)

In the formula, R represents a hydrogen atom, an alkyl group of 1 to 5 carbon atoms or a halogenated alkyl group of 1 to 5 carbon atoms; $R^{28}$ represents a —$SO_2$-containing cyclic group; and $R^{30}$ represents a divalent linking group.

$R^{30}$ is not particularly limited. For example, the same divalent linking groups as those described for $Y^2$ in general formula (a1-0-2) explained above in relation to the structural unit (a1) can be mentioned.

As the divalent linking group for $R^{30}$, a linear or branched alkylene group, a divalent alicyclic hydrocarbon group or a divalent linking group containing a hetero atom is preferable.

As the linear or branched alkylene group, the divalent alicyclic hydrocarbon group and the divalent linking group containing a hetero atom, the same linear or branched alkylene groups, divalent alicyclic hydrocarbon groups and divalent linking groups containing a hetero atom as those described above as preferable examples of $Y^2$ in general formula (a1-0-2) can be mentioned.

Among these, a linear or branched alkylene group, or a divalent linking group containing an oxygen atom as a hetero atom is preferable.

As the linear alkylene group, a methylene group or an ethylene group is preferable, and a methylene group is particularly desirable.

As the branched alkylene group, an alkylmethylene group or an alkylethylene group is preferable, and —CH(CH$_3$)—, —C(CH$_3$)$_2$— or —C(CH$_3$)$_2$CH$_2$— is particularly desirable.

As the divalent linking group containing an oxygen atom, a divalent linking group containing an ether bond or an ester bond is preferable, and a group represented by the formula -$A_1$-O—$B_1$— or -[$A_1$-C(=O)—O]$_m$$B_1$— is more preferable. In the formula, each of $A_1$ and $B_1$ independently represents a divalent hydrocarbon group which may have a substituent, and examples thereof include the same groups as those described above for $A_1$ and $B_1$ in the aforementioned group represented by the formula -$A_1$-O—$B_1$— or -[$A_1$-C(=O)—O]$_m$—$B_1$— in relation to A in the structural unit (a0-2).

Among these, a group represented by the formula -$A_1$-C(=O)—O—$B_1$— is preferable, and a group represented by the formula: —(CH$_2$)$_c$—C(=O)—O—(CH$_2$)$_d$— is particularly desirable. c represents an integer of 1 to 5, and preferably 1 or 2. d represents an integer of 1 to 5, and preferably 1 or 2.

In particular, as the structural unit (a2$^S$), a structural unit represented by general formula (a0-1-11) or (a0-1-12) shown below is preferable, and a structural unit represented by general formula (a0-1-12) shown below is more preferable.

[Chemical Formula 32]

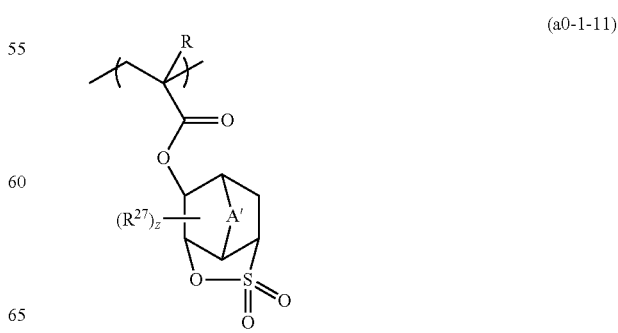

(a0-1-11)

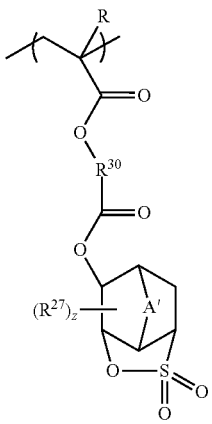

(a0-1-12)

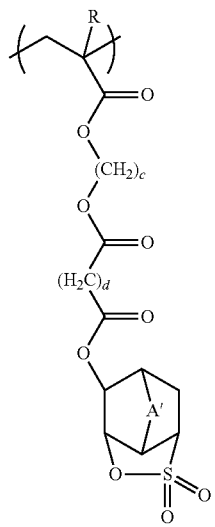

(a0-1-12b)

In the formulas, R represents a hydrogen atom, an alkyl group of 1 to 5 carbon atoms or a halogenated alkyl group of 1 to 5 carbon atoms; A' represents an oxygen atom, a sulfur atom or an alkylene group of 1 to 5 carbon atoms which may contain an oxygen atom or a sulfur atom; z represents an integer of 0 to 2; $R^{27}$ represents an alkyl group, an alkoxy group, a halogenated alkyl group, a hydroxyl group, —COOR", —OC(=O)R", a hydroxyalkyl group or a cyano group; and $R^{30}$ represents a divalent linking group.

In general formula (a0-1-11), A' is preferably a methylene group, an oxygen atom (—O—) or a sulfur atom (—S—).

As $R^{30}$, a linear or branched alkylene group or a divalent linking group containing an oxygen atom is preferable. As the linear or branched alkylene group and the divalent linking group containing an oxygen atom represented by $R^{30}$, the same linear or branched alkylene groups and the divalent linking groups containing an oxygen atom as those described above can be mentioned.

As the structural unit represented by general formula (a0-1-12), a structural unit represented by general formula (a0-1-12a) or (a0-1-12b) shown below is particularly desirable.

[Chemical Formula 33]

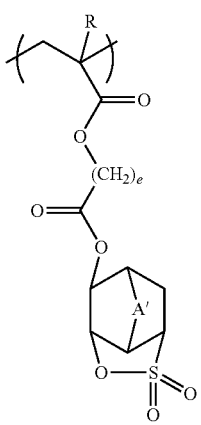

(a0-1-12a)

In the formulas, R represents a hydrogen atom, an alkyl group of 1 to 5 carbon atoms or a halogenated alkyl group of 1 to 5 carbon atoms; A' represents an oxygen atom, a sulfur atom or an alkylene group of 1 to 5 carbon atoms which may contain an oxygen atom or a sulfur atom; and each of c to e independently represents an integer of 1 to 3.

Structural Unit ($a2^L$):

The structural unit ($a2^L$) is a structural unit derived from an acrylate ester containing a lactone-containing cyclic group.

The term "lactone-containing cyclic group" refers to a cyclic group including a ring containing a —O—C(O)— group within the ring structure thereof (lactone ring). This "lactone ring" is counted as the first ring. A lactone-containing cyclic group in which the only ring structure is the lactone ring is referred to as a monocyclic group, and groups containing other ring structures are described as polycyclic groups regardless of the structure of the other rings. The lactone-containing cyclic group may be either a monocyclic group or a polycyclic group.

The lactone-containing cyclic group for the structural unit ($a2^L$) is not particularly limited, and an arbitrary structural unit may be used. Specific examples of lactone-containing monocyclic groups include a group in which one hydrogen atom has been removed from a 4- to 6-membered lactone ring, such as a group in which one hydrogen atom has been removed from β-propiolactone, a group in which one hydrogen atom has been removed from γ-butyrolactone, and a group in which one hydrogen atom has been removed from δ-valerolactone. Further, specific examples of lactone-containing polycyclic groups include groups in which one hydrogen atom has been removed from a lactone ring-containing bicycloalkane, tricycloalkane or tetracycloalkane.

Examples of the structural unit ($a2^L$) include structural units represented by the aforementioned general formula (a2-0) in which the $R^{28}$ group has been substituted with a lactone-containing cyclic group. Specific examples include structural units represented by general formulas (a2-1) to (a2-5) shown below.

[Chemical Formula 34]

(a2-1) 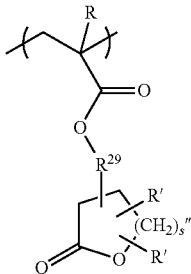

(a2-2) 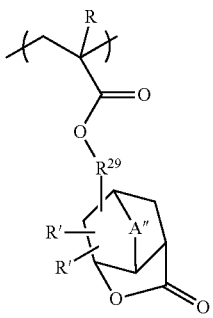

(a2-3) 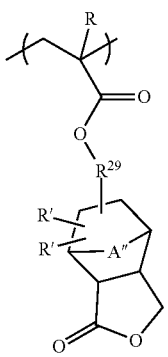

(a2-4) 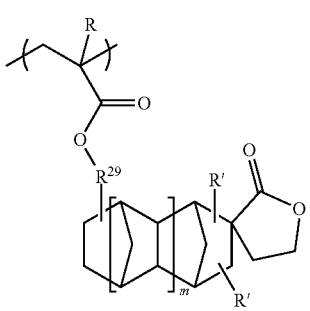

(a2-5) 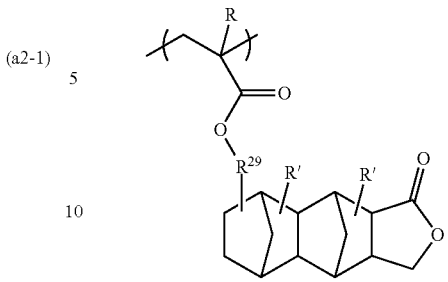

In the formulas, R represents a hydrogen atom, an alkyl group of 1 to 5 carbon atoms or a halogenated alkyl group of 1 to 5 carbon atoms; each R' independently represents a hydrogen atom, an alkyl group of 1 to 5 carbon atoms, an alkoxy group of 1 to 5 carbon atoms or —COOR", wherein R" represents a hydrogen atom or an alkyl group; $R^{29}$ represents a single bond or a divalent linking group; s" represents an integer of 0 to 2; A" represents an oxygen atom, a sulfur atom or an alkylene group of 1 to 5 carbon atoms which may contain an oxygen atom or a sulfur atom; and m represents 0 or 1.

In general formulas (a2-1) to (a2-5), R is the same as defined above for R in the structural unit (a1).

Examples of the alkyl group of 1 to 5 carbon atoms for R' include a methyl group, an ethyl group, a propyl group, an n-butyl group and a tert-butyl group.

Examples of the alkoxy group of 1 to 5 carbon atoms for R' include a methoxy group, an ethoxy group, an n-propoxy group, an iso-propoxy group, an n-butoxy group and a tert-butoxy group.

In terms of industrial availability, R' is preferably a hydrogen atom.

The alkyl group for R" may be any of linear, branched or cyclic.

In those cases where R" represents a linear or branched alkyl group, the alkyl group preferably has 1 to 10 carbon atoms, and more preferably 1 to 5 carbon atoms.

In those cases where R" represents a cyclic alkyl group, the cyclic alkyl group preferably has 3 to 15 carbon atoms, more preferably 4 to 12 carbon atoms, and most preferably 5 to 10 carbon atoms. As examples of the cyclic alkyl group, groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group, may be used. Specific examples include groups in which one or more hydrogen atoms have been removed from a monocycloalkane such as cyclopentane or cyclohexane; and groups in which one or more hydrogen atoms have been removed from a polycycloalkane such as adamantane, norbornane, isobornane, tricyclodecane or tetracyclododecane.

As examples of A", the same groups as those described above for A' in general formula (3-1) can be given. A" is preferably an alkylene group of 1 to 5 carbon atoms, an oxygen atom (—O—) or a sulfur atom (—S—), and more preferably an alkylene group of 1 to 5 carbon atoms or —O—. As the alkylene group of 1 to 5 carbon atoms, a methylene group or a dimethylethylene group is preferable, and a methylene group is particularly desirable.

$R^{29}$ is the same as defined for $R^{29}$ in the aforementioned general formula (a2-0).

In formula (a2-1), s" is preferably 1 or 2.

Specific examples of structural units represented by general formulas (a2-1) to (a2-5) are shown below. In the formulas shown below, $R^\alpha$ represents a hydrogen atom, a methyl group or a trifluoromethyl group.
[Chemical Formula 35]
(a2-1-1)
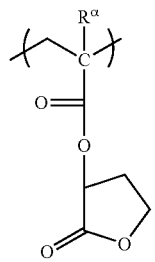
(a2-1-2)
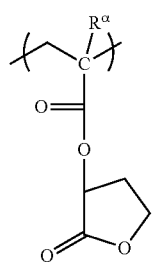
(a2-1-3)
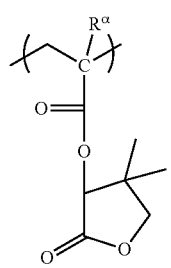
(a2-1-4)
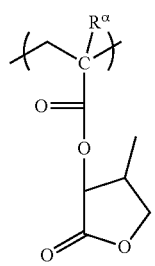
(a2-1-5)
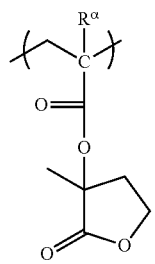
(a2-1-6)
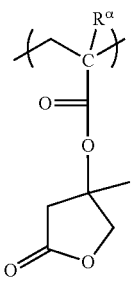
(a2-1-7)
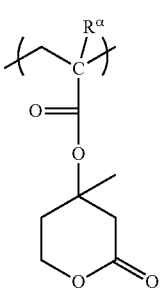
(a2-1-8)
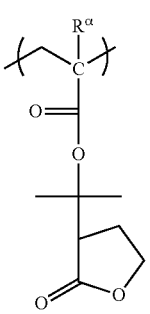
(a2-1-9)
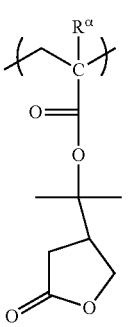
(a2-1-10)
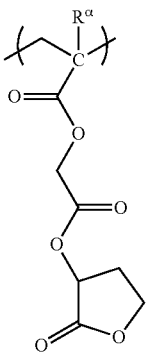

(a2-1-11)
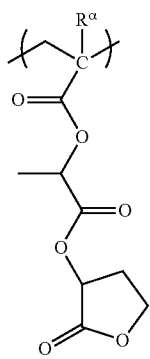
(a2-1-12)
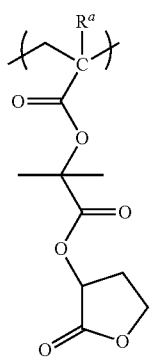
(a2-1-13)
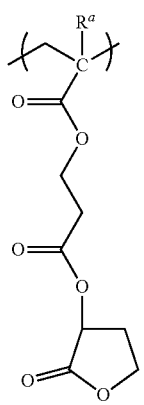
[Chemical Formula 36]
(a2-2-1)
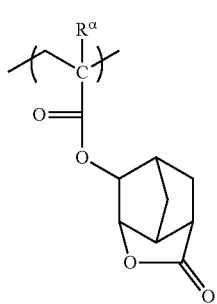
(a2-2-2)
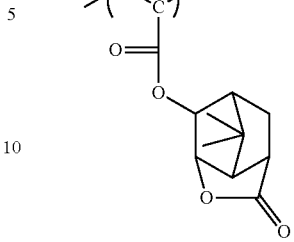
(a2-2-3)
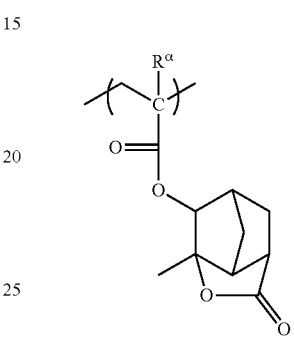
(a2-2-4)
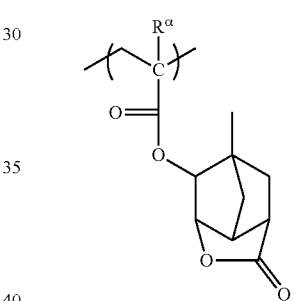
(a2-2-5)
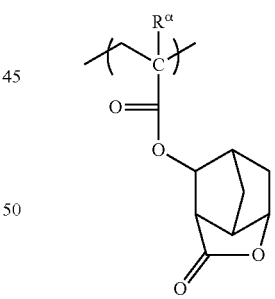
(a2-2-6)
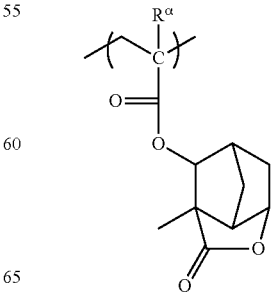

(a2-2-7)
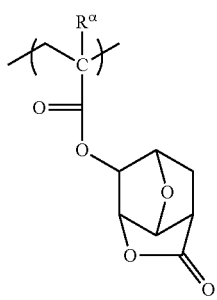
(a2-2-8)
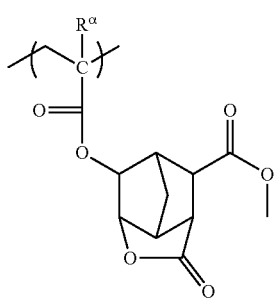
(a2-2-9)
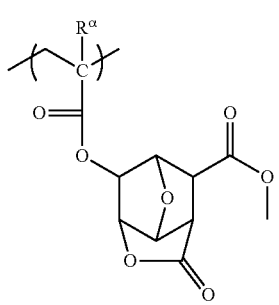
(a2-2-10)
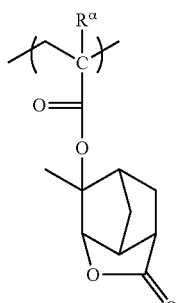
(a2-2-11)
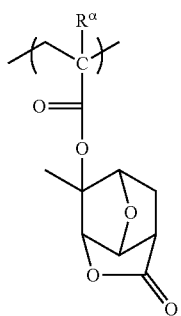
(a2-2-12)
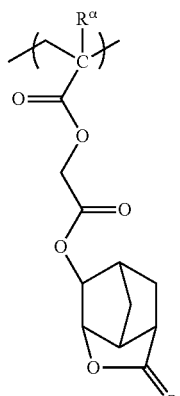
(a2-2-13)
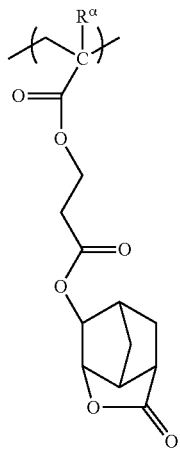
(a2-2-14)
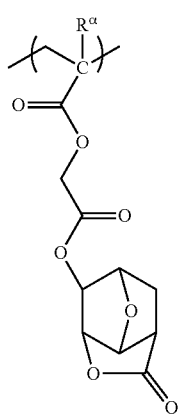

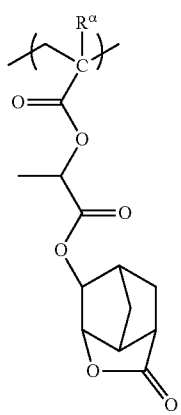 (a2-2-15)
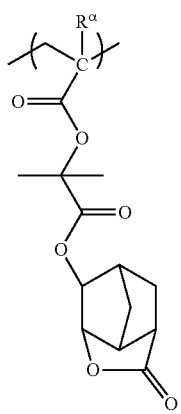 (a2-2-16)
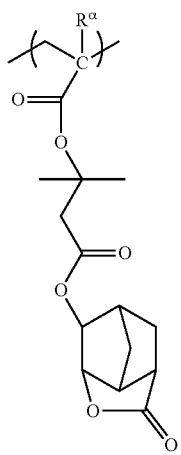 (a2-2-17)
[Chemical Formula 37]
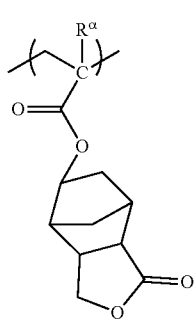 (a2-3-1)
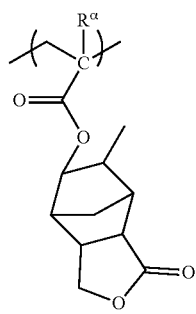 (a2-3-2)
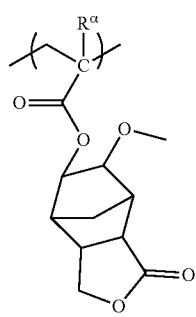 (a2-3-3)
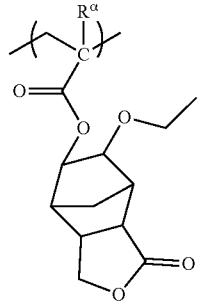 (a2-3-4)
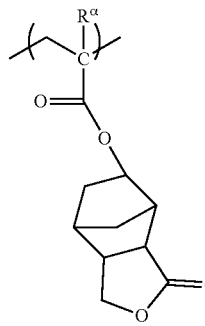 (a2-3-5)
[Chemical Formula 38]
(a2-4-1)

-continued
(a2-4-2)
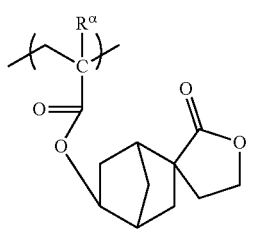
(a2-4-3)
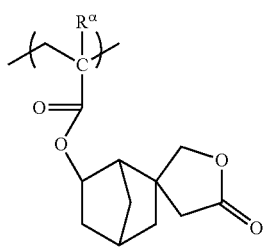
(a2-4-4)
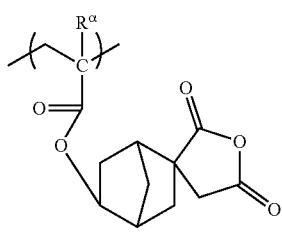
(a2-4-5)
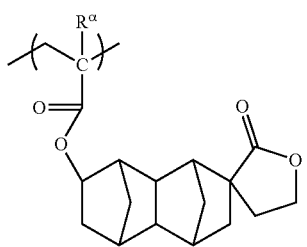
(a2-4-6)
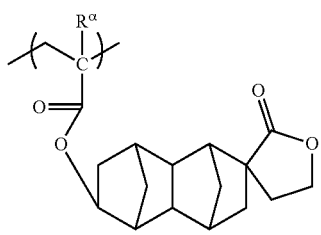
(a2-4-7)
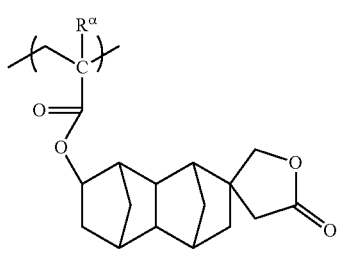
-continued
(a2-4-8)
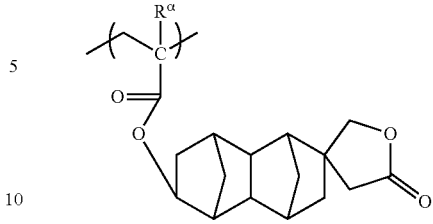
(a2-4-9)
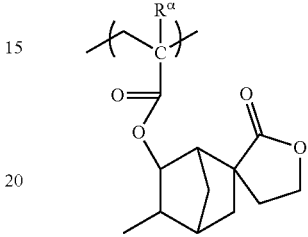
(a2-4-10)
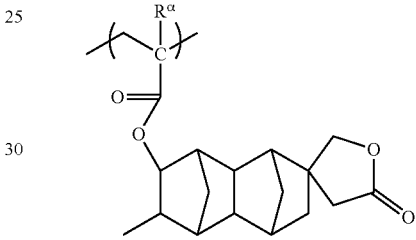
(a2-4-11)
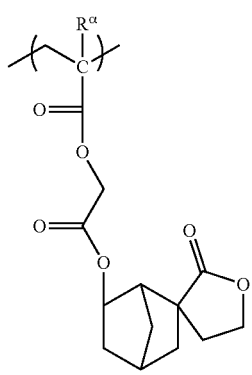
(a2-4-12)
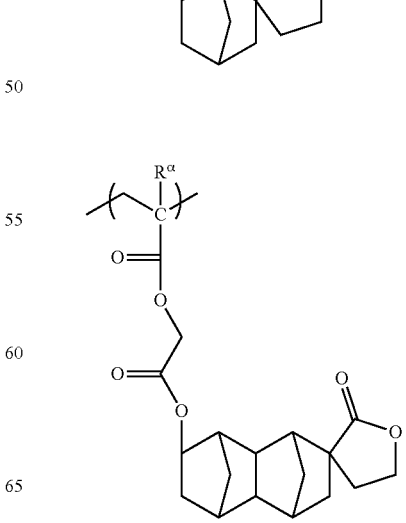

[Chemical Formula 39]

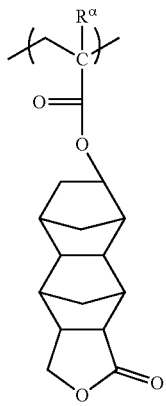 (a2-5-1)

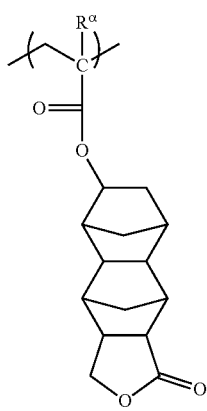 (a2-5-2)

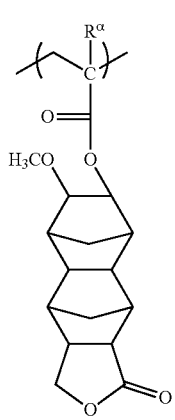 (a2-5-3)

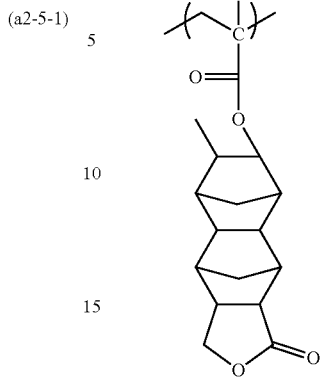 (a2-5-4)

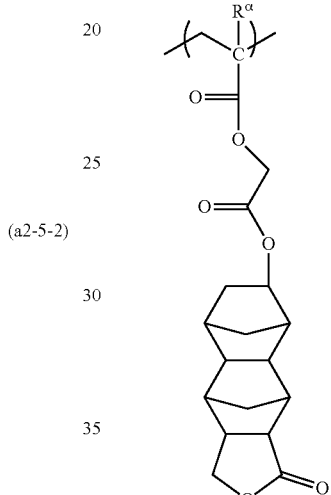 (a2-5-5)

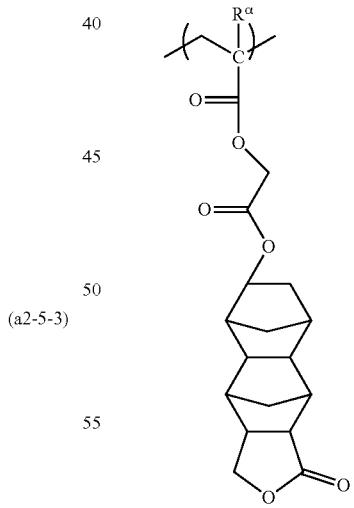 (a2-5-6)

As the structural unit (a2$^L$), it is preferable to include at least one structural unit selected from the group consisting of structural units represented by the aforementioned general formulas (a2-1) to (a2-5), more preferably at least one structural unit selected from the group consisting of structural units represented by the aforementioned general formulas (a2-1) to (a2-3), and most preferably at least one structural unit selected from the group consisting of structural units represented by the aforementioned general formulas (a2-1) and (a2-2).

Of these, it is particularly preferable to use at least one structural unit selected from the group consisting of the structural units represented by formulas (a2-1-1), (a2-1-2), (a2-2-1), (a2-2-7), (a2-2-12), (a2-2-14), (a2-3-1) and (a2-3-5).

In the component (A1), as the structural unit (a2), one type of structural unit may be used alone, or two or more types of structural units may be used in combination. For example, as the structural unit (a2), a structural unit (a2$^S$) may be used alone, or a structural unit (a2$^L$) may be used alone, or a combination of these structural units may be used. Further, as the structural unit (a2$^S$) or the structural unit (a2$^L$), either a single type of structural unit may be used, or two or more types may be used in combination.

In the present invention, it is particularly desirable that the structural unit (a2) includes at least the structural unit (a2$^S$), as the effects of the present invention are improved.

In the component (A1), the amount of the structural unit (a2) based on the combined total of all structural units constituting the component (A1) is preferably 1 to 80 mol %, more preferably 10 to 70 mol %, still more preferably 10 to 65 mol %, and most preferably 10 to 60 mol %. When the amount of the structural unit (a2) is at least as large as the lower limit of the above-mentioned range, the effect of using the structural unit (a2) can be satisfactorily achieved. On the other hand, when the amount of the structural unit (a2) is no more than the upper limit of the above-mentioned range, a good balance can be achieved with the other structural units, and various lithography properties, such as DOF and CDU, and pattern shape can be improved.

(Structural Unit (a3))

The structural unit (a3) is a structural unit (a3) derived from an acrylate ester containing a polar group-containing aliphatic hydrocarbon group. When the component (A1) includes the structural unit (a3), the hydrophilicity of the component (A) is improved, and hence, the compatibility of the component (A) with the developing solution is improved. As a result, the alkali solubility of the exposed portions improves, which contributes to favorable improvements in the resolution.

Examples of the polar group include a hydroxyl group, a cyano group, a carboxy group and a fluorinated alcohol group (a hydroxyalkyl group in which part of the hydrogen atoms of the alkyl group have been substituted with fluorine atoms).

Among these, a hydroxyl group or a carboxy group is preferable, and a hydroxyl group is particularly desirable.

In the structural unit (a3), the number of polar groups bonded to the aliphatic hydrocarbon group is not particularly limited, although 1 to 3 groups is preferable, and 1 group is particularly desirable.

The aliphatic hydrocarbon group to which the polar group is bonded may be either saturated or unsaturated, but is preferably saturated.

As specific examples of the aliphatic hydrocarbon group, a linear or branched aliphatic hydrocarbon group, and an aliphatic hydrocarbon group containing a ring in the structure thereof can be given.

The "linear or branched aliphatic hydrocarbon group" preferably has 1 to 12 carbon atoms, more preferably 1 to 10 carbon atoms, still more preferably 1 to 8 carbon atoms, and still more preferably 1 to 6 carbon atoms.

The linear or branched aliphatic hydrocarbon group may have part or all of the hydrogen atoms substituted with a substituent other than the polar group. Examples of the substituent include a fluorine atom, a fluorinated alkyl group of 1 to 5 carbon atoms, and an oxygen atom (=O). Further, the linear or branched aliphatic hydrocarbon group may have a divalent group containing a hetero atom present between the carbon atoms. Examples of the "divalent group containing a hetero atom" include the same groups as those described for the "divalent linking group containing a hetero atom" as the divalent linking group represented by Y$^2$ in general formula (a1-0-2) explained above in relation to the structural unit (a1).

When the aliphatic hydrocarbon group is linear or branched, as the structural unit (a3), a structural unit represented by general formula (a3-1) or (a3-2) shown below is preferable.

[Chemical Formula 40]

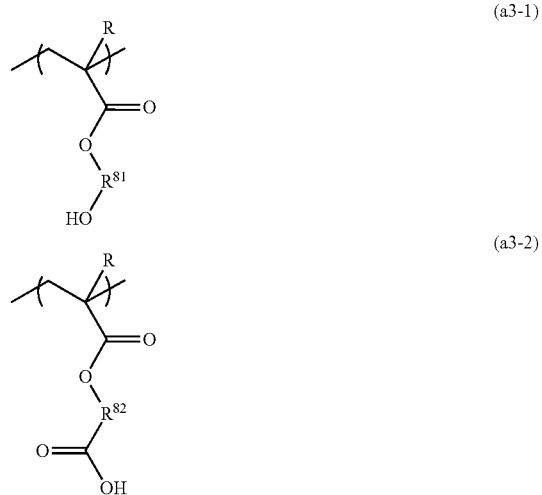

In the formulas, R represents a hydrogen atom, an alkyl group of 1 to 5 carbon atoms or a halogenated alkyl group of 1 to 5 carbon atoms; R$^{81}$ represents a linear or branched alkylene group; and R$^{82}$ represents an alkylene group which may have a divalent group containing a hetero atom present therein.

In general formula (a3-1), the alkylene group for R$^{81}$ preferably has 1 to 12 carbon atoms, and more preferably 1 to 10 carbon atoms.

In general formula (a3-2), the alkylene group for R$^{82}$ preferably has 1 to 12 carbon atoms, more preferably 1 to 10 carbon atoms, and most preferably 1 to 6 carbon atoms.

When the alkylene group has 2 or more carbon atoms, the alkylene group may have a divalent group containing a hetero atom present between the carbon atoms. Examples of the "divalent group containing a hetero atom" include the same groups as those described for the "divalent linking group containing a hetero atom" as the divalent linking group represented by Y$^2$ in general formula (a1-0-2) explained above in relation to the structural unit (a1).

As R$^{82}$, an alkylene group having no divalent group containing a hetero atom, or an alkylene group having a divalent linking group containing an oxygen atom as a hetero atom present therein is particularly desirable.

As the alkylene group having a divalent group containing an oxygen atom present therein, a group represented by the formula -A$_1$-O-B$_1$- or -A$_1$-O-C(=O)-B$_1$- is preferable. In the formulas, each of A$_1$ and B$_1$ independently represents a divalent hydrocarbon group which may have a substituent, and examples thereof include the same groups as those described above for $A_1$ and $B_1$ in the aforementioned group represented by the formula $-A_1-O-B_1-$ or $-[A_1-C(=O)-O]_m-B_1-$ in relation to A in the structural unit (a0-2).

Among these, a group represented by the formula $-A_1-O-C(=O)-B_1-$ is preferable, and a group represented by the formula $-(CH_2)_f-O-C(=O)-(CH_2)_g-$ (in the formula, each of f and g independently represents an integer of 1 to 3) is more preferable.

As examples of the "aliphatic hydrocarbon group containing a ring in the structure thereof", a cyclic aliphatic hydrocarbon group, and a group in which the cyclic aliphatic hydrocarbon group is bonded to the terminal of the aforementioned chain-like aliphatic hydrocarbon group or interposed within the aforementioned chain-like aliphatic hydrocarbon group, can be given.

The cyclic aliphatic hydrocarbon group preferably has 3 to 30 carbon atoms. Further, the cyclic aliphatic hydrocarbon group may be either a polycyclic group or a monocyclic group, and is preferably a polycyclic group.

Specifically, the cyclic aliphatic hydrocarbon group can be selected appropriately from the multitude of resins that have been proposed for the resins of resist compositions designed for use with ArF excimer lasers. As the monocyclic aliphatic hydrocarbon group, a group in which two or more hydrogen atoms have been removed from a monocycloalkane of 3 to 20 carbon atoms is preferable. Examples of the monocycloalkane include cyclopentane and cyclohexane. As the polycyclic aliphatic hydrocarbon group, a group in which two or more hydrogen atoms have been removed from a polycycloalkane of 7 to 30 carbon atoms is preferable. Examples of the polycycloalkane include adamantane, norbornane, isobornane, tricyclodecane and tetracyclododecane.

The cyclic aliphatic hydrocarbon group may have part or all of the hydrogen atoms substituted with a substituent other than the polar group. Examples of the substituent include an alkyl group of 1 to 5 carbon atoms, a fluorine atom, a fluorinated alkyl group of 1 to 5 carbon atoms, and an oxygen atom (=O).

When the aliphatic hydrocarbon group contains a ring in the structure thereof, as the structural unit (a3), a structural unit represented by general formula (a3-3), (a3-4) or (a3-5) shown below is preferable.

[Chemical Formula 41]

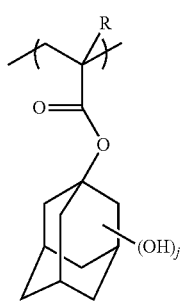

(a3-3)

(a3-4)

(a3-5)

In the formulas, R represents a hydrogen atom, an alkyl group of 1 to 5 carbon atoms or a halogenated alkyl group of 1 to 5 carbon atoms; j represents an integer of 1 to 3; k' represents an integer of 1 to 3; t' represents an integer of 1 to 3; l' represents an integer of 1 to 5; and s' represents an integer of 1 to 3.

In general formula (a3-3), j is preferably 1 or 2, and more preferably 1. When j is 2, it is preferable that the hydroxyl groups be bonded to the 3rd and 5th positions of the adamantyl group. When j is 1, it is preferable that the hydroxyl group be bonded to the 3rd position of the adamantyl group.

In general formula (a3-4), k' is preferably 1. The cyano group is preferably bonded to the 5th or 6th position of the norbornyl group.

In general formula (a3-5), t' is preferably 1. l' is preferably 1.

s' is preferably 1.

In general formula (a3-5), the oxygen atom (—O—) within the carbonyloxy group is preferably bonded to the 2nd or 3rd position of the norbornane ring. The fluorinated alkylalcohol group is preferably bonded to the 5th or 6th position of the norbornyl group.

As the structural unit (a3), one type of structural unit may be used alone, or two or more types of structural units may be used in combination.

As the structural unit (a3), a structural unit represented by any one of the aforementioned general formulas (a3-1) to (a3-5) is preferable, and a structural unit represented by the aforementioned formula (a3-2) is particularly desirable.

When the component (A1) contains the structural unit (a3), the amount of the structural unit (a3) based on the combined total of all structural units constituting the component (A1) is preferably 1 to 50 mol %, more preferably 5 to 40 mol %, and still more preferably 5 to 25 mol %.

(Other Structural Units)

The component (A1) may also have a structural unit other than the above-mentioned structural units (a0-1), (a1), (a2) and (a3) (hereafter, referred to as "structural unit (a4)"), as long as the effects of the present invention are not impaired.

As the structural unit (a4), any other structural unit which cannot be classified as one of the above structural units (a0-1), (a1), (a2) and (a3) can be used without any particular limitations, and any of the multitude of conventional structural units used within resist resins for ArF excimer lasers or KrF excimer lasers (and particularly for ArF excimer lasers) can be used.

Preferable examples of the structural unit (a4) include a structural unit derived from an acrylate ester which contains a non-acid-dissociable aliphatic polycyclic group. Examples of this polycyclic group include the same groups as those described above in relation to the aforementioned structural unit (a1), and any of the multitude of conventional polycyclic groups used within the resin component of resist compositions for ArF excimer lasers or KrF excimer lasers (and particularly for ArF excimer lasers) can be used.

In consideration of industrial availability and the like, at least one polycyclic group selected from amongst a tricyclodecanyl group, adamantyl group, tetracyclododecanyl group, isobornyl group and norbornyl group is particularly desirable. These polycyclic groups may be substituted with a linear or branched alkyl group of 1 to 5 carbon atoms.

Specific examples of the structural unit (a4) include structural units with structures represented by general formulas (a-4-1) to (a-4-5) shown below.

[Chemical Formula 42]

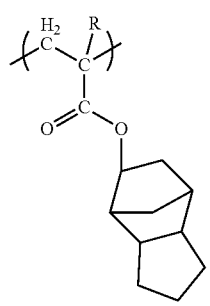
(a4-1)

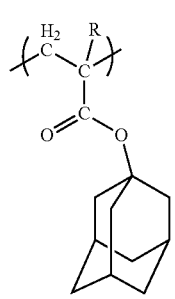
(a4-2)

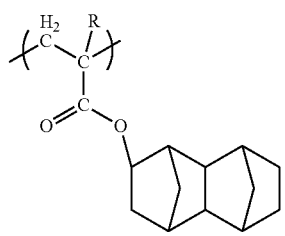
(a4-3)

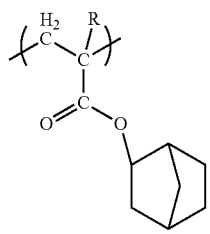
(a4-4)

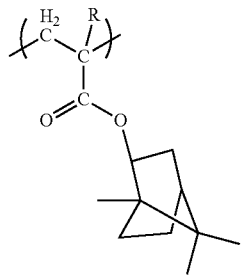
(a4-5)

In the formulas, R represents a hydrogen atom, an alkyl group of 1 to 5 carbon atoms or a halogenated alkyl group of 1 to 5 carbon atoms.

As the structural unit (a4), one type of structural unit may be used alone, or two or more types of structural units may be used in combination.

When the structural unit (a4) is included in the component (A1), the amount of the structural unit (a4) based on the combined total of all structural units constituting the component (A1) is preferably 1 to 20 mol %, more preferably 1 to 15 mol %, and still more preferably 1 to 10 mol %.

The component (A1) is preferably a copolymer including the structural unit (a0-1) and the structural unit (a1), and more preferably a copolymer including the structural unit (a0-1), the structural unit (a1) and the structural unit (a2).

Examples of such a copolymer include a copolymer consisting of the structural units (a0-1) and (a1), a copolymer consisting of the structural units (a0-1), (a1) and (a2), a copolymer consisting of the structural units (a0-1), (a1), (a2) and (a3), a copolymer consisting of the structural units (a0-1), (a1), (a2) and (a4), and a copolymer consisting of the structural units (a0-1), (a1), (a2), (a3) and (a4).

Preferred examples of the component (A1) include a copolymer that includes a combination of structural units represented by general formulas (A1-11) and (A1-12) shown below.

[Chemical Formula 43]

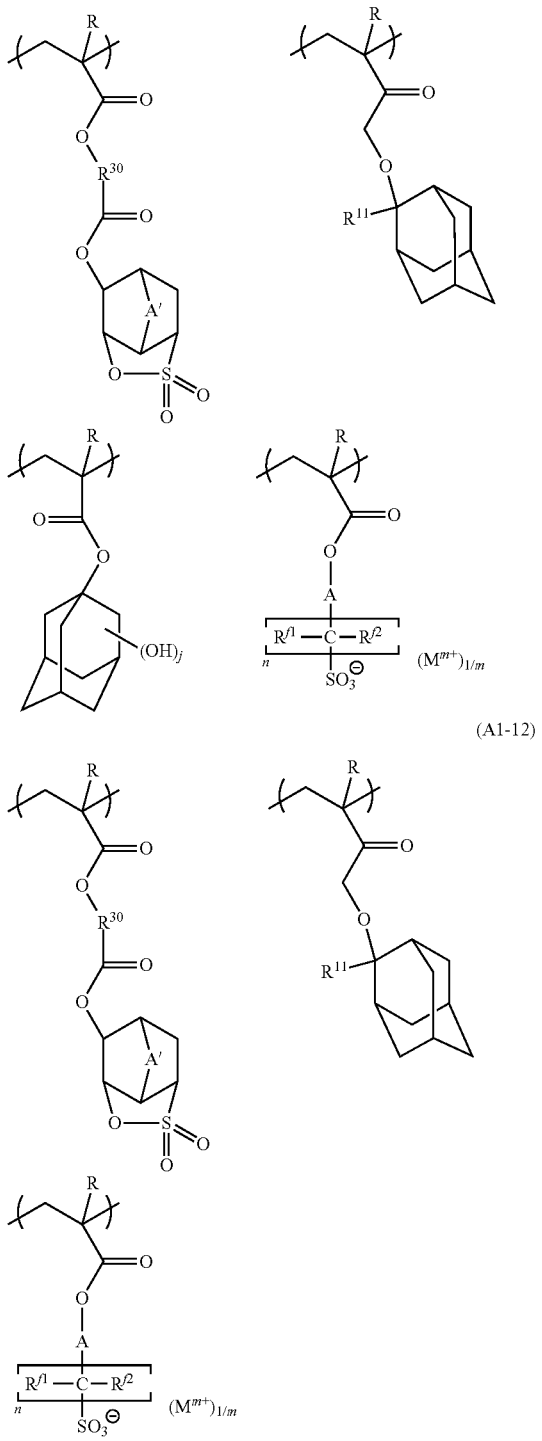

(A1-11)

(A1-12)

In the formulas, R, $R^{30}$, A', $R^{11}$, j, $R^{f1}$, $R^{f2}$, n, $M^{m+}$ and m are the same as defined above, and the plurality of R in the formulas may be the same or different from each other.

The weight average molecular weight (Mw) (the polystyrene equivalent value determined by gel permeation chromatography (GPC)) of the component (A1) is not particularly limited, but is preferably within a range from 1,000 to 50,000, more preferably from 1,500 to 30,000, and still more preferably 2,000 to 20,000. Provided the weight average molecular weight is not more than the upper limit of the above-mentioned range, the component (A1) exhibits satisfactory solubility in a resist solvent when used as a resist, whereas provided the weight average molecular weight is at least as large as the lower limit of the above-mentioned range, the dry etching resistance and cross-sectional shape of the resist pattern can be improved.

Further, the dispersity (Mw/Mn) of the component (A1) is not particularly limited, but is preferably within a range from 1.0 to 5.0, more preferably from 1.0 to 3.0, and most preferably 1.0 to 2.5. Here, Mn is the number average molecular weight.

The component (A1) can be obtained, for example, by a conventional radical polymerization or the like of the monomers corresponding with each of the structural units, using a radical polymerization initiator such as dimethyl 2,2-azobis (2-methylpropionate) and azobisisobutyronitrile (AIBN).

Furthermore, in the component (A1), by using a chain transfer agent such as $HS-CH_2-CH_2-CH_2-C(CF_3)_2-OH$ during the above polymerization, a $-C(CF_3)_2-OH$ group can be introduced at the terminals of the component (A1). Such a copolymer having introduced a hydroxyalkyl group in which some of the hydrogen atoms of the alkyl group are substituted with fluorine atoms is effective in reducing developing defects and LER (line edge roughness: unevenness of the side walls of a line pattern).

As the monomers for deriving the corresponding structural units, commercially available monomers may be used, or the monomers may be synthesized by a conventional method.

For example, as a monomer for deriving the structural unit represented by the aforementioned general formula (a2-0-1), a compound represented by general formula (II) shown below (hereafter, referred to as a "compound (II)") can be used.

The method for producing the compound (II) is not particularly limited, and the compound (II) can be produced by a conventional method. For example, in the presence of a base, a compound (II-2) represented by general formula (II-2) shown below is added to a solution obtained by dissolving a compound (II-1) represented by general formula (II-1) shown below in a reaction solvent, and a reaction is effected to thereby obtain the compound (II) described above.

Examples of the base include inorganic bases such as sodium hydride, $K_2CO_3$ and $Cs_2CO_3$; and organic bases such as triethylamine, 4-dimethylaminopyridine (DMAP) and pyridine. Examples of condensing agents include carbodiimide reagents such as ethyldiisopropylaminocarbodiimide hydrochloride (EDCI), dicyclohexylcarboxylmide (DCC), diisopropylcarbodiimide and carbodiimidazole; tetraethyl pyrophosphate; and benzotriazole-N-hydroxytrisdimethylaminophosphonium hexafluorophosphide (Bop reagent).

If desired, an acid may be used during the above reaction. As the acid, any acid generally used for dehydration/condensation may be used. Specific examples include inorganic acids such as hydrochloric acid, sulfuric acid and phosphoric acid; and organic acids such as methanesulfonic acid, trifluoromethanesulfonic acid, benzenesulfonic acid and p-toluenesulfonic acid. These acids may be used alone, or in combinations containing two or more different acids.

A compound in which $R^{28}$ represents a lactone-containing cyclic group can also be produced by the same method.

[Chemical Formula 44]

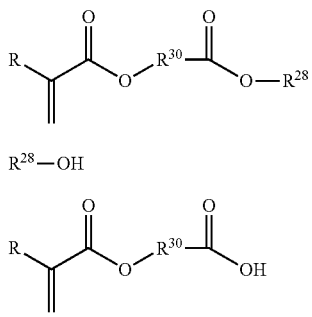

In the formulas, R, $R^{30}$ and $R^{28}$ are respectively the same as defined for R, $R^{30}$ and $R^{28}$ in the aforementioned general formula (a2-0-1).

The structure of the compound obtained in the manner described above can be confirmed by a general organic analysis method such as $^1$H-nuclear magnetic resonance (NMR) spectrometry, $^{13}$C—NMR spectrometry, $^{19}$F—NMR spectrometry, infrared absorption (IR) spectrometry, mass spectrometry (MS), elementary analysis and X-ray diffraction analysis.

In the component (A), as the component (A1), one type of component may be used alone, or two or more types may be used in combination.

In the component (A), the amount of the component (A1) based on the total weight of the component (A) is preferably 50% by weight or more, more preferably 80% by weight or more, and may be even 100% by weight.

[Component (A2)]

As the component (A2), either a single resin component that does not generate acid upon exposure and also exhibits increased solubility in an alkali developing solution by the action of acid, or a mixture of two or more such resin components, may be used.

In the present invention, the component (A2) preferably includes a structural unit derived from an acrylate ester.

In the present invention, it is particularly desirable that the component (A2) does not include the structural unit (a0-2) that generates acid upon exposure, but does include the structural unit (a1) derived from an acrylate ester containing an acid dissociable, dissolution inhibiting group.

Further, the component (A2) may have at least one type of structural unit (a2) selected from the group consisting of a structural unit derived from an acrylate ester containing a —$SO_2$— containing cyclic group and a structural unit derived from an acrylate ester containing a lactone-containing cyclic group, as well as the structural unit (a1).

Moreover, in addition to the structural unit (a1), or in addition to the combination of the structural units (a1) and (a2), the component (A2) may also have a structural unit (a3) derived from an acrylate ester that contains a polar group-containing aliphatic hydrocarbon group.

Each of these structural units may be used alone, or two or more types thereof may be used in combination.

The structural units (a1), (a2) and (a3) are the same as defined above for the structural units (a1), (a2) and (a3).

The component (A2) may also include other structural units besides the above structural units (a1) to (a3), provided the inclusion of these other structural units does not impair the effects of the present invention.

There are no particular limitations on these other structural units, and any other structural unit which cannot be classified as one of the above structural units (a1) to (a3) can be used without any particular limitations. Any of the multitude of conventional structural units used within resist resins for ArF excimer lasers or KrF excimer lasers (and particularly for ArF excimer lasers) or the like can be used, and examples thereof include the structural unit (a4) described above in connection with the component (A1).

The component (A2) is preferably a copolymer that includes the structural unit (a1).

Examples of such a copolymer include a copolymer consisting of the structural unit (a1), a copolymer consisting of the structural units (a1) and (a2), a copolymer consisting of the structural units (a1), (a2) and (a3), a copolymer consisting of the structural units (a1), (a2) and (a4), and a copolymer consisting of the structural units (a1), (a2), (a3) and (a4).

In the component (A), as the component (A2), one type of component may be used alone, or two or more types may be used in combination.

When the component (A) includes the component (A2), the amount of the component (A2) within the component (A) based on the total weight of the component (A) is preferably 50% by weight or more, more preferably 80% by weight or more, and may be even 100% by weight.

[Component (A3)]

As the component (A3), a low molecular weight compound that has a molecular weight of at least 500 but less than 4,000, contains a hydrophilic group, and also contains an acid dissociable, dissolution inhibiting group such as those listed above in connection with the component (A1) is preferred. Specific examples thereof include compounds containing a plurality of phenol skeletons in which a portion of hydrogen atoms in the hydroxyl groups have been substituted with the aforementioned acid dissociable, dissolution inhibiting groups.

Preferred examples of the component (A3) include low molecular weight phenol compounds in which a portion of hydrogen atoms in the hydroxyl groups have been substituted with an aforementioned acid dissociable, dissolution inhibiting group. These types of compounds are known, for example, as sensitizers or heat resistance improvers for use in non-chemically amplified g-line or i-line resists, and any of these compounds may be used.

Examples of these low molecular weight phenol compounds include bis(4-hydroxyphenyl)methane, bis(2,3,4-trihydroxyphenyl)methane, 2-(4-hydroxyphenyl)-2-(4'-hydroxyphenyl)propane, 2-(2,3,4-trihydroxyphenyl)-2-(2',3', 4'-trihydroxyphenyl)propane, tris(4-hydroxyphenyl) methane, bis(4-hydroxy-3,5-dimethylphenyl)-2-hydroxyphenylmethane, bis(4-hydroxy-2,5-dimethylphenyl)-2-hydroxyphenylmethane, bis(4-hydroxy-3,5-dimethylphenyl)-3,4-dihydroxyphenylmethane, bis(4-hydroxy-2,5-dimethylphenyl)-3,4-dihydroxyphenylmethane, bis(4-hydroxy-3-methylphenyl)-3,4-dihydroxyphenylmethane, bis(3-cyclohexyl-4-hydroxy-6-methylphenyl)-4-hydroxyphenylmethane, bis(3-cyclohexyl-4-hydroxy-6-methylphenyl)-3,4-dihydroxyphenylmethane, 1-[1-(4-hydroxyphenyl) isopropyl]-4-[1,1-bis(4-hydroxyphenyl)ethyl]benzene, and dimers to hexamers of formalin condensation products of phenols such as phenol, m-cresol, p-cresol and xylenol. Needless to say, the low molecular weight phenol compound is not limited to these examples. Among these, in terms of achieving excellent resolution and line width roughness (LWR), a phenol compound having 2 to 6 triphenylmethane skeletons is particularly desirable.

Also, there are no particular limitations on the acid dissociable, dissolution inhibiting group, and suitable examples include the groups described above.

As the component (A3), one type of compound may be used alone, or two or more types of compounds may be used in combination.

In the resist composition of the present invention, the component (A) may use either one type of component, or a combination of two or more components.

Of the examples shown above, the component (A) preferably includes the component (A1) or the component (A2), and more preferably includes the component (A1).

The amount of the component (A) within the resist composition of the present invention may be adjusted in accordance with factors such as the thickness of the resist film that is to be formed.

<Component (G)>

The component (G) at least one compound selected from the group consisting of a polymeric compound (G1) (hereafter, referred to as a "component (G1)") having a core portion that includes a hydrocarbon group or a heterocycle of two or more valences and also at least one arm portion that is bonded to the core portion and is represented by general formula (1) shown below, and a polymeric compound (G2) (hereafter, referred to as a "component (G2)") having a core portion that includes a polymer having a molecular weight of 500 or more and 20,000 or less and also at least one arm portion that is bonded to the core portion and is represented by general formula (1) shown below.

[Chemical Formula 45]

—(X)—Y    (1)

In the formula, X represents a divalent linking group having an acid dissociable group, and Y represents a polymer chain.

[Component (G1)]

The component (G1) is a polymeric compound having a core portion that includes a hydrocarbon group or a heterocycle of two or more valences and also at least one arm portion that is bonded to the core portion and is represented by general formula (1) shown above.

<<Core Portion>>

In the component (G1) of the present invention, the core portion is constituted of a hydrocarbon group or a heterocycle of two or more valences.

The hydrocarbon group may be either an aliphatic hydrocarbon group, an aromatic hydrocarbon group or a group constituted of only carbon atoms.

The aliphatic hydrocarbon group may be a chain-like aliphatic hydrocarbon group, a cyclic aliphatic hydrocarbon group, or a combination of these aliphatic hydrocarbon groups. Further, the aliphatic hydrocarbon group may be either saturated or unsaturated.

As the aromatic hydrocarbon group, a hydrocarbon group having an aromatic hydrocarbon ring can be used. For example, the aromatic hydrocarbon group may be constituted solely of an aromatic hydrocarbon ring, or may be a combination of an aromatic hydrocarbon ring and the aforementioned aliphatic hydrocarbon group.

The number of carbon atoms within the hydrocarbon group is preferably within a range from 1 to 20.

Examples of the hydrocarbon group include groups having a structure represented by the formulas shown below.

[Chemical Formula 46]

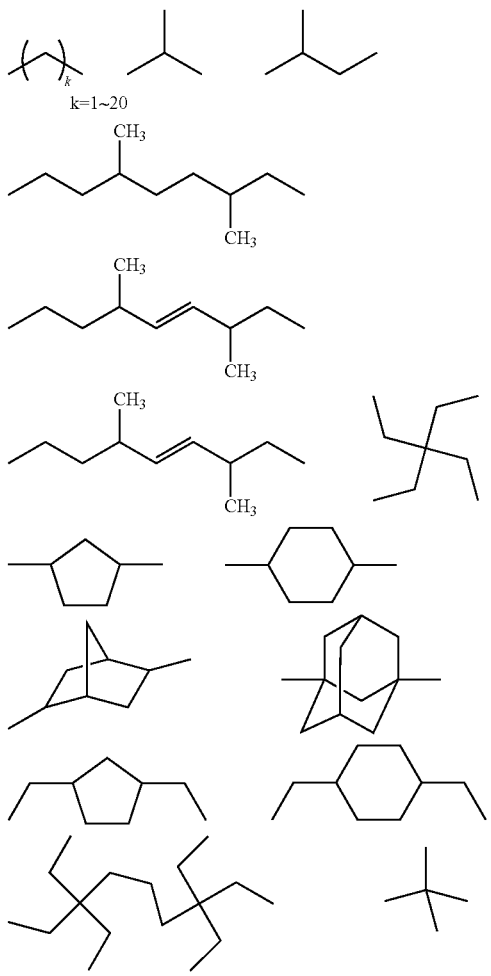

[Chemical Formula 47]

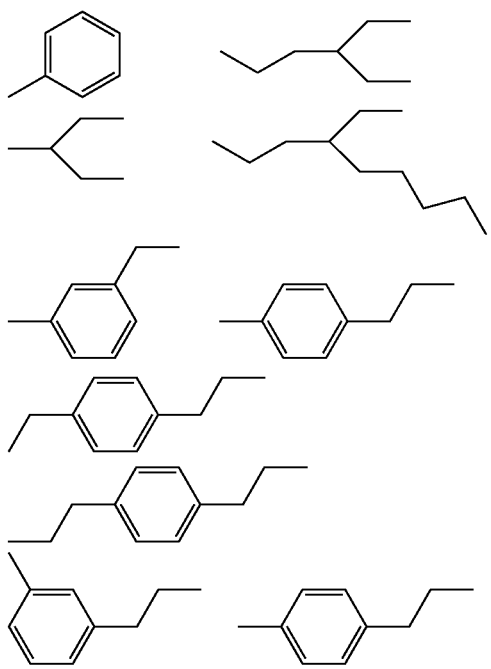

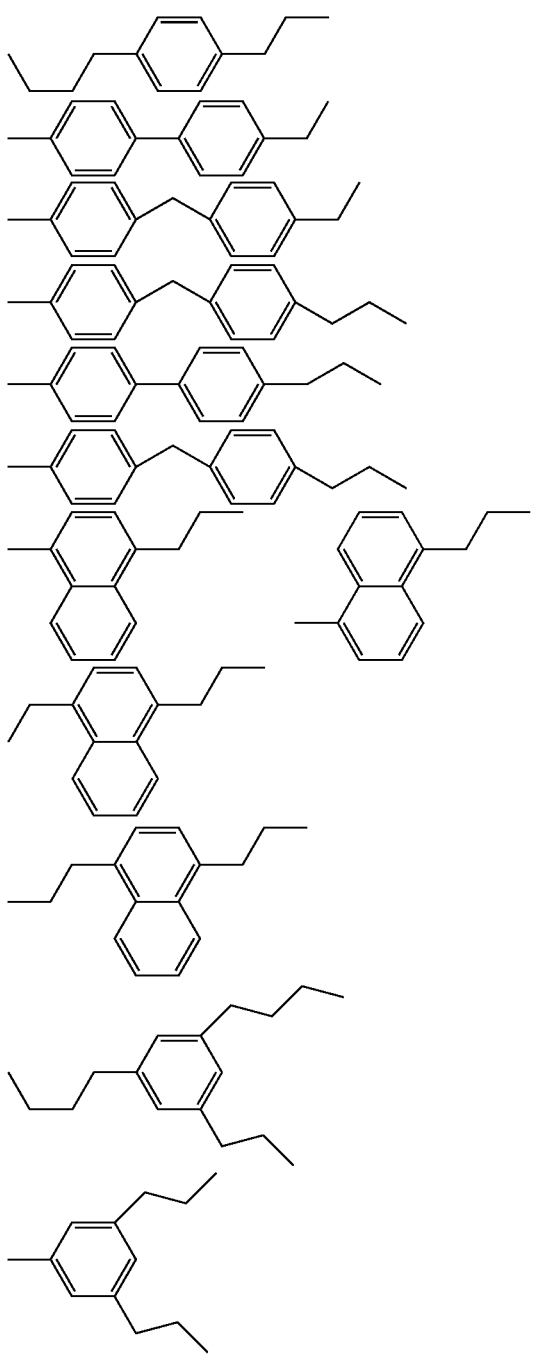

The heterocycle may be an aliphatic heterocycle containing a hetero atom within the ring structure or an aromatic heterocycle containing a hetero atom within the ring structure, and an aromatic heterocycle containing a hetero atom within the ring structure is preferable.

The heterocycle may be either monocyclic or polycyclic.

The hetero atom is an atom other than a carbon atom, and examples thereof include a nitrogen atom, a sulfur atom and an oxygen atom.

The number of carbon atoms within the heterocycle is preferably within a range from 1 to 20.

Examples of the heterocycle include groups having a structure represented by the formulas shown below. In the formulas, the bonding position may be any one of the carbon atoms.

[Chemical Formula 48]

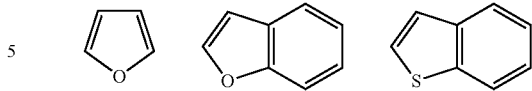

The component (G1) may include only one core portion or two or more core portions, and preferably includes two or more core portions.

When the component (G1) includes a plurality of core portions, the plurality of core portions may be the same with each other or may be different from each other, and preferably be the same with each other, as the effects of the present invention are particularly improved.

When the component (G1) includes a plurality of core portions, the plurality of core portions are preferably bonded with each other via a linkage portion.

<<Linkage Portion>>

The linkage portion is preferably an atom or a divalent linking group.

Examples of the atom for the linkage portion include a carbon atom, an oxygen atom and a nitrogen atom, and a carbon atom or an oxygen atom is preferable.

Examples of the divalent linking groups for the linkage portion include the same divalent linking groups as those described above for A in general formula (a0-2).

In the present invention, the divalent linking group is preferably an alkylene group, a divalent aliphatic cyclic group or a divalent linking group containing a hetero atom, more preferably an alkylene group of 1 to 10 carbon atoms, still more preferably an alkylene group of 1 to 6 carbon atoms, and most preferably an alkylene group of 1 to 4 carbon atoms. Specific examples of these alkylene groups include the same linear alkylene groups and branched alkylene groups as those described above.

Further, the divalent linking group in the present invention may be a divalent polymer. The average degree of polymerization of the polymer between two cores is preferably no more than 50, and more preferably no more than 20.

<<Arm Portion>>

In the component (G1) of the present invention, the arm portion is bonded to the core portion and is also represented by general formula (1) above.

[Y: Polymer Chain]

In formula (1), Y represents a polymer chain (hereafter, referred to as "polymer chain Y").

In a plurality of arm portions in the component (G1), the polymer chains Y may be the same with each other or may be different from each other, and preferably be the same with each other, as the effects of the present invention are particularly improved.

The polymer chain Y preferably includes a structural unit (hereafter, referred to as "structural unit (g5)") derived from a hydroxystyrene derivative.

Further, the polymer chain Y preferably includes a structural unit (hereafter, referred to as "structural unit (g7)") in which at least part of the hydrogen atoms in the hydroxyl group of the structural unit derived from hydroxystyrene or the hydrogen atom in the —C(=O)OH group of the structural unit derived from vinylbenzoic acid is protected by a substituent.

The polymer chain Y may further include a structural unit (hereafter, referred to as "structural unit (g6)") derived from styrene, and may also include other structural units (such as the structural units (g1), (g2), (g3) and (g4) to be described later) such as a structural unit having an acid dissociable, dissolution inhibiting group.

(Structural Unit (g5))

The structural unit (g5) is a structural unit derived from a hydroxystyrene derivative.

When the polymer chain Y includes the structural unit (g5), the dry etching resistance is improved. Furthermore, the structural unit (g5) is also advantageous in terms of easy availability and low cost of hydroxystyrene used as a source material.

Preferable examples of the structural unit (g5) include structural units represented by general formula (g5-1) shown below.

[Chemical Formula 49]

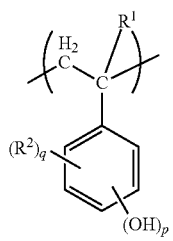

(g5-1)

In formula (g5-1), $R^1$ represents a hydrogen atom, an alkyl group of 1 to 5 carbon atoms or a halogenated alkyl group of 1 to 5 carbon atoms; $R^2$ represents a halogen atom, an alkyl group of 1 to 5 carbon atoms or a halogenated alkyl group of 1 to 5 carbon atoms; p represents an integer of 1 to 3; and q represents an integer of 0 to 4; with the proviso that p+q is from 1 to 5.

In general formula (g5-1) above, as $R^1$, the same groups as those described above for R in general formula (a0-2) can be used, and a hydrogen atom or an alkyl group of 1 to 5 carbon atoms is preferable, and a hydrogen atom or a methyl group is particularly desirable.

p represents an integer of 1 to 3, and preferably 1.

The bonding position of the hydroxyl group may be any of the o-position, m-position and p-position of the phenyl group. When p is 1, the p-position is preferable in terms of availability and low cost. When p is 2 or 3, a desired combination of the substitution positions can be used.

q is an integer of 0 to 4, preferably 0 or 1, and most preferably 0 from an industrial viewpoint.

As the alkyl group of 1 to 5 carbon atoms for $R^2$, the same alkyl groups of 1 to 5 carbon atoms as those described above for $R^1$ can be used.

As examples of the halogen atom for $R^2$, a fluorine atom, a chlorine atom, a bromine atom and an iodine atom can be given. Among these, a fluorine atom is preferable.

When q is 1, the substitution position of $R^2$ may be any of the o-position, the m-position and the p-position.

When q is 2, a desired combination of the substitution positions can be used.

However, $1 \leq p+q \leq 5$.

As the structural unit (g5), one type of structural unit may be used alone, or two or more types of structural units may be used in combination.

The amount of the structural unit (g5) based on the combined total of all structural units constituting the polymer chain Y is preferably 50 to 90 mol %, more preferably 55 to 90 mol %, and still more preferably 60 to 90 mol %. By making the amount of the structural unit (g5) at least as large as the lower limit of the above-mentioned range, an adequate level of alkali solubility can be achieved. On the other hand, when the amount of the structural unit (g5) is no more than the upper limit of the above-mentioned range, a good balance can be achieved with the other structural units.

Further, inclusion of the structural unit (g5) having a hydroxystyrene skeleton in the component (G1) improves the sensitizing capacity of the component (G1).

(Structural Unit (g6))

The structural unit (g6) is a structural unit derived from styrene.

In the present invention, the structural unit (g6) is not essential. However, inclusion of the structural unit (g6) makes it possible to adjust the solubility in an alkali developing solution. Further, inclusion of the structural unit (g6) is preferred since the dry etching resistance is improved.

Preferable examples of the structural unit (g6) include structural units represented by general formula (g6-1) shown below.

[Chemical Formula 50]

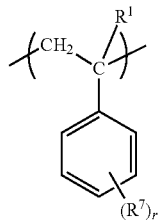

(g6-1)

In formula (g6-1), $R^1$ represents a hydrogen atom, an alkyl group of 1 to 5 carbon atoms or a halogenated alkyl group of 1 to 5 carbon atoms; $R^7$ represents a halogen atom, an alkyl group of 1 to 5 carbon atoms or a halogenated alkyl group of 1 to 5 carbon atoms; and r represents an integer of 0 to 3.

In general formula (g6-1) above, $R^1$ is the same as defined above for $R^1$ in general formula (g5-1).

As $R^7$, the same groups as those described above for $R^2$ defined in formula (g5-1) can be mentioned.

r represents an integer of 0 to 3, preferably 0 or 1, and most preferably 0 from an industrial viewpoint.

When r is 1, the substitution position of $R^7$ may be any of the o-position, m-position and p-position of the phenyl group.

When r is 2 or 3, a desired combination of the substitution positions can be used. The plurality of $R^7$ may be the same or different from each other.

As the structural unit (g6), one type of structural unit may be used alone, or two or more types of structural units may be used in combination.

When the polymer chain Y includes the structural unit (g6), the proportion of the structural unit (g6) based on the combined total of all structural units constituting the polymer chain Y is preferably 1 to 20 mol %, more preferably 3 to 15 mol %, and still more preferably 5 to 15 mol %. Making this proportion at least as large as the lower limit of the above-mentioned range ensures that the effects obtained by including the structural unit (g6) are achieved, whereas by making the proportion no more than the upper limit of the above-mentioned range, a good balance can be achieved with the other structural units.

(Structural Unit (g7))

The structural unit (g7) is a structural unit in which at least part of the hydrogen atoms in the hydroxyl group of the structural unit derived from hydroxystyrene or the hydrogen atom in the —C(=O)OH group of the structural unit derived from vinylbenzoic acid is protected by a substituent.

In the structural unit (g7), examples of the substituent include a tertiary alkyl group-containing group, an alkoxyalkyl group, an acid dissociable, dissolution inhibiting group, and an organic group containing an acid dissociable, dissolution inhibiting group.

Tertiary Alkyl Group-Containing Group

In the present description, the term "tertiary alkyl group" refers to an alkyl group having a tertiary carbon atom. As mentioned above, the term "alkyl group" refers to a monovalent saturated hydrocarbon group, and includes chain-like (linear or branched) alkyl groups as well as alkyl groups having a cyclic structure.

The "tertiary alkyl group-containing group" refers to a group containing a tertiary alkyl group within its structure. The tertiary alkyl group-containing group may be composed solely of the tertiary alkyl group, or may be composed of the tertiary alkyl group and other atom(s) or group(s) besides the tertiary alkyl group.

Examples of these "other atom(s) or group(s) besides the tertiary alkyl group" that may constitute the tertiary alkyl group-containing group together with the tertiary alkyl group include a carbonyloxy group, carbonyl group, alkylene group or oxygen atom.

In the structural unit (g7), examples of the tertiary alkyl group-containing group include tertiary alkyl group-containing groups which do not contain a cyclic structure, and tertiary alkyl group-containing groups which contain a cyclic structure.

A tertiary alkyl group-containing group which does not contain a cyclic structure is a group which has a branched tertiary alkyl group as the tertiary alkyl group, and has no cyclic structure in the structure thereof.

Examples of these branched tertiary alkyl groups include the groups represented by general formula (I) shown below.

[Chemical Formula 51]

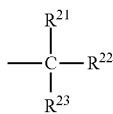

(I)

In formula (I), each of $R^{21}$ to $R^{23}$ independently represents a linear or branched alkyl group. These alkyl groups preferably contain 1 to 5 carbon atoms, and more preferably 1 to 3 carbon atoms.

Further, the total number of carbon atoms within the group represented by general formula (I) is preferably from 4 to 7 carbon atoms, more preferably from 4 to 6 carbon atoms, and most preferably 4 or 5 carbon atoms.

Specific examples of the group represented by general formula (I) include a tert-butyl group and tert-pentyl group, and a tert-butyl group is particularly desirable.

Examples of the tertiary alkyl group-containing groups which do not contain a cyclic structure include the branched tertiary alkyl groups described above; tertiary alkyl group-containing chain-like alkyl groups in which an aforementioned branched tertiary alkyl group is bonded to a linear or branched alkylene group; tertiary alkyloxycarbonyl groups containing an aforementioned branched tertiary alkyl group as the tertiary alkyl group; and tertiary alkyloxycarbonylalkyl groups containing an aforementioned branched tertiary alkyl group as the tertiary alkyl group.

The alkylene group in the tertiary alkyl group-containing chain-like alkyl group is preferably an alkylene group of 1 to 5 carbon atoms, more preferably an alkylene group of 1 to 4 carbon atoms, and still more preferably an alkylene group of 1 or 2 carbon atoms.

Examples of the chain-like tertiary alkyloxycarbonyl groups include groups represented by general formula (II) shown below. In formula (II), $R^{21}$ to $R^{23}$ are the same as defined above for $R^{21}$ to $R^{23}$ in formula (1). As this chain-like tertiary alkyloxycarbonyl group, a tert-butyloxycarbonyl group (t-boc) or tert-pentyloxycarbonyl group is preferred.

[Chemical Formula 52]

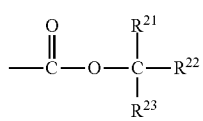

(II)

Examples of the chain-like tertiary alkyloxycarbonylalkyl groups include groups represented by general formula (III) shown below. In formula (III), $R^{21}$ to $R^{23}$ are the same as defined above for $R^{21}$ to $R^{23}$ in formula (I). f represents an integer of 1 to 3, and is preferably 1 or 2. As this chain-like tertiary alkyloxycarbonylalkyl group, a tert-butyloxycarbonylmethyl group or tert-butyloxycarbonylethyl group is preferred.

Of the above groups, the tertiary alkyl group-containing group which does not contain a cyclic structure is preferably a tertiary alkyloxycarbonyl group or a tertiary alkyloxycarbonylalkyl group, is more preferably a tertiary alkyloxycarbonyl group, and is most preferably a tert-butyloxycarbonyl group (t-boc).

[Chemical Formula 53]

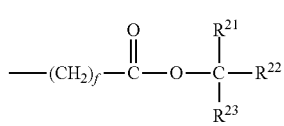

(III)

A tertiary alkyl group-containing group which contains a cyclic structure describes a group that includes a tertiary carbon atom and a cyclic structure within the group structure.

In the tertiary alkyl group-containing group which contains a cyclic structure, the cyclic structure preferably contains 4 to 12 carbon atoms, more preferably 5 to 10 carbon atoms, and most preferably 6 to 10 carbon atoms within the ring. Examples of the cyclic structure include groups in which one or more hydrogen atoms have been removed from a monocycloalkane or a polycycloalkane such as a bicycloalkane, tricycloalkane or tetracycloalkane. Preferable examples include groups in which one or more hydrogen atoms have been removed from a monocycloalkane such as cyclopentane or cyclohexane, or a polycycloalkane such as adamantane, norbornane, isobornane, tricyclodecane or tetracyclododecane.

Examples of the tertiary alkyl group-containing group which contains a cyclic structure include groups having the following group (1) or (2) as the tertiary alkyl group:

(1) A group in which a linear or branched alkyl group is bonded to a carbon atom that constitutes part of the ring of a cyclic alkyl group (cycloalkyl group), so that the carbon atom becomes a tertiary carbon atom; and (2) A group in which an alkylene group (branched alkylene group) having a tertiary carbon atom is bonded to a carbon atom that constitutes part of the ring of a cycloalkyl group.

In the above group (1), the linear or branched alkyl group preferably has 1 to 5 carbon atoms, more preferably 1 to 4 carbon atoms, and most preferably 1 to 3 carbon atoms.

Examples of the group (1) include a 2-methyl-2-adamantyl group, a 2-ethyl-2-adamantyl group, a 1-methyl-1-cycloalkyl group and a 1-ethyl-1-cycloalkyl group.

In other words, when represented by a general formula, as the tertiary alkyl group-containing group which contains a cyclic structure according to the aforementioned group (1), those represented by formula (p0) shown below are preferable, those represented by formula (p0-1) shown below are more preferable, and those represented by formula (p0-1-1) shown below are still more preferable.

[Chemical Formula 54]

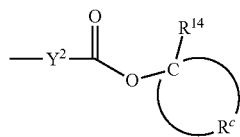

(p0)

In the formula, $Y^2$ represents either a single bond or the same divalent linking group as those defined above as the divalent linking group of the linkage portion that connects a plurality of core portions; $R^{14}$ represents an alkyl group of 1 to 5 carbon atoms; and Rc represents a group which forms an aliphatic cyclic group with the carbon atoms to which $R^c$ is bonded.

Examples of $R^c$ include the same aliphatic cyclic groups as those described above, and a polycyclic aliphatic cyclic group is preferable.

[Chemical Formula 55]

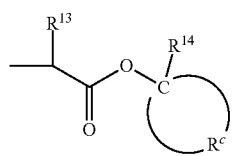

(p0-1)

In the formula, $R^{13}$ represents a hydrogen atom or a methyl group; $R^{14}$ represents an alkyl group of 1 to 5 carbon atoms; and $R^c$ represents a group which forms an aliphatic cyclic group with the carbon atoms to which $R^c$ is bonded.

[Chemical Formula 56]

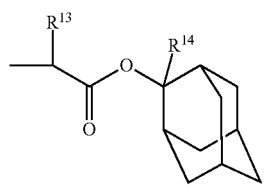

(p0-1-1)

In the formula, $R^{13}$ represents a hydrogen atom or a methyl group; and $R^{14}$ represents an alkyl group of 1 to 5 carbon atoms.

In the above group (2), the cycloalkyl group having the branched alkylene group bonded thereto may have a substituent. Examples of the substituent include a fluorine atom, a fluorinated alkyl group of 1 to 5 carbon atoms, and an oxygen atom (=O).

Examples of the group (2) include groups represented by chemical formula (IV) shown below.

[Chemical Formula 57]

(IV)

In formula (IV), $R^{24}$ represents a cycloalkyl group which may or may not have a substituent. Examples of the substituent which the cycloalkyl group may have include a fluorine atom, a fluorinated alkyl group of 1 to 5 carbon atoms, and an oxygen atom (=O).

Each of $R^{25}$ and $R^{26}$ independently represents a linear or branched alkyl group, and examples of this alkyl group include the same alkyl groups as those listed above for $R^{21}$ to $R^{23}$ in formula (1).

Alkoxyalkyl Group

Examples of the alkoxyalkyl group in the structural unit (g7) include groups represented by general formula (V) shown below.

[Chemical Formula 58]

$-R^{52}-O-R^{51}$ (V)

In formula (V), $R^{51}$ represents a linear, branched or cyclic alkyl group.

When $R^{51}$ represents a linear or branched alkyl group, it is preferably an alkyl group of 1 to 5 carbon atoms, more preferably an ethyl group or a methyl group, and is most preferably an ethyl group.

When $R^{51}$ represents a cyclic alkyl group, it preferably has 4 to 15 carbon atoms, more preferably 4 to 12 carbon atoms, and most preferably 5 to 10 carbon atoms. Examples of the cyclic alkyl group include groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group. Specific examples include groups in which one or more hydrogen atoms have been removed from a monocycloalkane such as cyclopentane and cyclohexane; and groups in which one or more hydrogen atoms have been removed from a polycycloalkane such as adamantane, norbornane, isobornane, tricyclodecane or tetracyclododecane. Of these, groups in which one or more hydrogen atoms have been removed from adamantane are preferable.

$R^{52}$ represents a linear or branched alkylene group. The alkylene group preferably has 1 to 5 carbon atoms, more preferably 1 to 3 carbon atoms, and most preferably 1 or 2 carbon atoms.

Of the various possibilities described above, as the alkoxyalkyl group, a group represented by general formula (VI) shown below is particularly desirable.

[Chemical Formula 59]

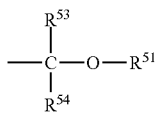
(VI)

In general formula (VI), $R^{51}$ is the same as defined above for $R^{51}$ in formula (V), and each of $R^{53}$ and $R^{54}$ independently represents a linear or branched alkyl group, or a hydrogen atom.

With respect to $R^{53}$ and $R^{54}$, the alkyl group preferably has 1 to 15 carbon atoms, may be either linear or branched, is preferably an ethyl group or a methyl group, and is most preferably a methyl group.

It is particularly desirable that either one of $R^{53}$ and $R^{54}$ be a hydrogen atom, and the other be a methyl group.

Acid Dissociable, Dissolution Inhibiting Group

In the structural unit (g7), the acid dissociable, dissolution inhibiting group is not particularly limited, and can be selected appropriately from the multitude of groups that have been proposed for the resins of resist compositions designed for use with KrF excimer lasers, ArF excimer lasers, and the like. Specific examples thereof include the acid dissociable, dissolution inhibiting groups (VII) shown below.

Examples of the acid dissociable, dissolution inhibiting groups (VII) include groups represented by general formula (VII-a) shown below and groups represented by general formula (VII-b) shown below.

[Chemical Formula 60]

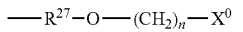
(VII-a)

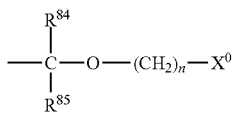
(VII-b)

In formula (VII-a), $R^{27}$ represents a linear or branched alkylene group; $X^0$ represents an aliphatic cyclic group, an aromatic cyclic hydrocarbon group or an alkyl group of 1 to 5 carbon atoms; and n represents an integer of 0 to 3. In formula (VII-b), $X^0$ represents an aliphatic cyclic group, an aromatic cyclic hydrocarbon group or an alkyl group of 1 to 5 carbon atoms; and $R^{84}$ represents a hydrogen atom or an alkyl group of 1 to 5 carbon atoms; or each of $X^0$ and $R^{84}$ may independently represent an alkylene group of 1 to 5 carbon atoms, and $X^0$ may be bonded to $R^{84}$; $R^{85}$ represents a hydrogen atom or an alkyl group of 1 to 5 carbon atoms; and n represents an integer of 0 to 3.

In general formula (VII-a) above, $R^{27}$ represents a linear or branched alkylene group.

The alkylene group preferably has 1 to 5 carbon atoms, more preferably 1 to 3 carbon atoms, and most preferably 1 or 2 carbon atoms.

In general formulas (VII-a) and (VII-b) above, n represents an integer of 0 to 3, preferably an integer of 0 to 2, more preferably 0 or 1, and most preferably 0.

In general formulas (VII-a) and (VII-b) above, each $X^0$ independently represents an aliphatic cyclic group, an aromatic cyclic hydrocarbon group or an alkyl group of 1 to 5 carbon atoms.

The aliphatic cyclic group for $X^0$ is a monovalent aliphatic cyclic group. The aliphatic cyclic group can be selected appropriately, for example, from the multitude of groups that have been proposed for conventional ArF resists. Specific examples of the aliphatic cyclic group include an aliphatic monocyclic group of 5 to 7 carbon atoms and an aliphatic polycyclic group of 10 to 16 carbon atoms.

The aliphatic cyclic group may or may not have a substituent. Examples of the substituent include an alkyl group of 1 to 5 carbon atoms, an alkoxy group of 1 to 5 carbon atoms, a fluorine atom, a fluorinated alkyl group of 1 to 5 carbon atoms, and an oxygen atom (=O).

The basic ring of the aliphatic cyclic group exclusive of substituents is not limited to be constituted from only carbon and hydrogen (not limited to hydrocarbon groups), and may include an oxygen atom or the like in the ring structure.

As the aliphatic monocyclic groups of 5 to 7 carbon atoms, groups in which one hydrogen atom has been removed from a monocycloalkane can be mentioned, and specific examples include groups in which one hydrogen atom has been removed from cyclopentane, cyclohexane or the like.

Examples of the aliphatic polycyclic group of 10 to 16 carbon atoms include groups in which one hydrogen atom has been removed from a bicycloalkane, tricycloalkane, tetracycloalkane or the like. Specific examples include groups in which one hydrogen atom has been removed from a polycycloalkane such as adamantane, norbornane, isobornane, tricyclodecane or tetracyclododecane. Of these, an adamantyl group, a norbornyl group and a tetracyclododecyl group is preferred industrially, and an adamantyl group is particularly desirable.

As the aromatic cyclic hydrocarbon group for $X^0$, aromatic polycyclic groups of 10 to 16 carbon atoms can be mentioned. Examples of such aromatic polycyclic groups include groups in which one hydrogen atom has been removed from naphthalene, anthracene, phenanthrene, pyrene or the like. Specific examples include a 1-naphthyl group, a 2-naphthyl group, a 1-anthryl group, a 2-anthryl group, a 1-phenanthryl group, a 2-phenanthryl group, a 3-phenanthryl group and a 1-pyrenyl group, and a 2-naphthyl group is particularly preferred industrially.

As the alkyl group of 1 to 5 carbon atoms for $X^0$, the same groups as those alkyl groups of 1 to 5 carbon atoms which may be bonded to the α-position of the aforementioned acrylate ester can be used, and a methyl group or an ethyl group is more preferable, and an ethyl group is most preferable.

In general formula (VII-b) above, as the alkyl group of 1 to 5 carbon atoms for $R^{84}$, the same groups as the above-mentioned alkyl groups of 1 to 5 carbon atoms for $X^0$ can be used.

From an industrial perspective, a methyl group or an ethyl group is preferable, and a methyl group is particularly desirable.

$R^{85}$ represents an alkyl group of 1 to 5 carbon atoms, or a hydrogen atom. As the alkyl group of 1 to 5 carbon atoms for $R^{85}$, the same alkyl groups of 1 to 5 carbon atoms as those described above for $R^{84}$ can be used. From an industrial perspective, $R^{85}$ is preferably a hydrogen atom.

It is particularly desirable that either one of $R^{84}$ and $R^{85}$ be a hydrogen atom, and the other be a methyl group.

Further, in general formula (VII-b) above, each of $X^0$ and $R^{84}$ may independently represent an alkylene group of 1 to 5 carbon atoms, and $X^0$ may be bonded to $R^{84}$.

In such a case, in general formula (VII-b) above, a cyclic group is formed by $R^{84}$, $X^0$, the oxygen atom having $X^0$ bonded thereto, and the carbon atom having the oxygen atom and $R^{84}$ bonded thereto.

Such a cyclic group is preferably a 4- to 7-membered ring, and more preferably a 4- to 6-membered ring. Specific examples of the cyclic group include a tetrahydropyranyl group and a tetrahydrofuranyl group.

In terms of achieving an excellent resist pattern profile or the like, as the acid dissociable, dissolution inhibiting group (VII), it is preferable that $R^{85}$ be a hydrogen atom, and also $R^{84}$ be a hydrogen atom or an alkyl group of 1 to 5 carbon atoms.

Specific examples of the acid dissociable, dissolution inhibiting group (VII) include groups in which $X^0$ represents an alkyl group of 1 to 5 carbon atoms, i.e., 1-alkoxyalkyl groups such as a 1-methoxyethyl group, a 1-ethoxyethyl group, a 1-isopropoxyethyl group, a 1-n-butoxyethyl group, a 1-tert-butoxyethyl group, a methoxymethyl group, an ethoxymethyl group, an isopropoxymethyl group, an n-butoxymethyl group and a tert-butoxymethyl group.

Further, examples of groups in which $X^0$ represents an aliphatic cyclic group include those represented by formulas (11) to (24) shown below.

[Chemical Formula 61]

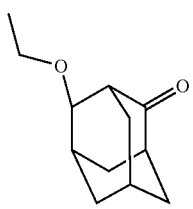
(11)

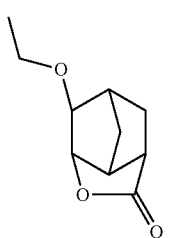
(12)

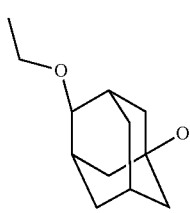
(13)

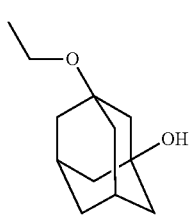
(14)

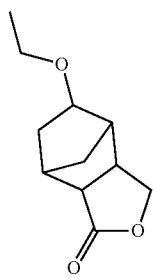
(15)

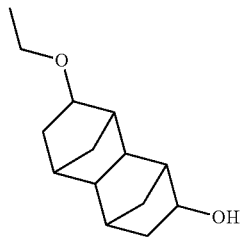
(16)

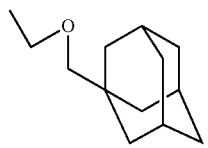
(17)

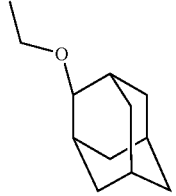
(18)

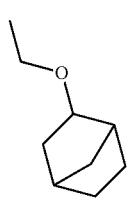
(19)

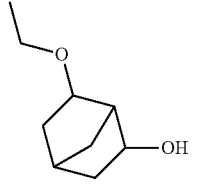
(20)

(21)

-continued

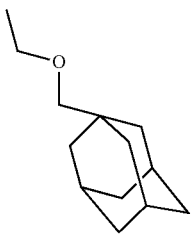
(22)

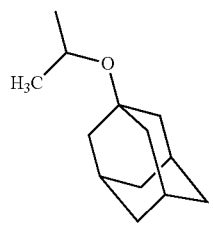
(23)

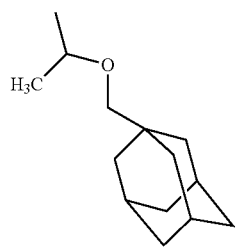
(24)

Organic Group Containing an Acid Dissociable, Dissolution Inhibiting Group

In the present description, an "organic group containing an acid dissociable, dissolution inhibiting group" refers to a group constituted of an acid dissociable, dissolution inhibiting group and a group or atom that is not dissociated by acid (i.e., a group or atom that is not dissociated by acid, and remains bonded to the component (G1) even after the acid dissociable, dissolution inhibiting group has been dissociated).

The organic group containing an acid dissociable, dissolution inhibiting group is not particularly limited, and can be selected appropriately from the multitude of groups that have been proposed for the resins of resist compositions designed for use with KrF excimer lasers, ArF excimer lasers, and the like. Specific examples include those described above as the "organic group containing an acid dissociable, dissolution inhibiting group", including an organic group containing an acid dissociable, dissolution inhibiting group (VII), such as an organic group (VIII) containing an acid dissociable, dissolution inhibiting group.

Example of the organic group (VIII) containing an acid dissociable, dissolution inhibiting group include groups represented by general formula (VIII) shown below.

In an organic group (VIII) having such a structure, when acid is generated from the component (A1) or from the component (B) described later upon exposure, the bond between the oxygen atom bonded to Q and the carbon atom having $R^{84}$ and $R^{85}$ bonded thereto is cleaved by the generated acid, and the —$C(R^{84})(R^{85})$—$OX^0$ group is dissociated.

[Chemical Formula 62]

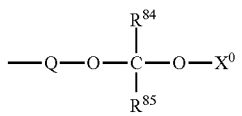
(VIII)

In formula (VIII), $X^0$ represents an aliphatic cyclic group, an aromatic cyclic hydrocarbon group or an alkyl group of 1 to 5 carbon atoms; and $R^{84}$ represents a hydrogen atom or an alkyl group of 1 to 5 carbon atoms; or each of $X^0$ and $R^{84}$ may independently represent an alkylene group of 1 to 5 carbon atoms, and $X^0$ may be bonded to $R^{84}$; $R^{85}$ represents an alkyl group of 1 to 5 carbon atoms or a hydrogen atom; and Q represents a divalent aliphatic cyclic group.

In general formula (VIII) above, $X^0$, $R^{84}$ and $R^{85}$ are the same as those defined above for $X^0$, $R^{84}$ and $R^{85}$ in general formula (VII-b), respectively.

Examples of the divalent aliphatic cyclic group for Q include groups in which one hydrogen atom has been removed from the aliphatic cyclic group for $X^0$ described above.

Among the examples shown above, the hydrogen atom in the hydroxyl group of the structural unit (g7) is preferably protected by being substituted with a tertiary alkyl group-containing group, and more preferably protected by being substituted with a group represented by general formula (II) or (p0) above.

Preferable examples of the structural unit (g7) include structural units represented by general formula (g7-1) shown below, structural units represented by general formula (g7-2) shown below, structural units represented by general formula (g7-3) shown below, structural units represented by general formula (g7-4) shown below, and structural units represented by general formula (g7-5) shown below.

[Chemical Formula 63]

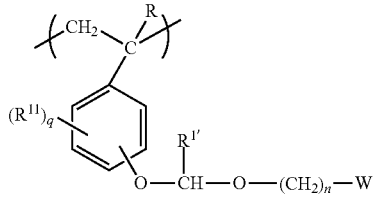
(g7-1)

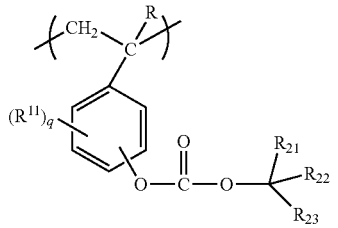
(g7-2)

-continued

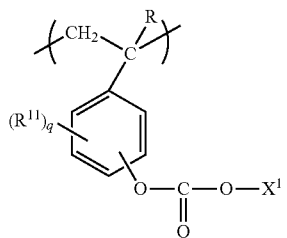 (g7-3)

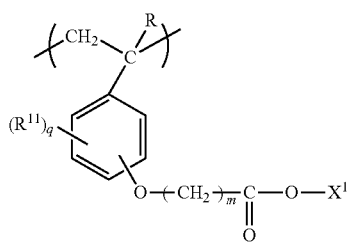 (g7-4)

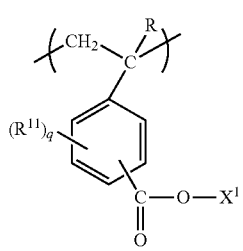 (g7-5)

In formulas (g7-1) to (g7-5), R represents a hydrogen atom, an alkyl group of 1 to 5 carbon atoms or a halogenated alkyl group of 1 to 5 carbon atoms; $R^{11}$ represents a halogen atom, an alkyl group of 1 to 5 carbon atoms or a halogenated alkyl group of 1 to 5 carbon atoms; q represents an integer of 0 to 4; $R^{1'}$ represents a hydrogen atom or an alkyl group of 1 to 5 carbon atoms; n represents an integer of 0 to 3; W represents an aliphatic cyclic group, an aromatic cyclic hydrocarbon group or an alkyl group of 1 to 5 carbon atoms; m is 1 to 3; each of $R^{21}$, $R^{22}$ and $R^{23}$ independently represents a linear or branched alkyl group; and $X^1$ represents an acid dissociable, dissolution inhibiting group.

In formulas (g7-1) to (g7-5) above, the bonding position of the groups "—O—$CHR^{1'}$—O—(CH2)n-W", "—O—C(O)—O—C($R^{21}$)($R^{22}$)($R^{23}$)", "—O—C(O)—O—$X^1$", "—O—(CH$_2$)$_m$—C(O)—O—$X^1$" and "—C(O)—O—$X^1$" at the phenyl group may be any one of the o-position, the m-position, or the p-position of the phenyl group, and the p-position is most desirable, as the effects of the present invention are improved.

$R^{21}$ to $R^{23}$ are preferably an alkyl group of 1 to 5 carbon atoms, more preferably an alkyl group of 1 to 3 carbon atoms, and specific examples thereof include the same alkyl groups of 1 to 5 carbon atoms as those described above for R.

Examples of $X^1$ include the same groups as those described above in relation to the tertiary alkyl ester group-containing group and alkoxyalkyl group.

m is preferably 1 or 2, and more preferably 1.

Of the various possibilities described above, as the structural unit (g7), structural units represented by the above-mentioned general formula (g7-1) or (g7-4) are particularly desirable.

Specific examples of preferred structures for the structural unit (g7) are shown below.

[Chemical Formula 64]

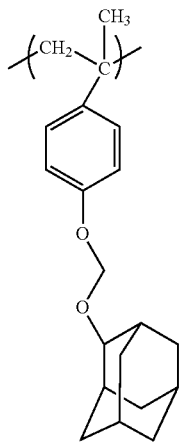 (g7-1-1)

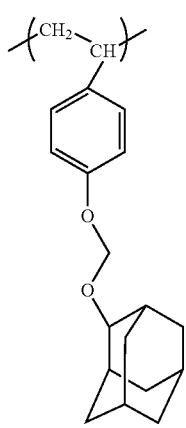 (g7-1-2)

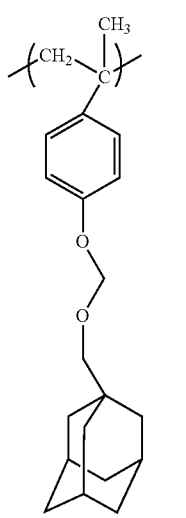 (g7-1-3)

-continued (g7-1-4) 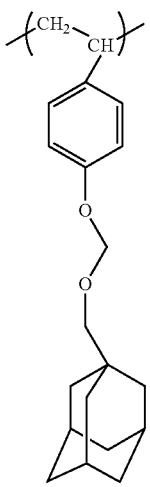

(g7-1-5) 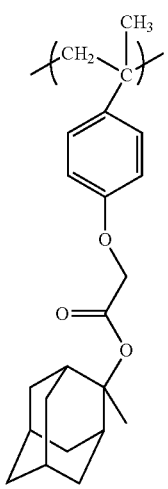

(g7-1-6) 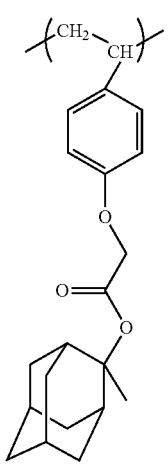

-continued (g7-1-7) 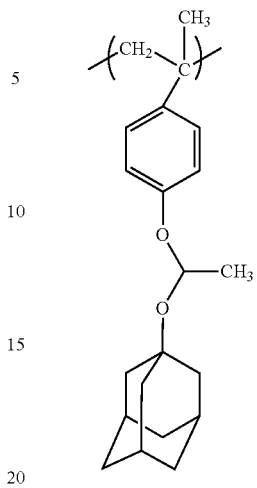

(g7-1-8) 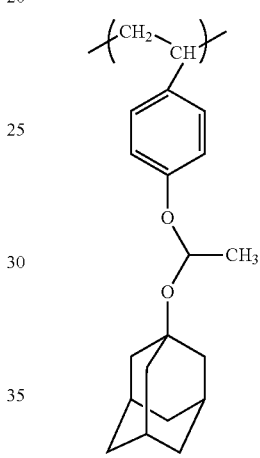

As the structural unit (g7), among the examples shown above, at least one structural unit selected from those represented by chemical formulas (g7-1-1) to (g7-1-8) is preferable, and at least one structural unit selected from those represented by chemical formulas (g7-1-1) to (g7-1-2) and (g7-1-5) to (g7-1-8) is most preferable, as the effects of the present invention are improved.

As the structural unit (g7), one type of structural unit may be used alone, or two or more types of structural units may be used in combination.

When the polymer chain Y contains the structural unit (g7), the amount of the structural unit (g7) based on the combined total of all structural units constituting the polymer chain Y is preferably 1 to 40 mol %, more preferably 5 to 40 mol %, and still more preferably 10 to 40 mol %. When the amount of the structural unit (g7) is at least as large as the lower limit of the above-mentioned range, the solubility of the polymer chain Y in an organic solvent is improved. On the other hand, when the amount of the structural unit (g7) is no more than the upper limit of the above-mentioned range, a good balance can be achieved with the other structural units.

Further, inclusion of the structural unit (g7) having a styrene skeleton in the component (G1) improves the sensitizing capacity of the component (G1).

(Structural Unit (g1))

Examples of the structural unit (g1) include the same structural units as those listed above for the structural unit (a1).

As the structural unit (g1), one type of structural unit may be used alone, or two or more types of structural units may be used in combination.

In those cases where the structural unit (g1) is included in the polymer chain Y, in the polymer chain Y, the amount of the structural unit (g1) based on the combined total of all structural units constituting the polymer chain Y is preferably 10 to 80 mol %, more preferably 20 to 70 mol %, and still more preferably 25 to 60 mol %. By making the amount of the structural unit (g1) at least as large as the lower limit of the above-mentioned range, a pattern can be easily formed using a resist composition prepared from the polymer chain Y. On the other hand, by making the amount of the structural unit (g1) no more than the upper limit of the above-mentioned range, a good balance can be achieved with the other structural units.

(Structural Unit (g2))

Examples of the structural unit (g2) include the same structural units as those listed above for the structural unit (a2).

As the structural unit (g2), one type of structural unit may be used alone, or two or more types of structural units may be used in combination.

In those cases where the structural unit (g2) is included in the polymer chain Y, the amount of the structural unit (g2) in the polymer chain Y, based on the combined total of all structural units constituting the polymer chain Y is preferably 1 to 65 mol %, more preferably 5 to 60 mol %, and still more preferably 10 to 55 mol %, as the resist film formed using a positive resist composition that includes this polymer chain Y exhibits improved adhesion to the substrate and excellent compatibility with the developing solution.

(Structural Unit (g3))

Examples of the structural unit (g3) include the same structural units as those listed above for the structural unit (a3).

As the structural unit (g3), one type of structural unit may be used alone, or two or more types of structural units may be used in combination.

In those cases where the structural unit (g3) is included in the polymer chain Y, the amount of the structural unit (g3) in the polymer chain Y based on the combined total of all structural units constituting the polymer chain Y is preferably 5 to 50 mol %, more preferably 5 to 40 mol %, and still more preferably 5 to 25 mol %.

(Other Structural Units)

The polymer chain Y may also include other structural units besides the above structural units (g1), (g2), (g3), (g5), (g6) and (g7), provided the inclusion of these other structural units does not impair the effects of the present invention.

There are no particular limitations on these other structural units, and any other structural unit which cannot be classified as one of the above structural units (g1), (g2), (g3), (g5), (g6) and (g7) can be used without any particular limitations. Any of the multitude of conventional structural units used within resist resins for ArF excimer lasers or KrF excimer lasers (and particularly for ArF excimer lasers) or the like can be used.

For example, a structural unit derived from an acrylate ester containing a non-acid dissociable, aliphatic polycyclic group (hereafter, referred to as "structural unit (g4)"), a structural unit derived from a vinyl naphthalene monomer (more preferably a vinyl naphthol-based structural unit) or the like is preferable. Examples of this polycyclic group include the same groups as those described above in connection with the aforementioned structural unit (a1), and any of the multitude of conventional polycyclic groups used within the resin component of resist compositions for ArF excimer lasers or KrF excimer lasers (and particularly for ArF excimer lasers) can be used.

In consideration of industrial availability and the like, at least one polycyclic group selected from amongst a tricyclodecyl group, adamantyl group, tetracyclododecyl group, isobornyl group, and norbornyl group is particularly desirable. These polycyclic groups may be substituted with a linear or branched alkyl group of 1 to 5 carbon atoms.

Examples of the structural unit (g4) include the same structural units as those listed above for the structural unit (a4).

In those cases where the structural unit (g4) is included in the polymer chain Y, the amount of the structural unit (g4) based on the combined total of all the structural units that constitute the polymer chain Y is preferably within a range from 1 to 30 mol %, and more preferably from 10 to 20 mol %.

In the present invention, the polymer chain Y preferably includes the structural units (g5) and (g7), and may further include the structural units (g1), (g2), (g3) and (g6).

Examples of such copolymers include a copolymer composed of the structural units (g5) and (g7); and a copolymer composed of the structural units (g5), (g6) and (g7).

As the polymer chain Y, polymer chains that include two types of structural units represented by general formula (g-11) shown below are particularly desirable.

[Chemical Formula 65]

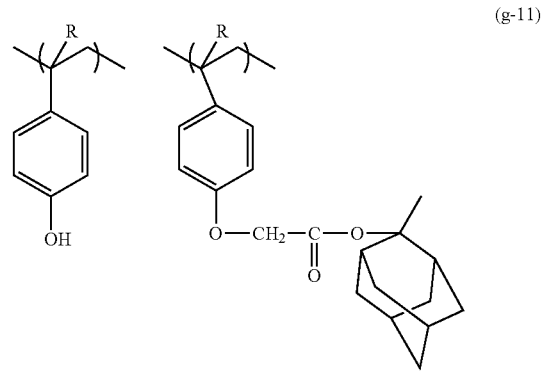

(g-11)

In the formula, R represents a hydrogen atom, an alkyl group of 1 to 5 carbon atoms or a halogenated alkyl group of 1 to 5 carbon atoms, and the plurality of R in the formula may be either the same or different from each other.

In general formula (g-11), R is the same as defined above for R in formula (a0-2).

The weight average molecular weight (Mw) (the polystyrene equivalent value determined by gel permeation chromatography) of the polymer chain Y in the arm portion of the component (G1) is not particularly limited, but is preferably 300 to 50,000, more preferably 500 to 10,000, and most preferably 500 to 8,000.

Further, the average number of structural units (i.e., the average number of monomers) constituting the arm portion is preferably from 2 to 50, and more preferably from 3 to 30. By ensuring that the weight average molecular weight and the average number of structural units are no more than the upper limits of the above-mentioned ranges, the polymer chain Y exhibits satisfactory solubility in a resist solvent when used as a resist. On the other hand, by ensuring that the weight average molecular weight and the average number of structural units are at least as large as the lower limits of the above-mentioned ranges, dry etching resistance and cross-sectional shape of the resist pattern becomes satisfactory.

Further, the dispersity (Mw/Mn) is preferably 1.0 to 5.0, more preferably 1.0 to 3.0, and most preferably 1.0 to 2.5. Here, Mn is the number average molecular weight.

[X: Divalent Linking Group]

In general formula (1), X represents a divalent linking group having an acid dissociable group.

As the acid dissociable group for X, a group in which one or more hydrogen atoms have been removed from a tertiary alkyl group-containing group or a group in which one or more hydrogen atoms have been removed from an alkoxyalkyl group can be used.

Examples of the group in which one or more hydrogen atoms have been removed from a tertiary alkyl group-containing group include a group in which one or more hydrogen atoms have been removed from the tertiary alkyl group-containing group described above for (g7); and a group in which one or more hydrogen atoms have been removed from the tertiary alkyl ester-type acid dissociable, dissolution inhibiting group described above for (a1).

More specifically, a group in which one or more hydrogen atoms have been removed from the alkyl group for $R^{21}$ to $R^{23}$ in the formula (III) above;

a group in which one or more hydrogen atoms have been removed from the aliphatic cyclic group for $R^C$ in the formula (p0) or (p0-1) above;

a group in which one or more hydrogen atoms have been removed from adamantane in the formula (p0-1-1) above;

a group in which one or more hydrogen atoms have been removed from the aliphatic cyclic group in the formulas (1-1) to (1-9) and (2-1) to (2-6) above; or the like can be used.

Examples of the group in which one or more hydrogen atoms have been removed from an alkoxyalkyl group include a group in which one or more hydrogen atoms have been removed from the alkoxyalkyl group described above for (g7); and a group in which one or more hydrogen atoms have been removed from the acetal-type acid dissociable, dissolution inhibiting group described above for (a1).

More specifically, a group in which one or more hydrogen atoms have been removed from $X^0$ in the formula (VII-a) above;

a group in which one or more hydrogen atoms have been removed from $X^0$ in the formula (VII-b) above; and a group in which one or more hydrogen atoms have been removed from the aliphatic cyclic group in the formulas (p3-3) to (p3-12) above; or the like can be used.

Further, as the divalent linking group having an acid dissociable group for X in the arm portion of the component (G1), an acid dissociable group as mentioned above, and the same divalent linking group as the aforementioned divalent linking group of the linkage portion connecting the plurality of core portions may be used in combination.

Further, the dispersity (Mw/Mn) of the component (G1) is preferably from 1.01 to 5.00, and more preferably from 1.01 to 2.00. By ensuring that the dispersity is no more than the upper limit of the above-mentioned range, the component (G1) exhibits satisfactory solubility in a resist solvent when used for a resist.

The Mn of the component (G1) is preferably from 1,000 to 1,000,000, more preferably from 1,500 to 500,000, still more preferably from 1,500 to 50,000, and most preferably from 2,000 to 20,000. When the Mn of the component (G1) is within the above-mentioned range, the effects of the present invention are improved.

In the component (G), as the component (G1), one type of component may be used alone, or two or more types may be used in combination.

In those cases where the component (G) includes the component (G1), the amount of the component (G1) within the component (G) based on the total weight of the component (G) is preferably 10% by weight or more, more preferably 15% by weight or more, still more preferably 20% by weight or more, and may be even 100% by weight. When the amount of the component (G1) is 10% by weight or more, the effects of the present invention such as the lithography properties are improved.

[Component (G2)]

<<Core Portion>>

In the component (G2) of the present invention, the core portion is constituted of a polymer having a molecular weight within a range from 500 to 20,000 (hereafter, referred to as a "core polymer P").

The component (G2) is constituted of the core polymer P to which at least one —(X)—Y moiety represented by general formula (1) above is introduced. In other words, the core polymer P can be obtained by removing the —(X)—Y moieties represented by the above general formula (1) from the component (G2).

There are no particular limitations on the core polymer P, and any of the known polymers typically used as a base component for a chemically amplified resist can be used.

The core polymer P preferably includes a structural unit (gp1) represented by general formula (gp1) shown below.

[Chemical Formula 66]

In the formula, R represents a hydrogen atom, an alkyl group of 1 to 5 carbon atoms or a halogenated alkyl group of 1 to 5 carbon atoms; $R^0$ represents a divalent linking group; and $Z^0$ represents —OH, —COOH, or a linking arm in the formula (1) above.

(Structural Unit (gp1))

In formula (gp1), R is the same as defined above, and is preferably a hydrogen atom or a methyl group.

In formula (gp1), $R^0$ represents a divalent linking group, and examples thereof include the same linking groups as those described for the aforementioned divalent linking group of the linkage portion connecting the plurality of core portions.

In the present invention, as the divalent linking group for $R^0$, a divalent aromatic group or a divalent linking group containing a hetero atom is preferable, a divalent aromatic group, a combination of a divalent aromatic group and —C(=O)—O—, or —C(=O)— is more preferable, and a divalent aromatic group (for example, an aromatic hydrocarbon group in which one hydrogen atom has been removed from a phenyl group, or an aromatic hydrocarbon group in which one hydrogen atom has been removed from a naphthyl group) is most preferable.

In formula (gp1) above, $Z^0$ represents —OH, —COOH, or a linking arm in the formula (1) above, and is preferably —OH or a linking arm in the formula (1) above.

As the structural unit (gp1), one type of structural unit may be used alone, or two or more types of structural units may be used in combination.

In the core polymer P, the amount of structural unit (gp1) based on the combined total of all structural units constituting the core polymer P is preferably 5 to 100 mol %.

In those cases where $Z^0$ of the structural unit (gp1) in the core polymer P represents a linking arm in the formula (1) above, the amount of structural unit (gp1) in the core polymer P is preferably 5 mol % or more, more preferably 10 mol % or more, still more preferably 25 mol % or more, and may be even 100 mol %.

The core polymer P may also include other structural units besides the above-mentioned structural unit (gp1), provided the inclusion of these other structural units does not impair the effects of the present invention.

Examples of such other structural units include the aforementioned structural units (g1) to (g4), (g6), (g7) (excluding those that correspond to the structural unit (gp1)).

In the component (G2) of the present invention, the core polymer P is preferably a polymer that includes the structural unit (gp1), more preferably a polymer that includes a structural unit represented by general formula (P1) or (P2) shown below, and most preferably a polymer that includes a structural unit represented by general formula (P11) or (P21) shown below.

[Chemical Formula 67]

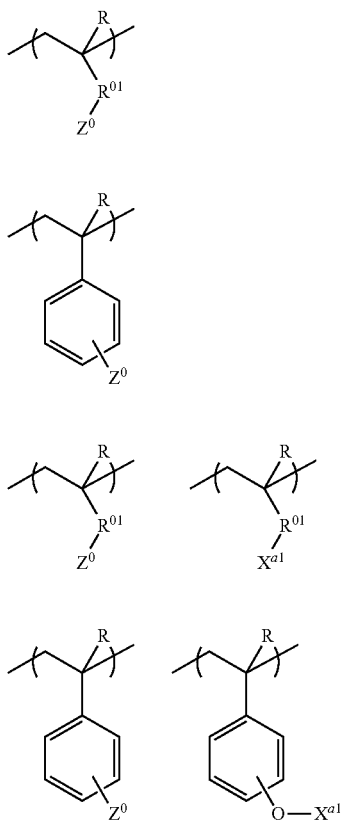

In the formulas, R represents a hydrogen atom, an alkyl group of 1 to 5 carbon atoms or a halogenated alkyl group of 1 to 5 carbon atoms; $Z^0$ represents —OH, —COOH, or a linking arm in the formula (1) above; $R^{01}$ represents a divalent aromatic group; and $X^{a1}$ represents the same acid dissociable, dissolution inhibiting groups as those described in the aforementioned structural unit (a1).

In formulas (P1) and (P2), the divalent aromatic group for $R^{01}$ is the same as the aromatic groups defined above for $R^0$ in general formula (gp1), and an aromatic hydrocarbon group in which one hydrogen atom has been removed from a phenyl group, or an aromatic hydrocarbon group in which one hydrogen atom has been removed from a naphthyl group is particularly desirable.

In formulas (P2) and (P21), preferable examples of $X^{a1}$ include those represented by the aforementioned formulas (p0), (p0-1), (p1), (p1-1) and (p2).

The weight average molecular weight (Mw) (the polystyrene equivalent value determined by gel permeation chromatography (GPC)) of the core polymer P is within a range from 500 to 20,000, preferably from 500 to 10,000, and more preferably from 500 to 4,000. When the weight average molecular weight is no more than the upper limit of the above-mentioned range, the core polymer P exhibits a satisfactory solubility in a resist solvent when used for a resist. On the other hand, when the weight average molecular weight is at least as large as the lower limit of the above-mentioned range, dry etching resistance and the cross-sectional shape of the resist pattern can be improved.

Further, the dispersity (Mw/Mn) of the core polymer P is not particularly limited, but is preferably from 1.0 to 5.0, and more preferably from 1.0 to 3.5. Here, Mn is the number average molecular weight.

<<Arm Portion>>

In the component (G2) of the present invention, the arm portion is bonded to the core portion and is also represented by general formula (1) above.

As the divalent linking group having an acid dissociable group for X in the arm portion of the component (G2), the same groups as those described above for X in the arm portion of the component (G1) can be used. Among these, it is particularly desirable that X include a group in which one or more hydrogen atoms have been removed from an alkoxyalkyl group.

As the polymer chain Y in the arm portion of the component (G2), the same polymer chains as those described above for the polymer chain Y in the arm portion of the component (G1) can be used. In a plurality of arm portions in the component (G2), the polymer chains Y may be the same with each other or may be different from each other, and preferably be the same with each other, as the effects of the present invention are particularly improved.

The weight average molecular weight (Mw) (the polystyrene equivalent value determined by gel permeation chromatography (GPC)) of the polymer chain Y in the arm portion of the component (G2) is preferably from 100 to 5,000, more preferably from 200 to 4,000, and still more preferably from 300 to 3,000. When the weight average molecular weight is no more than the upper limit of the above-mentioned range, the polymer chain Y exhibits a satisfactory solubility in a resist solvent when used for a resist. On the other hand, when the weight average molecular weight is at least as large as the lower limit of the above-mentioned range, dry etching resistance and the cross-sectional shape of the resist pattern can be improved.

Further, the dispersity (Mw/Mn) of the polymer chain Y is not particularly limited, but is preferably from 1.0 to 5.0, and more preferably from 1.0 to 3.5. Here, Mn is the number average molecular weight.

In the present invention, as the polymeric compound (G2), polymeric compounds represented by general formula (G2-1) shown below are preferred.

[Chemical Formula 68]

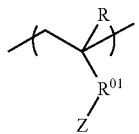

(G2-1)

In the formula, R represents a hydrogen atom, an alkyl group of 1 to 5 carbon atoms or a halogenated alkyl group of 1 to 5 carbon atoms; $R^{01}$ represents a divalent aromatic group; Z represents —OH, —COOH, a group represented by the formula (1) above, or a group in which the hydrogen atom in —OH or —COOH has been replaced with an acid dissociable, dissolution inhibiting group (excluding the group represented by the formula (1) above); with the proviso that in a plurality of arm portions within the polymeric compound (G2), R and Z may be the same with each other or may be different from each other, and one or more Z is a group represented by the formula (1) above.

In a plurality of arm portions within the polymeric compound (G2), in those cases where each Z represents a different group and both of —OH and —COOH groups are included, part or all of the hydrogen atoms of only one of these groups may be replaced with an acid dissociable, dissolution inhibiting group, or part or all of the hydrogen atoms of both of these groups may be replaced with an acid dissociable, dissolution inhibiting group.

More specifically, as the polymeric compound represented by general formula (G2-1) above, polymeric compounds having a structural unit represented by general formulas (G2-11) and (G2-12) shown below are preferred.

[Chemical Formula 69]

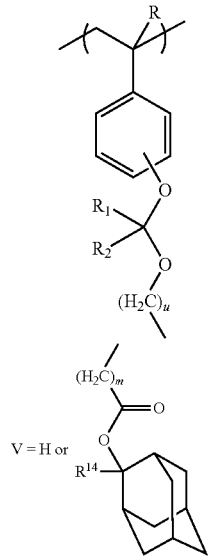

(G2-11)

In the formula, R represents a hydrogen atom, an alkyl group of 1 to 5 carbon atoms or a halogenated alkyl group of 1 to 5 carbon atoms; each of $R^1$ and $R^2$ independently represents a linear or branched alkyl group or a hydrogen atom; m represents an integer of 1 to 3; $R^{14}$ represents an alkyl group; u represents an integer of 0 to 10; V is as shown in the formula; and the plurality of R in the formula may be either the same or different from each other.

[Chemical Formula 70]

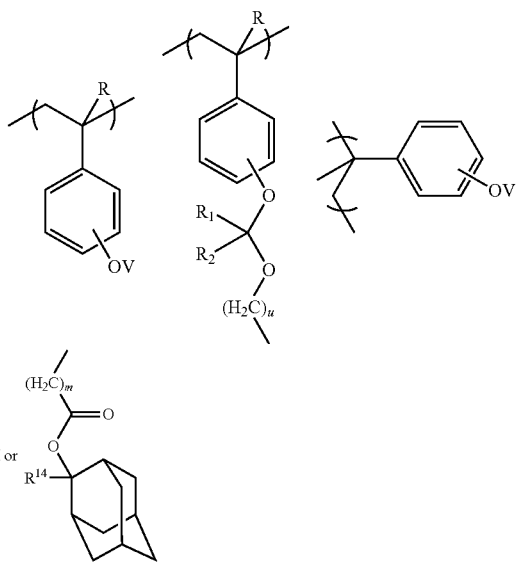

(G2-12)

In the formula, R represents a hydrogen atom, an alkyl group of 1 to 5 carbon atoms or a halogenated alkyl group of 1 to 5 carbon atoms; each of $R^1$ and $R^2$ independently represents a linear or branched alkyl group or a hydrogen atom; m represents an integer of 1 to 3; $R^{14}$ represents an alkyl group; u represents an integer of 0 to 10; V is as shown in the formula; and the plurality of R in the formula may be either the same or different from each other.

In formulas (G2-11) and (G2-12), R is the same as defined above for R in formula (a0-2).

Examples of $R^1$ and $R^2$ include the same groups as those listed above for $R^{53}$ and $R^{54}$ in formula (VI), respectively.

$R^{14}$ is the same as defined above for $R^{14}$ in the structural unit (a1).

u represents an integer of 0 to 10, preferably an integer of 0 to 5, and more preferably an integer of 0 to 2.

The component (G2) may have an acid dissociable, dissolution inhibiting group in the core portion, or may have an acid dissociable, dissolution inhibiting group within the polymer chain Y in the arm portion. It is preferable that the component (G2) either have an acid dissociable, dissolution inhibiting group within the polymer chain Y in the arm portion, or have an acid dissociable, dissolution inhibiting group in both the core portion and the polymer chain Y in the arm portion. In the component (G2), the amount of the structural unit having an acid dissociable, dissolution inhibiting group based on the combined total of all structural units constituting the component (G2) is preferably 5 to 50 mol %, more preferably 10 to 40 mol %, still more preferably 12 to 40 mol %, and most preferably 14 to 35 mol %. By ensuring that the amount of the above-mentioned structural unit is at least as large as the lower limit of the above-mentioned range, a pattern can be easily formed using a positive resist composition prepared from the component (G2). On the other hand, by ensuring that the amount of the structural unit is no more than the upper limit of the above-mentioned range, a good balance can be achieved with the other structural units.

The component (G2) may have an OH-containing group in the core portion, or may have an OH-containing group within the polymer chain Y in the arm portion. It is preferable that the component (G2) either have an OH-containing group within the polymer chain Y in the arm portion, or have an OH-containing group in both the core portion and the polymer chain Y in the arm portion. In the component (G2), the amount of the structural unit having an OH-containing group (i.e., the structural unit (gp1) in which $Z^0$ represents either —OH or —COOH; the structural unit (g3) in which a polar group represents —OH; and the structural unit (g5)) based on the combined total of all structural units constituting the component (G2) is preferably 50 to 90 mol %, more preferably 55 to 90 mol %, and still more preferably 60 to 88 mol %. By making the amount of the structural unit having an OH-containing group at least as large as the lower limit of the above-mentioned range, an adequate level of alkali solubility can be achieved. On the other hand, when the amount of the structural unit having an OH-containing group is no more than the upper limit of the above-mentioned range, a good balance can be achieved with the other structural units.

The weight average molecular weight (Mw) (the polystyrene equivalent value determined by gel permeation chromatography) of the component (G2) is not particularly limited, but is preferably within a range from 1,000 to 50,000, more preferably from 1,500 to 30,000, and most preferably from 2,500 to 20,000. When the weight average molecular weight is no more than the upper limit of the above-mentioned range, the component (G2) exhibits a satisfactory solubility in a resist solvent when used for a resist. On the other hand, when the weight average molecular weight is at least as large as the lower limit of the above-mentioned range, dry etching resistance and the cross-sectional shape of the resist pattern can be improved.

Further, the dispersity (Mw/Mn) of the component (G2) is not particularly limited, but is preferably within a range from 1.0 to 5.0, more preferably from 1.0 to 3.0, and most preferably from 1.0 to 2.5.

Here, Mn is the number average molecular weight.

In the component (G), as the component (G2), one type of component may be used alone, or two or more types may be used in combination.

In those cases where the component (G) includes the component (G2), the amount of the component (G2) within the component (G) based on the total weight of the component (G) is preferably 25% by weight or more, more preferably 50% by weight or more, still more preferably 75% by weight or more, and may be even 100% by weight. When the amount of the component (G2) is 25% by weight or more, the effects of the present invention such as the lithography properties are improved.

(Method of Producing Component (G2))

There are no particular limitations on the method of producing the component (G2), and examples thereof include the following method.

By using a polymer (hereafter, referred to as "polymer (P0)") which serves as a coupling agent for anionic polymerization as a material for providing the core polymer described above, the polymer (P0) is reacted with a polymer (hereafter, referred to as "polymer (Y0)") for providing arm portions to synthesize a polymer (G2'). Subsequently, all or some of the protecting groups which protect phenolic hydroxy groups or the like in the polymer (G2') are eliminated and, preferably, an acid dissociable, dissolution inhibiting group or the like is introduced to produce the component (G2).

Such a method is preferred since it is easy to control each reaction and to control the structure of the component (G2).

More specifically, as the polymer (P0), a polymer that includes a structural unit represented by general formula (P00) shown below is preferable since the polymer exhibits an excellent reactivity with the polymer (Y0), which makes it easy to produce the component (G2).

[Chemical Formula 71]

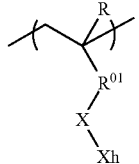

(P00)

In formula (P00), R represents a hydrogen atom, an alkyl group of 1 to 5 carbon atoms or a halogenated alkyl group of 1 to 5 carbon atoms; $R^{01}$ represents a divalent aromatic group; X represents a divalent linking group having an acid dissociable group; and Xh represents a halogen atom or an epoxy group represented by general formula (6) shown below.

[Chemical Formula 72]

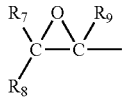

(6)

In formula (6), each of $R^7$, $R^8$ and $R^9$ independently represents a hydrogen atom or an alkyl group of 1 to 12 carbon atoms.

Xh represents a halogen atom or an epoxy group represented by the general formula (6) above. Examples of the halogen atom include a chlorine atom, a bromine atom and an iodine atom. Of these, a chlorine atom or a bromine atom is preferable, and a bromine atom is particularly desirable.

In general formula (6) above, it is preferable that each of $R^7$, $R^8$ and $R^9$ independently represent a hydrogen atom or an alkyl group of 1 to 5 carbon atoms.

A method of producing a polymer that includes a structural unit represented by the above general formula (P00) is not particularly limited and, for example, the polymer can be produced by reacting polyhydroxystyrene with a chloromethyl halogen-substituted alkylether. Thereafter, if necessary, Cl atoms may be replaced with Br atoms, or an ethoxyethyl group may be introduced to unsubstituted hydroxystyrene.

Preferable examples of the polymers that include a structural unit represented by general formula (P00) include polymers represented by formulas (P0-1) to (P0-3) shown below.

[Chemical Formula 73]

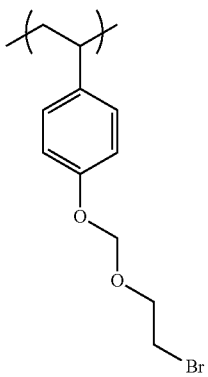

(P0-1)

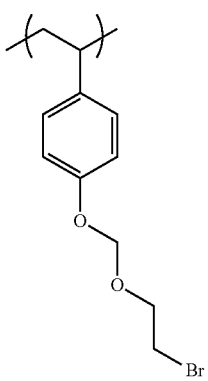

(P0-2)

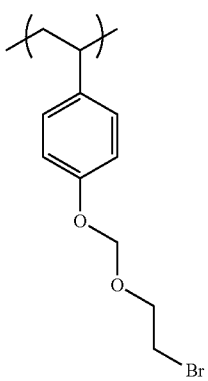

(P0-3)

Next, as the polymer (Y0), there are no particular limitations. However, for example, a polymer obtained by an anionic polymerization reaction of a monomer (hydroxystyrene derivative compound) that provides the structural unit (g5) and, if desired, an anionically polymerizable monomer that provides other structural units in the presence of an anionic polymerization initiator is preferred.

Examples of the anionic polymerization initiator include an alkali metal atom or an organic alkali metal compound.

Examples of the alkali metal atom include lithium, sodium, potassium and cesium atoms.

As the organic alkali metal compound, alkylated, allylated and arylated compounds of the above alkali metal atoms can be used. Specific examples thereof include ethyl lithium, n-butyl lithium, s-butyl lithium, t-butyl lithium, ethyl sodium, lithium biphenyl, lithium naphthalene, lithium triphenyl, sodium naphthalene, α-methylstyrene sodium dianion, 1,1-diphenylhexyl lithium and 1,1-diphenyl-3-methylpentyl lithium.

An anionic polymerization method of synthesizing the polymer (Y0) that provides arm portions can be conducted either by a method of dropwise adding an anionic polymerization initiator to a monomer solution or a monomer mixture solution, or by a method of dropwise adding a monomer solution or a monomer mixture solution to a solution containing an anionic polymerization initiator. Of these methods, a method of dropwise adding a monomer solution or a monomer mixture solution to a solution containing an anionic polymerization initiator is preferable, as it is easy to control the molecular weight and molecular weight distribution.

The anionic polymerization method of synthesizing the polymer (Y0) is preferably conducted under an atmosphere of inert gas such as nitrogen or argon in an organic solvent at a temperature of −100 to 50° C., and more preferably at a temperature of −100 to 40° C.

Examples of the organic solvent used in the anionic polymerization method of synthesizing the polymer (Y0) include organic solvents typically used in an anionic polymerization method, for example, aliphatic hydrocarbons such as n-hexane and n-heptane; alicyclic hydrocarbons such as cyclohexane and cyclopentane; aromatic hydrocarbons such as benzene and toluene; ethers such as diethylether, tetrahydrofuran (THF) and dioxane; as well as anisole, hexamethylphosphoramide and the like. Of these, toluene, n-hexane and THF are preferable.

These organic solvents can be used individually, or as a mixed solvent of two or more types of solvents.

When the polymer (Y0) that provides the arm portions is a copolymer, the polymer can be in any polymer form such as a random copolymer, a partial block copolymer or a complete block copolymer. These polymers can be appropriately synthesized by selecting the method of adding a monomer used for the polymerization.

The reaction of linking the polymer (Y0) with the polymer (P0) to synthesize the polymer (G2') can be conducted by adding the polymer (P0) in the polymerization reaction solution after completion of the anionic polymerization reaction of synthesizing the polymer (Y0).

Such a reaction is preferably conducted under an atmosphere of inert gas such as nitrogen or argon in an organic solvent at a temperature of −100 to 50° C., and more preferably at a temperature of −80 to 40° C. As a result, the structure of the polymer (G2') can be controlled and also a polymer having a narrow molecular weight distribution can be obtained.

Further, the synthesis reaction of the polymer (G2') can be continuously conducted in an organic solvent used in the anionic polymerization reaction of synthesizing the polymer (Y0) that provides the arm portions, and also can be conducted after changing the composition by newly adding a solvent, or replacing the solvent with another solvent. The solvent, which can be used herein, may be the same organic solvent as that used in the anionic polymerization reaction of synthesizing the polymer (Y0) that provides the arm portions.

The reaction of removing the protecting groups that protect the phenolic hydroxy groups or the like from the polymer (G2') obtained in this manner is preferably conducted in the presence of a single solvent or a mixed solvent of two or more solvents selected amongst the solvents mentioned above in the polymerization reaction, as well as alcohols such as methanol and ethanol; ketones such as acetone, methyl ethyl ketone and methyl isobutyl ketone (MIBK); polyhydric alcohol derivatives such as methyl cellosolve and ethyl cellosolve; and water, at a temperature within a range from room temperature to 150° C. using an acidic reagent as a catalyst, such as hydrochloric acid, sulfuric acid, oxalic acid, hydrogen chloride gas, hydrobromic acid, p-toluenesulfonic acid, 1,1,1-trifluoroacetic acid, and bisulfates represented by LiHSO$_4$, NaHSO$_4$ or KHSO$_4$. All or some of the protecting groups that protect the phenolic hydroxy groups or the like can be removed by appropriately combining the types and concentrations of solvents, the types and added amounts of catalysts, and the reaction temperatures and reaction times in this reaction.

When the arm portions of the polymer (G2') include a structural unit derived from an acrylate ester, ester groups of this structural unit can be converted into carboxy groups by hydrolysis.

The hydrolysis can be conducted by a method known in the relevant technical field, and, for example, can be conducted by acid hydrolysis under the same conditions as those mentioned above for removing the protecting groups. The hydrolysis of the ester groups is preferably conducted simultaneously with the removal of the protecting groups of phenolic hydroxyl groups. The polymer (G2') obtained in this manner which includes a structural unit derived from an acrylate ester in the arm portion is particularly desirable as a resist material since it exhibits a high level of alkali solubility.

Furthermore, after removing the protecting groups that protect the phenolic hydroxy groups from the polymer (G2'), protecting groups such as the acid dissociable, dissolution inhibiting groups mentioned above in connection with the explanation of the structural unit (a1) may be newly introduced.

These protecting groups can be introduced by a known method (for example, a method of reacting a protecting group precursor compound having a halogen atom in the presence of a basic catalyst).

The polymer (G2') obtained by the above production method can be used without being purified, or may be used after purification, if necessary.

The purification can be conducted by a method typically used in the relevant technical field, and can be conducted, for example, by a fractional reprecipitation method. In the fractional reprecipitation method, reprecipitation is preferably conducted using a mixed solvent of a solvent exhibiting a high level of polymer solubility and a solvent exhibiting a low level of polymer solubility. For example, purification can be conducted by a method of dissolving the polymer (G2') with heating in a mixed solvent, followed by cooling, or by a method of dissolving the polymer (G2') in a solvent exhibiting a high level of polymer solubility, followed by the addition of a solvent exhibiting a low level of polymer solubility thereto to precipitate the polymer (G2').

The content of the component (G) in the positive resist composition of the present invention based on the total solid content is preferably 1 to 50% by weight, and more preferably 5 to 30% by weight. When the content of the component (G) is within the above-mentioned range, the effects of the present invention are improved.

Further, when the component (A1) is used as the component (A), the amount of the component (G) based on the combined total of the component (A) and component (G) is preferably 1 to 30% by weight, and more preferably 5 to 25% by weight. In those cases where the component (A1) and the component (G) are combined, the amount of the component (G) is preferably within the above-mentioned range since a good balance between the acid generated from the component (A1) upon exposure and the sensitizing capacity due to the component (G) can be achieved. Furthermore, in those cases where the component (B) is not added to this combination of the component (A1) and the component (G), the amount of the component (G) within the above-mentioned range is particularly desirable since improvements in the uniformity for the acid dissociation reaction within the film can also be expected, thereby improving various lithography properties.

<Component (B)>

When the resist composition of the present invention includes the component (A1) that generates acid upon exposure as the component (A), the resist composition may or may not include the component (B). Further, when the resist composition of the present invention does not include the component (A1) that generates acid upon exposure as the component (A), the resist composition needs to include the component (B).

As the component (B), there is no particular limitation, and any of the known acid generators used in conventional chemically amplified resist compositions can be used. Examples of these acid generators are numerous, and include onium salt-based acid generators such as iodonium salts and sulfonium salts; oxime sulfonate-based acid generators; diazomethane-based acid generators such as bisalkyl or bisaryl sulfonyl diazomethanes and poly(bis-sulfonyl)diazomethanes; nitrobenzylsulfonate-based acid generators; iminosulfonate-based acid generators; and disulfone-based acid generators.

As an onium salt-based acid generator, for example, a compound represented by general formula (b-1) or (b-2) shown below can be used.

[Chemical Formula 74]

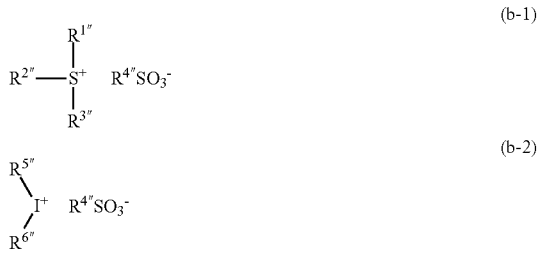

In the formulas above, $R^{1''}$ to $R^{3''}$, $R^{5''}$ and $R^{6''}$ each independently represents an aryl group or alkyl group, wherein two of $R^{1''}$ to $R^{3''}$ in formula (b-1) may be bonded to each other to form a ring with the sulfur atom in the formula; and $R^{4''}$ represents an alkyl group, a halogenated alkyl group, an aryl group or an alkenyl group which may have a substituent, with the proviso that at least one of $R^{1''}$ to $R^{3''}$ represents an aryl group, and at least one of $R^{5''}$ and $R^{6''}$ represents an aryl group.

In formula (b-1), $R^{1'''}$ to $R^{3'''}$ each independently represents an aryl group or an alkyl group. In formula (b-1), two of $R^{1'''}$ to $R^{3'''}$ may be bonded to each other to form a ring with the sulfur atom in the formula.

Further, among $R^{1'''}$ to $R^{3'''}$, at least one group represents an aryl group. Among $R^{1'''}$ to $R^{3'''}$, two or more groups are preferably aryl groups, and it is particularly desirable that all of $R^{1'''}$ to $R^{3'''}$ are aryl groups.

The aryl group for $R^{1'''}$ to $R^{3'''}$ is not particularly limited. For example, an aryl group having 6 to 20 carbon atoms may be used in which part or all of the hydrogen atoms of the aryl group may or may not be substituted with alkyl groups, alkoxy groups, halogen atoms or hydroxyl groups.

The aryl group is preferably an aryl group having 6 to 10 carbon atoms because it can be synthesized at a low cost. Specific examples thereof include a phenyl group and a naphthyl group.

The alkyl group with which hydrogen atoms of the aryl group may be substituted is preferably an alkyl group having 1 to 5 carbon atoms, and most preferably a methyl group, an ethyl group, a propyl group, an n-butyl group, or a tert-butyl group.

The alkoxy group with which hydrogen atoms of the aryl group may be substituted is preferably an alkoxy group having 1 to 5 carbon atoms, more preferably a methoxy group, an ethoxy group, an n-propoxy group, an iso-propoxy group, an n-butoxy group or a tert-butoxy group, and most preferably a methoxy group or an ethoxy group.

The halogen atom with which hydrogen atoms of the aryl group may be substituted is preferably a fluorine atom.

The alkyl group for $R^{1''}$ to $R^{3''}$ is not particularly limited and includes, for example, a linear, branched or cyclic alkyl group having 1 to 10 carbon atoms. In terms of achieving excellent resolution, the alkyl group preferably has 1 to 5 carbon atoms. Specific examples thereof include a methyl group, an ethyl group, an n-propyl group, an isopropyl group, an n-butyl group, an isobutyl group, an n-pentyl group, a cyclopentyl group, a hexyl group, a cyclohexyl group, a nonyl group, and a decyl group, and a methyl group is most preferable because it is excellent in resolution and can be synthesized at a low cost.

When two of $R^{1''}$ to $R^{3''}$ in formula (b-1) are bonded to each other to form a ring with the sulfur atom in the formula, it is preferable that the two of $R^{1''}$ to $R^{3''}$ form a 3 to 10-membered ring including the sulfur atom, and it is particularly desirable that the two of $R^{1''}$ to $R^{3''}$ form a 5 to 7-membered ring including the sulfur atom.

When two of $R^{1''}$ to $R^{3''}$ in formula (b-1) are bonded to each other to form a ring with the sulfur atom in the formula, the remaining one of $R^{1''}$ to $R^{3''}$ is preferably an aryl group. As examples of the aryl group, the same as the above-mentioned aryl groups for $R^{1''}$ to $R^{3''}$ can be given.

Preferred examples of the cation moiety for the compound represented by formula (b-1) include cation moieties represented by formulas (I-1-1) to (I-1-10) shown below. Among these, cation moieties having a triphenylmethane skeleton, such as those represented by any one of formulas (I-1-1) to (I-1-8) shown below are particularly desirable.

In formulas (I-1-9) and (I-1-10) shown below, each of $R^9$ and $R^{10}$ independently represents a phenyl group or naphthyl group which may have a substituent, an alkyl group of 1 to 5 carbon atoms, an alkoxy group of 1 to 5 carbon atoms or a hydroxyl group.

u represents an integer of 1 to 3, and is most preferably 1 or 2.

[Chemical Formula 75]

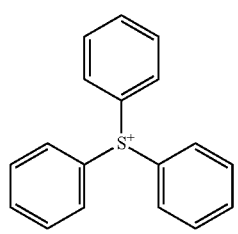
(I-1-1)

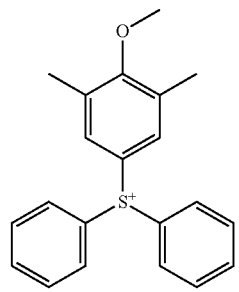
(I-1-2)

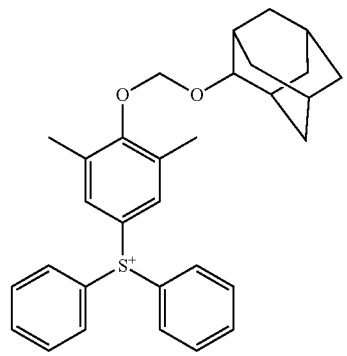
(I-1-3)

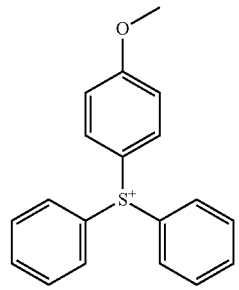
(I-1-4)

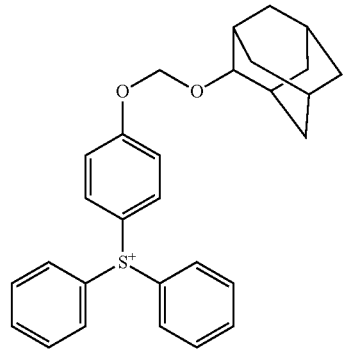
(I-1-5)

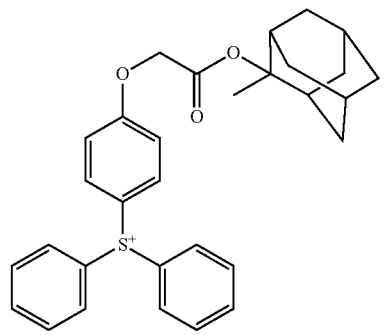
(I-1-6)

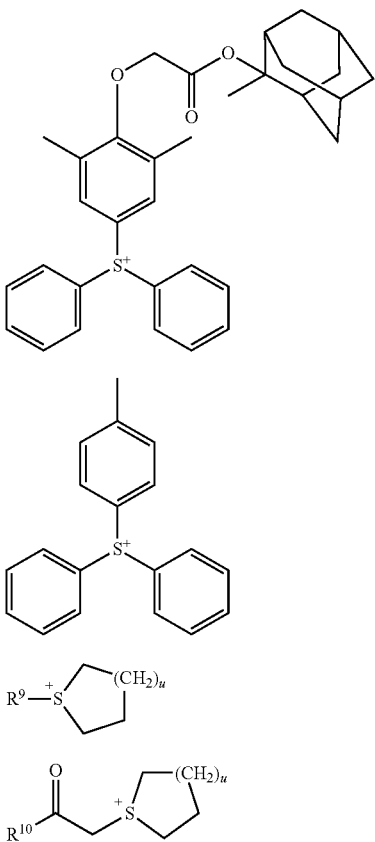

(I-1-7)

(I-1-8)

(I-1-9)

(I-1-10)

R⁴" represents an alkyl group, a halogenated alkyl group, an aryl group or an alkenyl group which may have a substituent.

The alkyl group for $R^{4''}$ may be any of linear, branched or cyclic.

The linear or branched alkyl group preferably has 1 to 10 carbon atoms, more preferably 1 to 8 carbon atoms, and most preferably 1 to 4 carbon atoms.

The cyclic alkyl group preferably has 4 to 15 carbon atoms, more preferably 4 to 10 carbon atoms, and most preferably 6 to 10 carbon atoms.

As an example of the halogenated alkyl group for $R^{4''}$, a group in which part of or all of the hydrogen atoms of the aforementioned linear, branched or cyclic alkyl group have been substituted with halogen atoms can be given. Examples of the aforementioned halogen atom include a fluorine atom, a chlorine atom, a bromine atom and an iodine atom, and a fluorine atom is preferable.

In the halogenated alkyl group, the percentage of the number of halogen atoms based on the total number of halogen atoms and hydrogen atoms within the halogenated alkyl group (namely, the halogenation ratio (%)) is preferably 10 to 100%, more preferably 50 to 100%, and most preferably 100%. Higher halogenation ratio is preferable because the acid strength increases.

The aryl group for $R^{4''}$ is preferably an aryl group of 6 to 20 carbon atoms.

The alkenyl group for $R^{4''}$ is preferably an alkenyl group of 2 to 10 carbon atoms.

With respect to $R^{4''}$, the expression "may have a substituent" means that part of or all of the hydrogen atoms within the aforementioned linear, branched or cyclic alkyl group, halogenated alkyl group, aryl group or alkenyl group may be substituted with substituents (atoms other than hydrogen atoms, or groups).

$R^{4''}$ may have one substituent, or two or more substituents.

Examples of the substituent include a halogen atom, a hetero atom, an alkyl group, and a group represented by the formula X-Q¹- (in the formula, Q¹ represents a divalent linking group containing an oxygen atom; and X represents a hydrocarbon group of 3 to 30 carbon atoms which may have a substituent).

Examples of the halogen atoms and alkyl groups include the same halogen atoms and alkyl groups as those described above with respect to the halogenated alkyl group for $R^{4''}$.

Examples of the hetero atoms include an oxygen atom, a nitrogen atom, and a sulfur atom.

In the group represented by formula X-Q¹-, Q¹ represents a divalent linking group containing an oxygen atom.

Q¹ may contain an atom other than an oxygen atom. Examples of atoms other than an oxygen atom include a carbon atom, a hydrogen atom, a sulfur atom and a nitrogen atom.

Examples of the divalent linking groups containing an oxygen atom include non-hydrocarbon-based oxygen atom-containing linking groups such as an oxygen atom (an ether bond; —O—), an ester bond (—C(=O)—O—), an amide bond (—C(=O)—NH—), a carbonyl group (—C(=O)—) and a carbonate bond (—O—C(=O)—O—); and combinations of the aforementioned non-hydrocarbon-based oxygen atom-containing linking groups with an alkylene group. Specific examples of the combinations of the aforementioned non-hydrocarbon-based oxygen atom-containing linking groups and an alkylene group include —R⁹¹—O—, —R⁹²—O—C(=O)— and —C(=O)—O—R⁹³—O—C(=O)— (in the formulas, each of $R^{91}$ to $R^{93}$ independently represents an alkylene group).

The alkylene group for $R^{91}$ to $R^{93}$ is preferably a linear or branched alkylene group, and preferably has 1 to 12 carbon atoms, more preferably 1 to 5 carbon atoms, and most preferably 1 to 3 carbon atoms.

Specific examples of alkylene groups include a methylene group [—CH₂—]; alkylmethylene groups such as —CH(CH₃)—, —CH(CH₂CH₃)—, —C(CH₃)₂—, —C(CH₃)(CH₂CH₃)—, —C(CH₃)(CH₂CH₂CH₃)— and —C(CH₂CH₃)₂—; an ethylene group [—CH₂CH₂—]; alkylethylene groups such as —CH(CH₃)CH₂—, —CH(CH₃)CH(CH₃)—, —C(CH₃)₂CH₂— and —CH(CH₂CH₃)CH₂—; a trimethylene group (n-propylene group) [—CH₂CH₂CH₂—]; alkyltrimethylene groups such as —CH(CH₃)CH₂CH₂— and —CH₂CH(CH₃)CH₂—; a tetramethylene group [—CH₂CH₂CH₂CH₂—]; alkyltetramethylene groups such as —CH(CH₃)CH₂CH₂CH₂— and —CH₂CH(CH₃)CH₂CH₂—; and a pentamethylene group [—CH₂CH₂CH₂CH₂CH₂—].

Q¹ is preferably a divalent linking group containing an ester bond or ether bond, and more preferably a group represented by —R⁹¹—O—, —R⁹²—O—C(=O)— or —C(=O)—O—R⁹³—O—C(=O)—.

In the group represented by the formula X-Q¹-, the hydrocarbon group for X may be either an aromatic hydrocarbon group or an aliphatic hydrocarbon group.

The aromatic hydrocarbon group is a hydrocarbon group having an aromatic ring. The aromatic hydrocarbon group preferably has 3 to 30 carbon atoms, more preferably 5 to 30 carbon atoms, still more preferably 5 to 20 carbon atoms, still more preferably 6 to 15 carbon atoms, and most preferably 6 to 12 carbon atoms. Here, the number of carbon atoms within a substituent(s) is not included in the number of carbon atoms of the aromatic hydrocarbon group.

Specific examples of aromatic hydrocarbon groups include an aryl group which is an aromatic hydrocarbon ring having one hydrogen atom removed therefrom, such as a phenyl group, a biphenyl group, a fluorenyl group, a naphthyl group, an anthryl group or a phenanthryl group; and an alkylaryl group such as a benzyl group, a phenethyl group, a 1-naphthylmethyl group, a 2-naphthylmethyl group, a 1-naphthylethyl group, or a 2-naphthylethyl group. The alkyl chain within the arylalkyl group preferably has 1 to 4 carbon atom, more preferably 1 or 2 carbon atoms, and most preferably 1 carbon atom.

The aromatic hydrocarbon group may have a substituent. For example, a part of the carbon atoms constituting the aromatic ring within the aromatic hydrocarbon group may be substituted with a hetero atom, or a hydrogen atom bonded to the aromatic ring within the aromatic hydrocarbon group may be substituted with a substituent.

In the former example, a heteroaryl group in which a part of the carbon atoms constituting the ring within the aforementioned aryl group has been substituted with a hetero atom such as an oxygen atom, a sulfur atom or a nitrogen atom, and a heteroarylalkyl group in which a part of the carbon atoms constituting the aromatic hydrocarbon ring within the aforementioned arylalkyl group has been substituted with the aforementioned hetero atom can be used.

In the latter example, as the substituent for the aromatic hydrocarbon group, an alkyl group, an alkoxy group, a halogen atom, a halogenated alkyl group, a hydroxyl group, an oxygen atom (=O) or the like can be used.

The alkyl group as the substituent for the aromatic hydrocarbon group is preferably an alkyl group of 1 to 5 carbon atoms, and a methyl group, an ethyl group, a propyl group, an n-butyl group or a tert-butyl group is particularly desirable.

The alkoxy group as the substituent for the aromatic hydrocarbon group is preferably an alkoxy group having 1 to 5 carbon atoms, more preferably a methoxy group, an ethoxy group, a n-propoxy group, an iso-propoxy group, a n-butoxy group or a tert-butoxy group, and most preferably a methoxy group or an ethoxy group.

Examples of the halogen atom as the substituent for the aromatic hydrocarbon group include a fluorine atom, a chlorine atom, a bromine atom and an iodine atom, and a fluorine atom is preferable.

Example of the halogenated alkyl group as the substituent for the aromatic hydrocarbon group includes a group in which a part or all of the hydrogen atoms within the aforementioned alkyl group have been substituted with the aforementioned halogen atoms.

The aliphatic hydrocarbon group for X may be either a saturated aliphatic hydrocarbon group, or an unsaturated aliphatic hydrocarbon group. Further, the aliphatic hydrocarbon group may be a linear, branched or cyclic group.

In the aliphatic hydrocarbon group for X, a part of the carbon atoms constituting the aliphatic hydrocarbon group may be substituted with a substituent group containing a hetero atom, or a part or all of the hydrogen atoms constituting the aliphatic hydrocarbon group may be substituted with a substituent group containing a hetero atom.

As the "hetero atom" within the aliphatic hydrocarbon group for X, there is no particular limitation as long as it is an atom other than a carbon atom and a hydrogen atom. Examples of the hetero atom include a halogen atom, an oxygen atom, a sulfur atom and a nitrogen atom. Examples of the halogen atom include a fluorine atom, a chlorine atom, an iodine atom and a bromine atom.

The substituent containing a hetero atom may consist solely of the hetero atom, or may be a group that also contains a group or atom other than a hetero atom.

Specific examples of the substituent for substituting a part of the carbon atoms include —O—, —C(=O)—O—, —C(=O)—, —O—C(=O)—O—, —C(=O)—NH—, —NH— (the H may be replaced with a substituent such as an alkyl group or an acyl group, wherein the alkyl group, acyl group or the like preferably has 1 to 10 carbon atoms, more preferably 1 to 8 carbon atoms, and most preferably 1 to 5 carbon atoms), —S—, —S(=O)$_2$— and —S(=O)$_2$—O—. When the aliphatic hydrocarbon group is cyclic, any of these substituent may be included within the ring structure of the aliphatic hydrocarbon group.

Examples of the substituent for substituting a part or all of the hydrogen atoms include an alkoxy group, a halogen atom, a halogenated alkyl group, a hydroxyl group, an oxygen atom (=O) and a cyano group.

The aforementioned alkoxy group is preferably an alkoxy group having 1 to 5 carbon atoms, more preferably a methoxy group, an ethoxy group, a n-propoxy group, an iso-propoxy group, a n-butoxy group or a tert-butoxy group, and most preferably a methoxy group or an ethoxy group.

Examples of the aforementioned halogen atom include a fluorine atom, a chlorine atom, a bromine atom and an iodine atom, and a fluorine atom is preferable.

Examples of the aforementioned halogenated alkyl group include a group in which a part or all of the hydrogen atoms within an alkyl group of 1 to 5 carbon atoms (e.g., a methyl group, an ethyl group, a propyl group, an n-butyl group or a tert-butyl group) have been substituted with the aforementioned halogen atoms.

As the aliphatic hydrocarbon group, a linear or branched saturated hydrocarbon group, a linear or branched monovalent unsaturated hydrocarbon group, or a cyclic aliphatic hydrocarbon group (aliphatic cyclic group) is preferable.

The linear saturated hydrocarbon group (alkyl group) preferably has 1 to 20 carbon atoms, more preferably 1 to 15 carbon atoms, and most preferably 1 to 10 carbon atoms. Specific examples include a methyl group, an ethyl group, a propyl group, a butyl group, a pentyl group, a hexyl group, a heptyl group, an octyl group, a nonyl group, a decyl group, an undecyl group, a dodecyl group, a tridecyl group, an isotridecyl group, a tetradecyl group, a pentadecyl group, a hexadecyl group, an isohexadecyl group, a heptadecyl group, an octadecyl group, a nonadecyl group, an icosyl group, a henicosyl group and a docosyl group.

The branched saturated hydrocarbon group (alkyl group) preferably has 3 to 20 carbon atoms, more preferably 3 to 15 carbon atoms, and most preferably 3 to 10 carbon atoms. Specific examples include a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group and a 4-methylpentyl group.

The unsaturated hydrocarbon group preferably has 2 to 10 carbon atoms, more preferably 2 to 5 carbon atoms, still more preferably 2 to 4 carbon atoms, and most preferably 3 carbon atoms. Examples of linear monovalent unsaturated hydrocarbon groups include a vinyl group, a propenyl group (an allyl group) and a butynyl group. Examples of branched monovalent unsaturated hydrocarbon groups include a 1-methylpropenyl group and a 2-methylpropenyl group.

Among the above-mentioned examples, as the unsaturated hydrocarbon group, a propenyl group is particularly desirable.

The aliphatic cyclic group may be either a monocyclic group or a polycyclic group. The aliphatic cyclic group preferably has 3 to 30 carbon atoms, more preferably 5 to 30 carbon atoms, still more preferably 5 to 20 carbon atoms, still more preferably 6 to 15 carbon atoms, and most preferably 6 to 12 carbon atoms.

As the aliphatic cyclic group, a group in which one or more hydrogen atoms have been removed from a monocycloalkane or a polycycloalkane such as a bicycloalkane, tricycloalkane or tetracycloalkane can be used. Specific examples include groups in which one or more hydrogen atoms have been removed from a monocycloalkane such as cyclopentane or cyclohexane; and groups in which one or more hydrogen atoms have been removed from a polycycloalkane such as adamantane, norbornane, isobornane, tricyclodecane or tetracyclododecane.

When the aliphatic cyclic group does not contain a hetero atom-containing substituent group in the ring structure thereof, the aliphatic cyclic group is preferably a polycyclic group, more preferably a group in which one or more hydrogen atoms have been removed from a polycycloalkane, and a group in which one or more hydrogen atoms have been removed from adamantane is particularly desirable.

When the aliphatic cyclic group contains a hetero atom-containing substituent in the ring structure thereof, the hetero atom-containing substituent is preferably —O—, —C(=O)—O—, —S—, —S(=O)$_2$— or —S(=O)$_2$—O—. Specific examples of such aliphatic cyclic groups include groups represented by formulas (L1) to (L5) and (S1) to (S4) shown below.

[Chemical Formula 76]

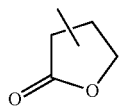
(L1)

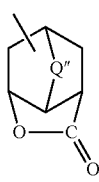
(L2)

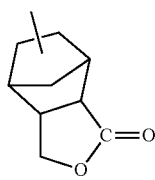
(L3)

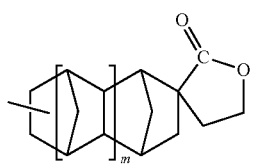
(L4)

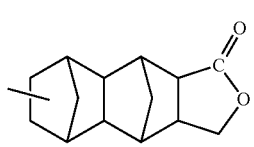
(L5)

-continued

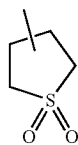
(S1)

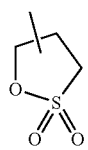
(S2)

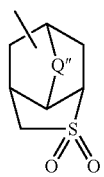
(S3)

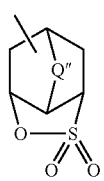
(S4)

In the formulas, Q" represents an alkylene group of 1 to 5 carbon atoms, —O—, —S—, —O—R$^{94}$— or —S—R$^{95}$— (wherein each of R$^{94}$ and R$^{95}$ independently represents an alkylene group of 1 to 5 carbon atoms); and m represents an integer of 0 or 1.

In the formulas, as the alkylene group for Q", R$^{94}$ and R$^{95}$, the same alkylene groups as those described above for R$^{91}$ to R$^{93}$ in connection with Q$^1$ can be used.

In these aliphatic cyclic groups, a part of the hydrogen atoms boned to the carbon atoms constituting the ring structure may be substituted with a substituent. Examples of substituents include an alkyl group, an alkoxy group, a halogen atom, a halogenated alkyl group, a hydroxyl group and an oxygen atom (=O).

As the alkyl group, an alkyl group of 1 to 5 carbon atoms is preferable, and a methyl group, an ethyl group, a propyl group, an n-butyl group or a tert-butyl group is particularly desirable.

Examples of the alkoxy group and the halogen atom include the same groups as those listed above for the substituent used for substituting some or all of the hydrogen atoms.

In the present invention, X is preferably a cyclic group which may have a substituent. The cyclic group may be either an aromatic hydrocarbon group which may have a substituent, or an aliphatic cyclic group which may have a substituent, although an aliphatic cyclic group which may have a substituent is preferable.

As the aromatic hydrocarbon group, a naphthyl group which may have a substituent, or a phenyl group which may have a substituent is preferable.

As the aliphatic cyclic group which may have a substituent, a polycyclic aliphatic group which may have a substituent is preferable. As the polycyclic aliphatic group, groups in which one or more hydrogen atoms have been removed from an aforementioned polycycloalkane, and groups represented by formulas (L2) to (L5), and (S3) and (S4) above are preferable.

In the present invention, $R^{4''}$ preferably has X-$Q^1$- as a substituent. In such a case, $R^{4''}$ is preferably a group represented by the formula X-$Q^1$-$Y^1$— (in the formula, $Q^1$ and X are the same as defined above; and $Y^1$ represents an alkylene group of 1 to 4 carbon atoms which may have a substituent, or a fluorinated alkylene group of 1 to 4 carbon atoms which may have a substituent).

In the group represented by the formula X-$Q^1$-$Y^1$—, as the alkylene group for $Y^1$, the same alkylene group as those described above for $Q^1$ in which the number of carbon atoms is 1 to 4 can be used.

As the fluorinated alkylene group for Y', the aforementioned alkylene group in which a part or all of the hydrogen atoms in the alkylene group have been substituted with fluorine atoms can be used.

Specific examples of $Y^1$ include —$CF_2$—, —$CF_2CF_2$—, —$CF_2CF_2CF_2$—, —$CF(CF_3)CF_2$—, —$CF(CF_2CF_3)$—, —$C(CF_3)_2$—, —$CF_2CF_2CF_2CF_2$—, —$CF(CF_3)CF_2CF_2$—, —$CF_2CF(CF_3)CF_2$—, —$CF(CF_3)CF(CF_3)$—, —$C(CF_3)_2CF_2$—, —$CF(CF_2CF_3)CF_2$—, —$CF(CF_2CF_2CF_3)$—, —$C(CF_3)(CF_2CF_3)$—; —CHF—, —$CH_2CF_2$—, —$CH_2CH_2CF_2$—, —$CH_2CF_2CF_2$—, —$CH(CF_3)CH_2$—, —$CH(CF_2CF_3)$—, —$C(CH_3)(CF_3)$—, —$CH_2CH_2CH_2CF_2$—, —$CH_2CH_2CF_2CF_2$—, —$CH(CF_3)CH_2CH_2$—, —$CH_2CH(CF_3)CH_2$—, —$CH(CF_3)CH(CF_3)$—, —$C(CF_3)_2CH_2$—; —$CH_2$—, —$CH_2CH_2$—, —$CH_2CH_2CH_2$—, —$CH(CH_3)CH_2$—, —$CH(CH_2CH_3)$—, —$C(CH_3)_2$—, —$CH_2CH_2CH_2CH_2$—, —$CH(CH_3)CH_2CH_2$—, —$CH_2CH(CH_3)CH_2$—, —$CH(CH_3)CH(CH_3)$—, —$C(CH_3)_2CH_2$—, —$CH(CH_2CH_3)CH_2$—, —$CH(CH_2CH_2CH_3)$—, and —$C(CH_3)(CH_2CH_3)$—.

$Y^1$ is preferably a fluorinated alkylene group, and particularly preferably a fluorinated alkylene group in which the carbon atom bonded to the adjacent sulfur atom is fluorinated. Examples of such fluorinated alkylene groups include —$CF_2$—, —$CF_2CF_2$—, —$CF_2CF_2CF_2$—, —$CF(CF_3)CF_2$—, —$CF_2CF_2CF_2CF_2$—, —$CF(CF_3)CF_2CF_2$—, —$CF_2CF(CF_3)CF_2$—, —$CF(CF_3)CF(CF_3)$—, —$C(CF_3)_2CF_2$—, —$CF(CF_2CF_3)CF_2$—; —$CH_2CF_2$—, —$CH_2CH_2CF_2$—, —$CH_2CF_2CF_2$—; —$CH_2CH_2CH_2CF_2$—, —$CH_2CH_2CF_2CF_2$—, and —$CF_2CF_2CF_2$—.

Of these, —$CF_2$—, —$CF_2CF_2$—, —$CF_2CF_2CF_2$— or $CH_2CF_2CF_2$— is preferable, —$CF_2$—, —$CF_2CF_2$— or —$CF_2CF_2CF_2$— is more preferable, and —$CF_2$— is particularly desirable.

The alkylene group or fluorinated alkylene group may have a substituent. The expression that the alkylene group or fluorinated alkylene group "may have a substituent" means that some or all of the hydrogen atoms or fluorine atoms in the alkylene group or fluorinated alkylene group may be substituted, either with atoms other than hydrogen atoms and fluorine atoms, or with groups.

Examples of substituents which the alkylene group or fluorinated alkylene group may have include an alkyl group of 1 to 4 carbon atoms, an alkoxy group of 1 to 4 carbon atoms, and a hydroxyl group.

In formula (b-2), $R^{5''}$ and $R^{6''}$ each independently represents an aryl group or an alkyl group. At least one of $R^{5''}$ and $R^{6''}$ represents an aryl group. It is preferable that both of $R^{5''}$ and $R^{6''}$ represent an aryl group.

As the aryl group for $R^{5''}$ and $R^{6''}$, the same as the aryl groups for $R^{1''}$ to $R^{3''}$ can be used.

As the alkyl group for $R^{5''}$ and $R^{6''}$, the same as the alkyl groups for $R^{1''}$ to $R^{3''}$ can be used.

It is particularly desirable that both of $R^{5''}$ and $R^{6''}$ represents a phenyl group.

As $R^{4''}$ in formula (b-2), the same groups as those mentioned above for $R^{4''}$ in formula (b-1) can be used.

Specific examples of suitable onium salt acid generators represented by formula (b-1) or (b-2) include diphenyliodonium trifluoromethanesulfonate or nonafluorobutanesulfonate; bis(4-tert-butylphenyl)iodonium trifluoromethanesulfonate or nonafluorobutanesulfonate; triphenylsulfonium trifluoromethanesulfonate, heptafluoropropanesulfonate or nonafluorobutanesulfonate; tri(4-methylphenyl)sulfonium trifluoromethanesulfonate, heptafluoropropanesulfonate or nonafluorobutanesulfonate; dimethyl(4-hydroxynaphthyl)sulfonium trifluoromethanesulfonate, heptafluoropropanesulfonate or nonafluorobutanesulfonate; monophenyldimethylsulfonium trifluoromethanesulfonate, heptafluoropropanesulfonate or nonafluorobutanesulfonate; diphenylmonomethylsulfonium trifluoromethanesulfonate, heptafluoropropanesulfonate or nonafluorobutanesulfonate; (4-methylphenyl)diphenylsulfonium trifluoromethanesulfonate, heptafluoropropanesulfonate or nonafluorobutanesulfonate; (4-methoxyphenyl)diphenylsulfonium trifluoromethanesulfonate, heptafluoropropanesulfonate or nonafluorobutanesulfonate; tri(4-tert-butyl)phenylsulfonium trifluoromethanesulfonate, heptafluoropropanesulfonate or nonafluorobutanesulfonate; diphenyl(1-(4-methoxy)naphthyl)sulfonium trifluoromethanesulfonate, heptafluoropropanesulfonate or nonafluorobutanesulfonate; di(1-naphthyl)phenylsulfonium trifluoromethanesulfonate, heptafluoropropanesulfonate or nonafluorobutanesulfonate; 1-phenyltetrahydrothiophenium trifluoromethanesulfonate, heptafluoropropanesulfonate or nonafluorobutanesulfonate; 1-(4-methylphenyl)tetrahydrothiophenium trifluoromethanesulfonate, heptafluoropropanesulfonate or nonafluorobutanesulfonate; 1-(3,5-dimethyl-4-hydroxyphenyl)tetrahydrothiophenium trifluoromethanesulfonate, heptafluoropropanesulfonate or nonafluorobutanesulfonate; 1-(4-methoxynaphthalene-1-yl)tetrahydrothiophenium trifluoromethanesulfonate, heptafluoropropanesulfonate or nonafluorobutanesulfonate; 1-(4-ethoxynaphthalene-1-yl)tetrahydrothiophenium trifluoromethanesulfonate, heptafluoropropanesulfonate or nonafluorobutanesulfonate; 1-(4-n-butoxynaphthalene-1-yl)tetrahydrothiophenium trifluoromethanesulfonate, heptafluoropropanesulfonate or nonafluorobutanesulfonate; 1-phenyltetrahydrothiopyranium trifluoromethanesulfonate, heptafluoropropanesulfonate or nonafluorobutanesulfonate; 1-(4-hydroxyphenyl)tetrahydrothiopyranium trifluoromethanesulfonate, heptafluoropropanesulfonate or nonafluorobutanesulfonate; 1-(3,5-dimethyl-4-hydroxyphenyl)tetrahydrothiopyranium trifluoromethanesulfonate, heptafluoropropanesulfonate or nonafluorobutanesulfonate; and 1-(4-methylphenyl)tetrahydrothiopyranium trifluoromethanesulfonate, heptafluoropropanesulfonate or nonafluorobutanesulfonate.

It is also possible to use onium salts in which the anion moiety of these onium salts are replaced by an alkylsulfonate such as methanesulfonate, n-propanesulfonate, n-butanesulfonate, or n-octanesulfonate.

Furthermore, onium salts in which the anion moiety of these onium salts are replaced by an anion moiety represented by any one of formulas (31) to (b8) shown below can also be used.

[Chemical Formula 77]

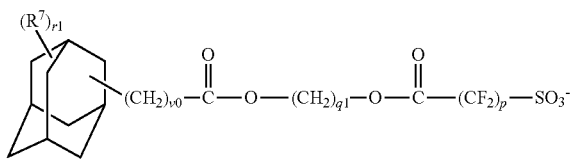
(b1)

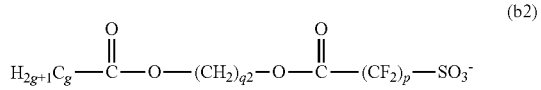
(b2)

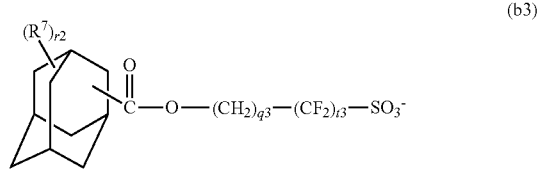
(b3)

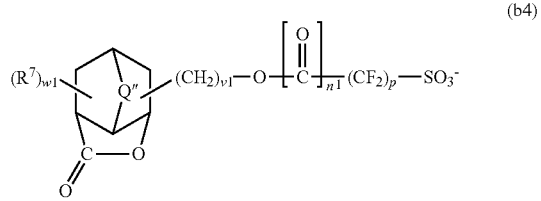
(b4)

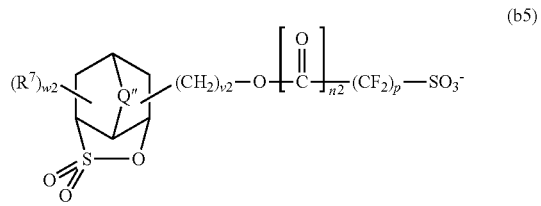
(b5)

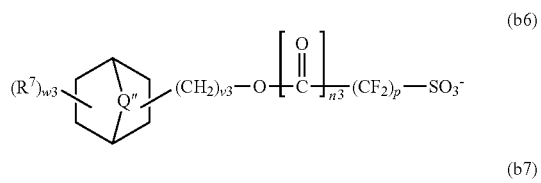
(b6)

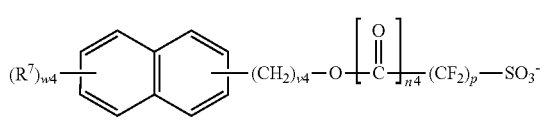
(b7)

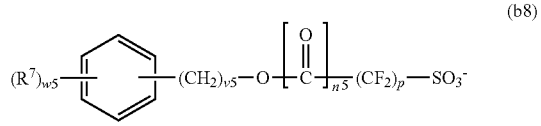
(b8)

In the formulas, p represents an integer of 1 to 3; each of q1 and q2 independently represents an integer of 1 to 5; q3 represents an integer of 1 to 12; t3 represents an integer of 1 to 3; each of r1 and r2 independently represents an integer of 0 to 3; g represents an integer of 1 to 20; $R^7$ represents a substituent; each of n1 to n5 independently represents 0 or 1; each of v0 to v5 independently represents an integer of 0 to 3; each of w1 to w5 independently represents an integer of 0 to 3; and Q" is the same as defined above.

As the substituent for $R^7$, the same groups as those which the aforementioned aliphatic hydrocarbon group or aromatic hydrocarbon group for X may have as a substituent can be used.

If there are two or more of the $R^7$ group, as indicated by the values r1 and r2 and w1 to w5, then the two or more of the $R^7$ groups may be the same or different from each other.

Further, onium salt-based acid generators in which the anion moiety in general formula (b-1) or (b-2) is replaced by an anion moiety represented by general formula (b-3) or (b-4) shown below (the cation moiety is the same as (b-1) or (b-2)) may be used.

[Chemical Formula 78]

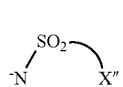
(b-3)

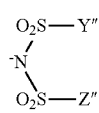
(b-4)

In the formulas, X" represents an alkylene group of 2 to 6 carbon atoms in which at least one hydrogen atom has been substituted with a fluorine atom; and each of Y" and Z" independently represents an alkyl group of 1 to 10 carbon atoms in which at least one hydrogen atom has been substituted with a fluorine atom.

X" represents a linear or branched alkylene group in which at least one hydrogen atom has been substituted with a fluorine atom, and the alkylene group has 2 to 6 carbon atoms, preferably 3 to 5 carbon atoms, and most preferably 3 carbon atoms.

Each of Y" and Z" independently represents a linear or branched alkyl group in which at least one hydrogen atom has been substituted with a fluorine atom, and the alkyl group has 1 to 10 carbon atoms, preferably 1 to 7 carbon atoms, and most preferably 1 to 3 carbon atoms.

The smaller the number of carbon atoms of the alkylene group for X" or those of the alkyl group for Y" and Z" within the above-mentioned range of the number of carbon atoms, the more the solubility in a resist solvent is improved.

Further, in the alkylene group for X" or the alkyl group for Y" and Z", it is preferable that the number of hydrogen atoms substituted with fluorine atoms is as large as possible, because the acid strength increases and the transparency to high energy radiation of 200 nm or less or electron beam is improved. The fluorination ratio of the alkylene group or alkyl group is preferably from 70 to 100%, more preferably from 90 to 100%, and it is particularly desirable that the alkylene group or alkyl group be a perfluoroalkylene group or perfluoroalkyl group in which all the hydrogen atoms are substituted with fluorine atoms.

Furthermore, as an onium salt-based acid generator, a sulfonium salt having a cation moiety represented by general formula (b-5) or (b-6) shown below may also be used.

[Chemical Formula 79]

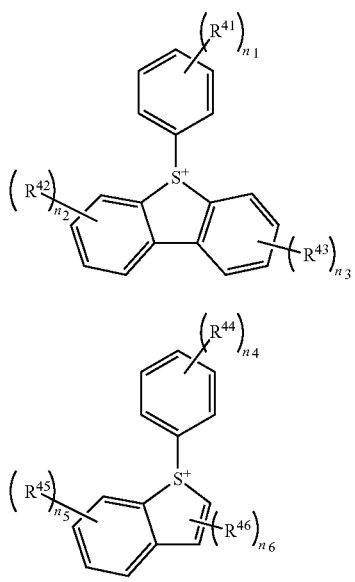

In the formulas, each of $R^{41}$ to $R^{46}$ independently represents an alkyl group, an acetyl group, an alkoxy group, a carboxy group, a hydroxyl group or a hydroxyalkyl group; each of $n_1$ to $n_5$ independently represents an integer of 0 to 3; and $n_6$ represents an integer of 0 to 2.

With respect to $R^{41}$ to $R^{46}$, the alkyl group is preferably an alkyl group of 1 to 5 carbon atoms, more preferably a linear or branched alkyl group, and most preferably a methyl group, an ethyl group, a propyl group, an isopropyl group, a n-butyl group or a tert butyl group.

The alkoxy group is preferably an alkoxy group of 1 to 5 carbon atoms, more preferably a linear or branched alkoxy group, and most preferably a methoxy group or an ethoxy group.

The hydroxyalkyl group is preferably the aforementioned alkyl group in which one or more hydrogen atoms have been substituted with hydroxy groups, and examples thereof include a hydroxymethyl group, a hydroxyethyl group and a hydroxypropyl group.

If there are two or more of an individual $R^{41}$ to $R^{46}$ group, as indicated by the corresponding value of $n_1$ to $n_6$, then the two or more of the individual $R^{41}$ to $R^{46}$ group may be the same or different from each other.

$n_1$ is preferably 0 to 2, more preferably 0 or 1, and still more preferably 0.

It is preferable that $n_2$ and $n_3$ each independently represent 0 or 1, and more preferably 0.

$n_4$ is preferably 0 to 2, and more preferably 0 or 1.

$n_5$ is preferably 0 or 1, and more preferably 0.

$n_6$ is preferably 0 or 1, and more preferably 1.

The anion moiety of the sulfonium salt having a cation moiety represented by general formula (b-5) or (b-6) is not particularly limited, and the same anion moieties for onium salt-based acid generators which have been proposed may be used. Examples of such anion moieties include fluorinated alkylsulfonic acid ions such as anion moieties ($R^{4"}SO3^-$) for onium salt-based acid generators represented by general formula (b-1) or (b-2) shown above; and anion moieties represented by general formula (b-3) or (b-4) shown above.

In the present description, an oxime sulfonate-based acid generator is a compound having at least one group represented by general formula (B-1) shown below, and has a feature of generating acid by irradiation. Such oxime sulfonate-based acid generators are widely used for a chemically amplified resist composition, and can be appropriately selected.

[Chemical Formula 80]

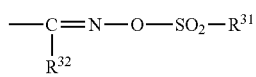

(B-1)

In formula (B-1), each of $R^{31}$ and $R^{32}$ independently represents an organic group.

The organic group for $R^{31}$ and $R^{32}$ refers to a group containing a carbon atom, and may include atoms other than carbon atoms (e.g., a hydrogen atom, an oxygen atom, a nitrogen atom, a sulfur atom, a halogen atom (such as a fluorine atom and a chlorine atom) and the like).

As the organic group for $R^{31}$, a linear, branched, or cyclic alkyl group or aryl group is preferable. The alkyl group or the aryl group may have a substituent. The substituent is not particularly limited, and examples thereof include a fluorine atom and a linear, branched, or cyclic alkyl group having 1 to 6 carbon atoms. The expression that the alkyl group or aryl group "may have a substituent" means that some or all of the hydrogen atoms of the alkyl group or aryl group may be substituted with a substituent.

The alkyl group preferably has 1 to 20 carbon atoms, more preferably 1 to 10 carbon atoms, still more preferably 1 to 8 carbon atoms, still more preferably 1 to 6 carbon atoms, and most preferably 1 to 4 carbon atoms. As the alkyl group, a partially or completely halogenated alkyl group (hereinafter, sometimes referred to as a "halogenated alkyl group") is particularly desirable. The "partially halogenated alkyl group" refers to an alkyl group in which part of the hydrogen atoms are substituted with halogen atoms and the "completely halogenated alkyl group" refers to an alkyl group in which all of the hydrogen atoms are substituted with halogen atoms. Examples of the halogen atom include a fluorine atom, a chlorine atom, a bromine atom and an iodine atom, and a fluorine atom is particularly desirable. In other words, the halogenated alkyl group is preferably a fluorinated alkyl group.

The aryl group preferably has 4 to 20 carbon atoms, more preferably 4 to 10 carbon atoms, and most preferably 6 to 10 carbon atoms. As the aryl group, a partially or completely halogenated aryl group is particularly desirable. The "partially halogenated aryl group" refers to an aryl group in which some of the hydrogen atoms are substituted with halogen atoms and the "completely halogenated aryl group" refers to an aryl group in which all of hydrogen atoms are substituted with halogen atoms.

As $R^{31}$, an alkyl group of 1 to 4 carbon atoms which has no substituent or a fluorinated alkyl group of 1 to 4 carbon atoms is particularly desirable.

As the organic group for $R^{32}$, a linear, branched, or cyclic alkyl group, an aryl group, or a cyano group is preferable. Examples of the alkyl group and the aryl group for $R^{32}$ include the same alkyl groups and aryl groups as those described above for $R^{31}$.

As $R^{32}$, a cyano group, an alkyl group of 1 to 8 carbon atoms having no substituent or a fluorinated alkyl group of 1 to 8 carbon atoms is particularly desirable.

Preferred examples of the oxime sulfonate-based acid generator include compounds represented by general formula (B-2) or (B-3) shown below.

[Chemical Formula 81]

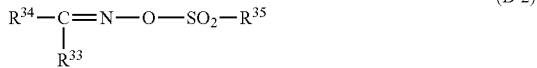

(B-2)

In formula (B-2), $R^{33}$ represents a cyano group, an alkyl group having no substituent or a halogenated alkyl group; $R^{34}$ represents an aryl group; and $R^{35}$ represents an alkyl group having no substituent or a halogenated alkyl group.

[Chemical Formula 82]

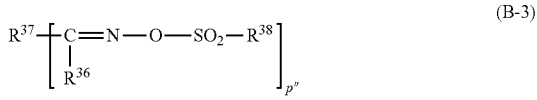

(B-3)

In formula (B-3), $R^{36}$ represents a cyano group, an alkyl group having no substituent or a halogenated alkyl group; $R^{37}$ represents a divalent or trivalent aromatic hydrocarbon group; $R^{38}$ represents an alkyl group having no substituent or a halogenated alkyl group; and p" represents 2 or 3.

In general formula (B-2), the alkyl group having no substituent or the halogenated alkyl group for $R^{33}$ preferably has 1 to 10 carbon atoms, more preferably 1 to 8 carbon atoms, and most preferably 1 to 6 carbon atoms.

As $R^{33}$, a halogenated alkyl group is preferable, and a fluorinated alkyl group is more preferable.

The fluorinated alkyl group for $R^{33}$ preferably has 50% or more of the hydrogen atoms thereof fluorinated, more preferably 70% or more, and most preferably 90% or more.

Examples of the aryl group for $R^{34}$ include groups in which one hydrogen atom has been removed from an aromatic hydrocarbon ring, such as a phenyl group, a biphenyl group, a fluorenyl group, a naphthyl group, an anthryl group, and a phenanthryl group, and heteroaryl groups in which some of the carbon atoms constituting the ring(s) of these groups are substituted with hetero atoms such as an oxygen atom, a sulfur atom, and a nitrogen atom. Of these, a fluorenyl group is preferable.

The aryl group for $R^{34}$ may have a substituent such as an alkyl group of 1 to 10 carbon atoms, a halogenated alkyl group, or an alkoxy group. The alkyl group and halogenated alkyl group as the substituent preferably has 1 to 8 carbon atoms, and more preferably 1 to 4 carbon atoms. Further, the halogenated alkyl group is preferably a fluorinated alkyl group.

The alkyl group having no substituent or the halogenated alkyl group for $R^{35}$ preferably has 1 to 10 carbon atoms, more preferably 1 to 8 carbon atoms, and most preferably 1 to 6 carbon atoms.

As $R^{35}$, a halogenated alkyl group is preferable, and a fluorinated alkyl group is more preferable.

In terms of enhancing the strength of the acid generated, the fluorinated alkyl group for $R^{35}$ preferably has 50% or more of the hydrogen atoms fluorinated, more preferably 70% or more, still more preferably 90% or more. A completely fluorinated alkyl group in which 100% of the hydrogen atoms are substituted with fluorine atoms is particularly desirable.

In general formula (B-3), as the alkyl group having no substituent and the halogenated alkyl group for $R^{36}$, the same alkyl group having no substituent and the halogenated alkyl group described above for $R^{33}$ can be used.

Examples of the divalent or trivalent aromatic hydrocarbon group for $R^{37}$ include groups in which one or two hydrogen atoms have been removed from the aryl group for $R^{34}$.

As the alkyl group having no substituent or the halogenated alkyl group for $R^{38}$, the same one as the alkyl group having no substituent or the halogenated alkyl group for $R^{35}$ can be used.

p" is preferably 2.

Specific examples of suitable oxime sulfonate acid generators include α-(p-toluenesulfonyloxyimino)-benzyl cyanide, α-(p-chlorobenzenesulfonyloxyimino)-benzyl cyanide, α-(4-nitrobenzenesulfonyloxyimino)-benzyl cyanide, α-(4-nitro-2-trifluoromethylbenzenesulfonyloxyimino)-benzyl cyanide, α-(benzenesulfonyloxyimino)-4-chlorobenzyl cyanide, α-(benzenesulfonyloxyimino)-2,4-dichlorobenzyl cyanide, α-(benzenesulfonyloxyimino)-2,6-dichlorobenzyl cyanide, α-(benzenesulfonyloxyimino)-4-methoxybenzyl cyanide, α-(2-chlorobenzenesulfonyloxyimino)-4-methoxybenzyl cyanide, α-(benzenesulfonyloxyimino)-thien-2-yl acetonitrile, α-(4-dodecylbenzenesulfonyloxyimino)benzyl cyanide, a[(p-toluenesulfonyloxyimino)-4-methoxyphenyl] acetonitrile, α-[(dodecylbenzenesulfonyloxyimino)-4-methoxyphenyl]acetonitrile, α-(tosyloxyimino)-4-thienyl cyanide, α-(methylsulfonyloxyimino)-1-cyclopentenyl acetonitrile, α-(methylsulfonyloxyimino)-1-cyclohexenyl acetonitrile, α-(methylsulfonyloxyimino)-1-cycloheptenyl acetonitrile, α-(methylsulfonyloxyimino)-1-cyclooctenyl acetonitrile, α-(trifluoromethylsulfonyloxyimino)-1-cyclopentenyl acetonitrile, α-(trifluoromethylsulfonyloxyimino)-cyclohexyl acetonitrile, α-(ethylsulfonyloxyimino)-ethyl acetonitrile, α-(propylsulfonyloxyimino)-propyl acetonitrile, α-(cyclohexylsulfonyloxyimino)-cyclopentyl acetonitrile, α-(cyclohexylsulfonyloxyimino)-cyclohexyl acetonitrile, α-(cyclohexylsulfonyloxyimino)-1-cyclopentenyl acetonitrile, α-(ethylsulfonyloxyimino)-1-cyclopentenyl acetonitrile, α-(isopropylsulfonyloxyimino)-1-cyclopentenyl acetonitrile, α-(n-butylsulfonyloxyimino)-1-cyclopentenyl acetonitrile, α-(ethylsulfonyloxyimino)-1-cyclohexenyl acetonitrile, α-(isopropylsulfonyloxyimino)-1-cyclohexenyl acetonitrile, α-(n-butylsulfonyloxyimino)-1-cyclohexenyl acetonitrile, α-(methylsulfonyloxyimino)-phenyl acetonitrile, α-(methylsulfonyloxyimino)-p-methoxyphenyl acetonitrile, α-(trifluoromethylsulfonyloxyimino)-phenyl acetonitrile, α-(trifluoromethylsulfonyloxyimino)-p-methoxyphenyl acetonitrile, α-(ethylsulfonyloxyimino)-p-methoxyphenyl acetonitrile, α-(propylsulfonyloxyimino)-p-methylphenyl acetonitrile, and α-(methylsulfonyloxyimino)-p-bromophenyl acetonitrile.

Further, oxime sulfonate-based acid generators disclosed in Japanese Unexamined Patent Application, First Publication No. Hei 9-208554 (Chemical Formulas 18 and 19 shown in paragraphs [0012] to [0014]) and oxime sulfonate-based acid generators disclosed in WO 2004/074242A2 (Examples 1 to 40 described at pages 65 to 85) may be preferably used.

Further, examples of suitable oxime sulfonate-based acid generators include the following compounds.

[Chemical Formula 83]

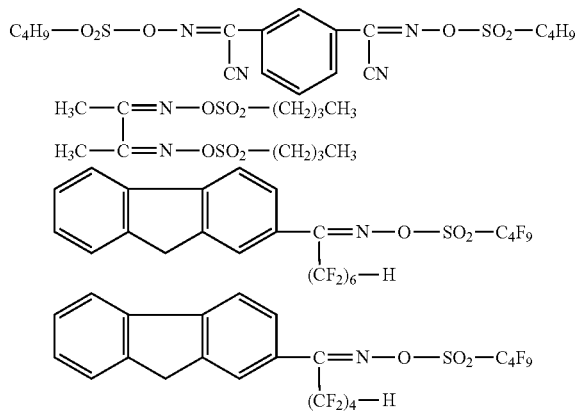

Of the aforementioned diazomethane-based acid generators, specific examples of suitable bisalkyl or bisaryl sulfonyl diazomethanes include bis(isopropylsulfonyl)diazomethane, bis(p-toluenesulfonyl)diazomethane, bis(1,1-dimethylethylsulfonyl)diazomethane, bis(cyclohexylsulfonyl)diazomethane, and bis(2,4-dimethylphenylsulfonyl)diazomethane.

Further, diazomethane-based acid generators disclosed in Japanese Unexamined Patent Application, First Publication No. Hei 11-035551, Japanese Unexamined Patent Application, First Publication No. Hei 11-035552 and Japanese Unexamined Patent Application, First Publication No. Hei 11-035573 may also be preferably used.

Furthermore, as examples of poly(bis-sulfonyl)diazomethanes, those disclosed in Japanese Unexamined Patent Application, First Publication No. Hei 11-322707, including 1,3-bis(phenylsulfonyldiazomethylsulfonyepropane, 1,4-bis(phenylsulfonyldiazomethylsulfonyl)butane, 1,6-bis(phenylsulfonyldiazomethylsulfonyl)hexane, 1,10-bis(phenylsulfonyldiazomethylsulfonyl)decane, 1,2-bis(cyclohexylsulfonyldiazomethylsulfonyl)ethane, 1,3-bis(cyclohexylsulfonyldiazomethylsulfonyl)propane, 1,6-bis(cyclohexylsulfonyldiazomethylsulfonyl)hexane, and 1,10-bis(cyclohexylsulfonyldiazomethylsulfonyl)decane, may be given.

As the component (B), one type of acid generator may be used alone, or two or more types of acid generators may be used in combination.

In the present invention, when the component (B) is used, as the component (B), it is preferable to use an onium salt-based acid generator having a fluorinated alkylsulfonic acid ion as the anion moiety.

In those cases where the positive resist composition of the present invention includes the component (B), the amount of the component (B) relative to 100 parts by weight of the component (A) is preferably 0.5 to 50 parts by weight, and more preferably 1 to 40 parts by weight. By ensuring that the amount of the component (B) is within the above-mentioned range, formation of a resist pattern can be satisfactorily performed. Further, by virtue of the above-mentioned range, a uniform solution can be obtained and the storage stability becomes satisfactory.

<Optional Component (Component (D))>

The positive resist composition of the present invention may further include a nitrogen-containing organic compound (D) (hereafter, referred to as "component (D)") as an optional component.

There are no particular limitations on the component (D) as long as it is a nitrogen-containing organic compound to act as an acid diffusion control agent, i.e., a quencher which traps the acid generated from at least one of the components selected from the group consisting of the component (A1) and the component (B) upon exposure. A multitude of these nitrogen-containing organic compounds have already been proposed, and any of these known nitrogen-containing organic compounds may be used, although aliphatic amines are preferred, and a secondary aliphatic amine or a tertiary aliphatic amine is particularly desirable. Here, the term "aliphatic amine" refers to an amine having one or more aliphatic groups, and the aliphatic groups preferably have 1 to 20 carbon atoms.

Examples of these aliphatic amines include amines in which at least one hydrogen atom of ammonia ($NH_3$) has been substituted with an alkyl group or hydroxyalkyl group of no more than 20 carbon atoms (that is, alkylamines or alkyl alcohol amines), and cyclic amines.

Specific examples of alkylamines and alkyl alcohol amines include mono alkylamines such as n-hexylamine, n-heptylamine, n-octylamine, n-nonylamine and n-decylamine; dialkylamines such as diethylamine, di-n-propylamine, di-n-heptylamine, di-n-octylamine and dicyclohexylamine; trialkylamines such as trimethylamine, triethylamine, tri-n-propylamine, tri-n-butylamine, tri-n-hexylamine, tri-n-pentylamine, tri-n-heptylamine, tri-n-octylamine, tri-n-nonylamine, tri-n-decylamine and tri-n-dodecylamine; and alkyl alcohol amines such as diethanolamine, triethanolamine, diisopropanolamine, triisopropanolamine, di-n-octanolamine, tri-n-octanolamine, stearyldiethanolamine and lauryldiethanolamine. Among these, at least one compound selected from the group consisting of trialkylamines and alkyl alcohol amines is preferred.

Examples of the cyclic amine include heterocyclic compounds containing a nitrogen atom as a hetero atom. The heterocyclic compound may be a monocyclic compound (aliphatic monocyclic amine), or a polycyclic compound (aliphatic polycyclic amine).

Specific examples of the aliphatic monocyclic amine include piperidine and piperazine.

The aliphatic polycyclic amine preferably has 6 to 10 carbon atoms, and specific examples thereof include 1,5-diazabicyclo[4.3.0]-5-nonene, 1,8-diazabicyclo[5.4.0]-7-undecene, hexamethylenetetramine, and 1,4-diazabicyclo[2.2.2]octane.

Examples of aromatic amines include aniline, pyridine, 4-dimethylaminopyridine, pyrrole, indole, pyrazole, imidazole and derivatives thereof, as well as diphenylamine, triphenylamine and tribenzylamine.

Examples of other aliphatic amines include tris(2-methoxymethoxyethyl)amine, tris{2-(2-methoxyethoxy)ethyl}amine, tris{2-(2-methoxyethoxymethoxy)ethyl}amine, tris{2-(1-methoxyethoxy)ethyl}amine, tris{2-(1-ethoxyethoxy)ethyl}amine, tris{2-(1-ethoxypropoxy)ethyl}amine and tris[2-{2-(2-hydroxyethoxy)ethoxy}ethyl]amine.

These compounds can be used either alone, or in combinations of two or more different compounds.

The component (D) is typically used in an amount within a range from 0.01 to 5.0 parts by weight, relative to 100 parts by weight of the component (A). By ensuring that the amount of the component (D) is within the above-mentioned range, the shape of the resist pattern and the post exposure stability of the latent image formed by the pattern-wise exposure of the resist layer are improved.

<Optional Component (Component (E))>

Furthermore, in the positive resist composition of the present invention, for preventing any deterioration in sensitivity, and improving the resist pattern shape and the post exposure stability of the latent image formed by the patternwise exposure of the resist layer, at least one compound (E) (hereafter referred to as the component (E)) selected from the group consisting of an organic carboxylic acid, or a phosphorus oxo acid or derivative thereof can be added as an optional component.

Examples of suitable organic carboxylic acids include acetic acid, malonic acid, citric acid, malic acid, succinic acid, benzoic acid, and salicylic acid.

Examples of phosphorus oxo acids include phosphoric acid, phosphonic acid and phosphinic acid, and among these, phosphonic acid is particularly desirable.

Examples of phosphorus oxo acid derivatives include esters in which a hydrogen atom within the above-mentioned oxo acids is substituted with a hydrocarbon group. Examples of the hydrocarbon group include an alkyl group of 1 to 5 carbon atoms and an aryl group of 6 to 15 carbon atoms.

Examples of phosphoric acid derivatives include phosphoric acid esters such as di-n-butyl phosphate and diphenyl phosphate.

Examples of phosphonic acid derivatives include phosphonic acid esters such as dimethyl phosphonate, di-n-butyl phosphonate, phenylphosphonic acid, diphenyl phosphonate and dibenzyl phosphonate.

Examples of phosphinic acid derivatives include phosphinic acid esters such as phenylphosphinic acid.

As the component (E), one type of compound may be used alone, or two or more types of compounds may be used in combination.

The component (E) is typically used in an amount within a range from 0.01 to 5.0 parts by weight, relative to 100 parts by weight of the component (A).

If desired, miscible additives other than those described above can also be added to the positive resist composition of the present invention. Examples of such miscible additives include additive resins for improving the performance of the resist film, surfactants for improving the applicability, dissolution inhibitors, plasticizers, stabilizers, colorants, halation prevention agents, and dyes.

<Optional Component (Component (S))>

The positive resist composition of the present invention can be prepared by dissolving the materials for the resist composition in an organic solvent (hereafter, frequently referred to as "component (S)").

The component (S) may be any organic solvent which can dissolve the respective components to give a uniform solution, and one or more kinds of any organic solvent can be appropriately selected from those which have been conventionally known as solvents for a chemically amplified resist.

Examples thereof include lactones such as γ-butyrolactone; ketones such as acetone, methyl ethyl ketone, cycloheptanone, cyclohexanone, methyl-n-pentyl ketone, methyl isopentyl ketone, and 2-heptanone; polyhydric alcohols such as ethylene glycol, diethylene glycol, propylene glycol and dipropylene glycol; compounds having an ester bond, such as ethylene glycol monoacetate, diethylene glycol monoacetate, propylene glycol monoacetate, and dipropylene glycol monoacetate; polyhydric alcohol derivatives including compounds having an ether bond, such as a monoalkylether (e.g., monomethylether, monoethylether, monopropylether or monobutylether) or monophenylether of any of these polyhydric alcohols or compounds having an ester bond (among these, propylene glycol monomethyl ether acetate (PGMEA) and propylene glycol monomethyl ether (PGME) are preferable); cyclic ethers such as dioxane; esters such as methyl lactate, ethyl lactate (EL), methyl acetate, ethyl acetate, butyl acetate, methyl pyruvate, ethyl pyruvate, methyl methoxypropionate, and ethyl ethoxypropionate; and aromatic organic solvents such as anisole, ethylbenzylether, cresylmethylether, diphenylether, dibenzylether, phenetole, butylphenylether, ethylbenzene, diethylbenzene, pentylbenzene, isopropylbenzene, toluene, xylene, cymene and mesitylene.

These solvents may be used individually, or as a mixed solvent containing two or more different solvents.

Among these, propylene glycol monomethyl ether acetate (PGMEA), propylene glycol monomethyl ether (PGME) and ethyl lactate (EL) are preferable.

Further, among the mixed solvents, a mixed solvent obtained by mixing PGMEA with a polar solvent is preferable. The mixing ratio (weight ratio) of the mixed solvent can be appropriately determined, taking into consideration the compatibility of the PGMEA with the polar solvent, but is preferably in a range from 1:9 to 9:1, and more preferably from 2:8 to 8:2.

Specifically, when EL is mixed as the polar solvent, the PGMEA:EL weight ratio is preferably from 1:9 to 9:1, and more preferably from 2:8 to 8:2. Alternatively, when PGME is mixed as the polar solvent, the PGMEA:PGME weight ratio is preferably from 1:9 to 9:1, more preferably from 2:8 to 8:2, and still more preferably from 3:7 to 7:3.

Further, as the component (S), a mixed solvent of at least one of PGMEA and EL with γ-butyrolactone is also preferable. The mixing ratio (former:latter) of such a mixed solvent is preferably from 70:30 to 95:5.

The amount of the component (S) used is not particularly limited, and is appropriately adjusted to a concentration which enables coating of a coating solution to a substrate, depending on the thickness of the coating film. In general, the component (S) is used in an amount that yields a solid content for the resist composition that is within the range from 1 to 20% by weight, and preferably from 2 to 15% by weight.

According to the positive resist composition of the present invention, a resist pattern can be formed that exhibits excellent sensitivity and superior lithography properties in terms of LER, EL margin, resolution and the like.

Although the reasons for these effects are not entirely clear, it is thought that inclusion of the component (G) in the resist composition of the present invention as a sensitizer improves the sensitivity in a favorable manner.

Further, because the component (G) includes, in the core portion, the component (G1) or component (G2) having a star-shape or comb-shape and to which a polymer in the arm portion is bonded via a linking group, the molecular weight thereof prior to exposure is larger than that of a conventional linear sensitizer (polymer). Moreover, in the exposed portions, the acid dissociable group of the linking group in the arm portion dissociates by the action of acid generated from at least one component selected from the group consisting of the component (A1) and the component (B) upon exposure, and hence, the molecular weight following the exposure reduces considerably compared to the molecular weight before the exposure, and the solubility in an alkali developing solution is enhanced dramatically. As described above, it is assumed that the effects of lithography properties as described above can be achieved, because the molecular weight varies greatly in the exposed portions and the unexposed portions of the component (G), and the difference in the solubility within the alkali developing solution (namely, the contrast) between the exposed portions and the unexposed portions is increased.

Furthermore, it is thought the above-mentioned effects can be achieved for the following reason. Because the polymer in the arm portion of the component (G) in the resist composition of the present invention can be obtained by an anionic polymerization method, it is easy to control the molecular weight, and the polymer is a polymeric compound having a narrow molecular weight distribution compared to the component (G) obtained through a radical polymerization method.

Further, in those cases where the resist composition of the present invention includes the component (A1) as the component (A) that generates acid upon exposure, it is assumed that favorable lithography properties as described above can be achieved because the structural unit (a0-2) is uniformly distributed within the resist film together with the component (A), and acid is uniformly generated from the structural unit (a0-2) in the exposed portions, thereby uniformly dissociating the acid dissociable, dissolution inhibiting group in the component (A) within the exposed portions.

Furthermore, in the present invention, it is assumed that because the structural unit (a1) containing an acid dissociable, dissolution inhibiting group and the structural unit (a0-2) that generates acid upon exposure are copolymerized, diffusion of the acid generated by exposure can be controlled, thereby yielding favorable lithography properties.

<<Method of Forming a Resist Pattern>>

The method of forming a resist pattern according to the present invention includes: applying a positive resist composition of the present invention to a substrate to form a resist film on the substrate; conducting exposure of the resist film; and developing the resist film to form a resist pattern.

More specifically, the method of forming a resist pattern according to the present invention can be performed, for example, as follows.

Firstly, a positive resist composition according to the present invention is applied onto a substrate using a spinner or the like, and a prebake (post applied bake (PAB)) is conducted at a temperature of 80 to 150° C. for 40 to 120 seconds, preferably 60 to 90 seconds, to form a resist film. Following selective exposure of the thus formed resist film, either by exposure through a mask pattern using an exposure apparatus such as an ArF exposure apparatus, an electron beam lithography apparatus or an EUV exposure apparatus, or by patterning via direct irradiation with an electron beam without using a mask pattern, PEB (post exposure baking) is conducted under temperature conditions of 80 to 150° C. for 40 to 120 seconds, and preferably 60 to 90 seconds. Subsequently, a developing treatment is conducted using an alkali developing solution such as a 0.1 to 10% by weight aqueous solution of tetramethylammonium hydroxide (TMAH), preferably followed by rinsing with pure water, and drying. If desired, a bake treatment (post bake) may be conducted following the above developing treatment. In this manner, a resist pattern that is faithful to the mask pattern can be obtained.

The substrate is not specifically limited and a conventionally known substrate can be used. For example, substrates for electronic components, and such substrates having wiring patterns formed thereon can be used. Specific examples of the material of the substrate include a silicon wafer; metals such as copper, chromium, iron and aluminum; as well as glass substrates. Suitable materials for the wiring pattern include copper, aluminum, nickel, and gold.

Further, as the substrate, any one of the above-mentioned substrates provided with at least one type of film selected from the group consisting of inorganic and organic films on the surface thereof may also be used. As the inorganic film, an inorganic antireflection film (inorganic BARC) can be used. As the organic film, an organic antireflection film (organic BARC) can be used.

The wavelength to be used for exposure is not particularly limited and the exposure can be conducted using radiations such as ArF excimer laser, KrF excimer laser, $F_2$ excimer laser, extreme ultraviolet rays (EUV), vacuum ultraviolet rays (VUV), electron beam (EB), X-rays, and soft X-rays. The resist composition of the present invention is effective to KrF excimer laser, ArF excimer laser, EB and EUV, and particularly effective to ArF excimer laser.

The exposure method used with the resist film may be either a general exposure (dry exposure) conducted in air or an inert gas such as nitrogen, or immersion exposure (liquid immersion lithography).

In immersion lithography, the region between the resist film and the lens at the lowermost point of the exposure apparatus is pre-filled with a solvent (immersion medium) that has a larger refractive index than the refractive index of air, and the exposure (immersion exposure) is conducted in this state.

The immersion medium preferably exhibits a refractive index larger than the refractive index of air but smaller than the refractive index of the resist film to be exposed. The refractive index of the immersion medium is not particularly limited as long as it satisfies the above-mentioned requirements.

Examples of this immersion medium which exhibits a refractive index that is larger than the refractive index of air but smaller than the refractive index of the resist film include water, fluorine-based inert liquids, silicon-based solvents and hydrocarbon-based solvents. Specific examples of the fluorine-based inert liquids include liquids containing a fluorine-based compound such as $C_3HCl_2F_5$, $C_4F_9OCH_3$, $C_4F_9OC_2H_5$ or $C_5H_3F_7$ as the main component, which have a boiling point within a range from 70 to 180° C. and preferably from 80 to 160° C. A fluorine-based inert liquid having a boiling point within the above-mentioned range is advantageous in that the removal of the immersion medium after the exposure can be conducted by a simple method.

As a fluorine-based inert liquid, a perfluoroalkyl compound in which all of the hydrogen atoms of the alkyl group are substituted with fluorine atoms is particularly desirable. Examples of these perfluoroalkyl compounds include perfluoroalkylether compounds and perfluoroalkylamine compounds.

Specifically, one example of a suitable perfluoroalkylether compound is perfluoro(2-butyl-tetrahydrofuran) (boiling point 102° C.), and an example of a suitable perfluoroalkylamine compound is perfluorotributylamine (boiling point 174° C.).

As the immersion medium, water is preferable in terms of cost, safety, environment and versatility.

EXAMPLES

As follows is a more detailed description of the present invention based on a series of examples, although the scope of the present invention is in no way limited by these examples.

In the following examples, a unit represented by a chemical formula (1) is designated as "compound (1)" or "polymeric compound (1)", and the same labeling system applies for compounds represented by other formulas.

In the NMR analysis, the internal standard for $^1$H-NMR and for $^{13}$C-NMR is tetramethylsilane (TMS). The internal standard for $^{19}$F-NMR is hexafluorobenzene (the peak of hexafluorobenzene was regarded as −160 ppm).

Polymeric compounds (G)-1 to (G)-13 were synthesized in accordance with the method described in examples of US2010-55606A 1.

Synthesis methods for polymeric compounds (G)-14 to (G)-16 are as follows.

Polymer Synthesis Examples

Synthesis of Polymeric Compounds (G)-14 to (G)-16)

Production Example 1

Trunk Polymer (Synthesis of Polymer (G0)-1)

Production Example 1-1

Introduction of Chloroethyl Acetal Group

In a nitrogen atmosphere, to 30.0 g of monodisperse p-hydroxystyrene polymer (hereafter, abbreviated as "PHS") having Mn=2,700 and Mw/Mn=1.06, 270.0 g of tetrahydrofuran (hereafter, abbreviated as "THF") and 9.0 g of sodium hydride were added. 35.4 g of 2-chloroethyl chloromethyl ether was then dropwise added thereto with stirring in an ice-cold bath over 20 minutes, and the resulting mixture was further kept at 30° C. for 4 hours with stirring. Thereafter, ethyl acetate was added to the reaction mixture, and the resulting organic layer was washed five times with an aqueous oxalic acid solution and ion exchanged water. Then, the obtained organic layer was concentrated under reduced pressure, thereby yielding a polymer represented by formula (01) shown below in the form of a 50 wt. % methyl isobutyl ketone (hereafter, abbreviated as "MIBK") solution.

[Chemical Formula 84]

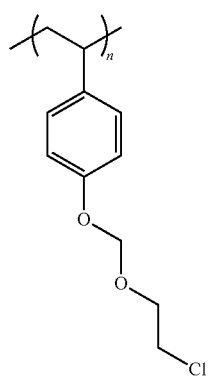

(01)

[Mn = 5,600, Mw/Mn = 1.04]

Production Example 1-2

Conversion to Bromine

In a nitrogen atmosphere, to 48.0 g of the polymer solution obtained in Production Example 1-1, 552.0 g of hexamethyl phosphoric acid triamide (hereafter, abbreviated as "HMPA"), 123.0 g of bromoethane and 2.3 g of sodium bromide were added, followed by stirring for 4 hours while maintaining the temperature at 80° C. Thereafter, the reaction mixture was concentrated under reduced pressure. To the obtained concentrated mixture, 123.0 g of bromoethane was newly added, and the resulting mixture was kept at 80° C. for 4 hours with stirring. Thereafter, the reaction mixture was concentrated under reduced pressure, and toluene was added to the obtained concentrated mixture. Then, the resulting organic layer was washed four times with ion exchanged water. Then, the organic layer was dried by adding anhydrous magnesium sulfate thereto. After filtration, the filtrate was concentrated under reduced pressure, thereby yielding a polymer (G0)-1 represented by formula (G0)-1 shown below, which was to serve as a trunk portion of a comb polymer, in the form of a 40 wt. % toluene solution.

[Chemical Formula 85]

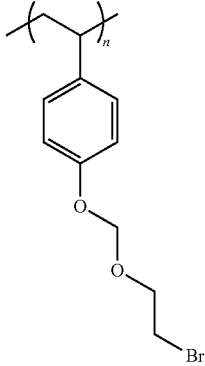

(G0)-1

[Mn = 5,600, Mw/Mn = 1.04]

Production Example 2

Comb Polymer (Synthesis of Polymer (G)-14)

Production Example 2-1

Synthesis of Branch Polymer and Synthesis of Acid Decomposable Polymer

Under a nitrogen atmosphere, 384.2 g of THF was cooled to −60° C. 74 mmol of s-butyl lithium was added thereto with stirring while maintaining the temperature at −60° C. Then, 73.3 g of p-(1-ethoxyethoxy)styrene (hereafter, abbreviated as "PEES") was dropwise added thereto over 50 minutes with stirring while maintaining the temperature at −60° C., and the reaction was further continued for 1 hour. At this stage, a small amount of the reaction solution was collected, and the reaction was terminated by the addition of methanol. Then, an analysis was conducted by gel permeation chromatography (hereinafter abbreviated as "GPC"). As a result, the obtained PEES polymer was a monodisperse polymer having Mn=990 and Mw/Mn=1.24 (in terms of the polystyrene equivalent values).

Subsequently, while maintaining the temperature of the reaction system at −60° C., 56.9 g of the solution of the polymer (G0)-1 obtained in Production Example 1-2 was dropwise added thereto over 40 minutes.

The reaction was further continued for 1 hour, and the reaction was then terminated by adding methanol to the reaction system, followed by an analysis conducted by GPC. As a result, the obtained acid decomposable polymer was a monodisperse polymer having Mn=14,500 and Mw/Mn=1.03 (in terms of the polystyrene equivalent values).

Since an increase in the molecular weight was observed before and after the reaction with the polymer represented by formula (G0)-1 while the acid decomposable polymer retained a monodisperse state, it was confirmed that a polymer having a comb shape was obtained as designed.

Production Example 2-2

Hydrolysis of PEES (Removal of Protecting Group)

To the polymerization solution obtained in Production Example 2-1, MIBK was added, and the resulting organic layer was washed twice with ion exchanged water. Thereafter, the organic layer was subjected to a concentration operation under reduced pressure to prepare an MIBK solution with a polymer content of 40% by weight, and the resulting solution was further prepared into a solution with a polymer content of 20% by weight by the addition of isopropyl alcohol (hereinafter abbreviated as "IPA").

To 100 parts by weight of this solution, 0.1 parts by weight of oxalic acid dihydrate and 9 parts by weight of ion exchanged water were added, followed by heating to 50° C. Thereafter, the reaction was further continued for 7 hours with continuous stirring while maintaining the temperature at 50° C. In this reaction, analytical results of the polymer by $^{13}$C-NMR obtained before and after the reaction were compared. Absorptions attributed to a PEES polymer observed at about 117 ppm and 100 ppm disappeared after the reaction, and an absorption attributed to PHS was newly observed at about 115 ppm. Furthermore, it was confirmed that a peak attributed to the O—CH$_2$—O bond observed at about 94 ppm was retained before and after the hydrolysis. Further, a measurement was conducted by GPC with respect to the polymer after the reaction. As a result, Mn was 10,900 (in terms of the polystyrene equivalent value), and no great change in the peak shape was observed before and after the reaction. From the observations described above, it was confirmed that the hydrolysis reaction was conducted as designed to obtain an alkenylphenol-type polymer containing a PHS segment as a main skeleton, and also that the O—CH$_2$—O bond introduced into the main chain skeleton was retained, thereby retaining the comb shape.

Production Example 2-3

Introduction of Methyl Adamantyl Acetate Group

To the polymer solution obtained in Production Example 2-2, MIBK was added, and the resulting organic layer was washed three times with ion exchanged water. Thereafter, the organic layer was concentrated under reduced pressure to prepare a solution with a polymer content of 40% by weight, and then the resulting solution was further prepared into a solution with a polymer content of 10% by weight of a polymer by the addition of acetone.

To 160.0 g of the obtained polymer solution, 5.1 g of potassium carbonate was added, and the resulting mixture was kept at 50° C. for 30 minutes with stirring. Then, 7.97 g of methyl adamantyl iodoacetate was added to this solution, and the reaction was further continued at 50° C. for 5 hours.

MIBK was then added to the reaction system, and the resulting organic layer was washed once with an aqueous oxalic acid solution, and then washed three times with ion exchanged water. Thereafter, the organic layer was replaced with a PGMEA solution though a concentration operation under reduced pressure.

With respect to the obtained polymer, a measurement by $^{13}$C-NMR was conducted. As a result, absorptions attributed to a unit (hereafter, referred to as PHS-OAdE) in which a methyl adamantyl acetate group was introduced into PHS were newly observed at about 89 ppm, 114 ppm and 169 ppm.

Further, the ratio between the PHS unit and PHS-OAdE was 75/25. Further, it was confirmed that a peak at about 94 ppm attributed to the —O—CH$_2$—O— bond introduced into the main chain skeleton was retained. Furthermore, a measurement was conducted by GPC with respect to the polymer after the reaction. As a result, it became clear that the polymer was a monodisperse polymer having Mn=12,800 and Mw/Mn=1.03 (in terms of the polystyrene equivalent value), and no change in the peak shape was observed before and after the reaction. From the results shown above, it was confirmed that the introduction of methyl adamantyl acetate groups was conducted as designed to obtain an alkenylphenol-type polymer containing a PHS/PHS-OAdE segment as a main skeleton, and that the O—CH$_2$—O bond introduced into the main chain skeleton was retained, thereby retaining the comb shape.

The structure of the polymer (hereafter, abbreviated as polymer (G)-14) obtained in Production Example 2-3 described above is shown below. In chemical formulas shown below, each of the subscript numerals at the lower right of the brackets ( ) indicate the amount (mol %; compositional ratio) of the respective structural units, based on the combined total of all structural units constituting the polymer chain serving as a branch portion of this polymer, and each amount was calculated by $^{13}$C-NMR. The formula (G)-14 shown below indicates that the carbon atoms of the ethylene group in the trunk polymer are bonded to the ends of the main chain in the units (a1) and (a2) of the branch polymer.

[Chemical Formula 86]

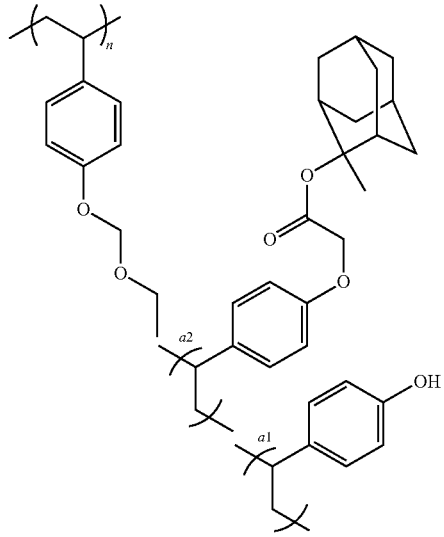

(G)-14

[n = 100; (a1)/(a2) = 75/25 (molar ratio); Mn = 12,800, Mw/Mn = 1.08]

Production Example 3

Trunk Polymer (Synthesis of Polymers (G0)-2 to (G0)-3)

Production Examples 3-1 to 3-2

Introduction of Chloroethyl Acetal Group

In a nitrogen atmosphere, to 40.0 g of monodisperse PHS having Mn=2,700 and Mw/Mn=1.06, 360.0 g of THF and sodium hydride (in the amounts indicated in Table 1 below) were added. 2-Chloroethyl chloromethyl ether was then dropwise added thereto in the amounts indicated in Table 1 below with stirring in an ice-cold bath over 20 minutes, and the resulting mixture was further kept at 30° C. for 4 hours with stirring.

TABLE 1

|  | Amount of sodium hydride added | Amount of 2-chloroethylchloromethyl ether added dropwise |
|---|---|---|
| Production Example 3-1 | 3.6 g | 13.8 g |
| Production Example 3-2 | 8.4 g | 32.6 g |

Thereafter, MIBK was added to the reaction mixture, and the resulting organic layer was washed five times with an aqueous oxalic acid solution and ion exchanged water. Then, the obtained organic layer was concentrated under reduced pressure, thereby yielding a polymer represented by formula (03) and Table 2 shown below in the form of a 50 wt. % MIBK solution.

[Chemical Formula 87]

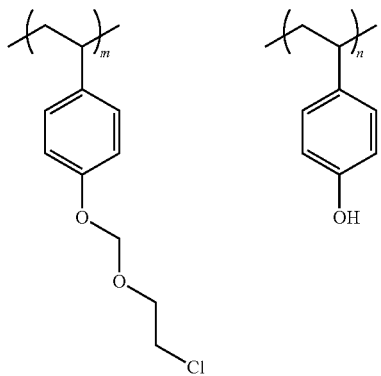

(03)

TABLE 2

|  | Mn | Mw/Mn | m/n (molar ratio) |
|---|---|---|---|
| Production Example 3-1 | 3,900 | 1.07 | 30/70 |
| Production Example 3-2 | 5,200 | 1.06 | 70/30 |

Production Examples 3-3 to 3-4

Conversion to Bromine

In a nitrogen atmosphere, to 50.0 g of the polymer solution obtained in Production Example 3-1 or Production Example 3-2, HMPA, bromoethane and sodium bromide were added in the amounts indicated in Table 3 below, followed by stirring for 6 hours while maintaining the temperature at 80° C.

TABLE 3

|  | Polymer solution used | Amount of HMPA added | Amount of bromoethane added | Amount of sodium bromide added |
|---|---|---|---|---|
| Production Example 3-3 | Production Example 3-1 | 575.0 g | 184.2 g | 3.5 g |
| Production Example 3-4 | Production Example 3-1 | 575.0 g | 147.3 g | 2.8 g |

Thereafter, the reaction mixture was concentrated under reduced pressure. To the obtained concentrated mixture, bromoethane was newly added in the amount indicated in Table 4 below, and the resulting mixture was kept at 80° C. for 6 hours with stirring.

TABLE 4

|  | Amount of bromoethane added |
|---|---|
| Production Example 3-3 | 184.2 g |
| Production Example 3-4 | 147.3 g |

Thereafter, the reaction mixture was concentrated under reduced pressure, and MIBK was added to the obtained concentrated mixture. Then, the resulting organic layer was washed four times with ion exchanged water. Then, the organic layer was concentrated under reduced pressure, and the obtained polymer solution was reprecipitated with n-hexane. The obtained polymer powder was dried under reduced pressure, thereby yielding a polymer represented by formula (04) and Table 5 shown below.

TABLE 5

[Chemical Formula 88]

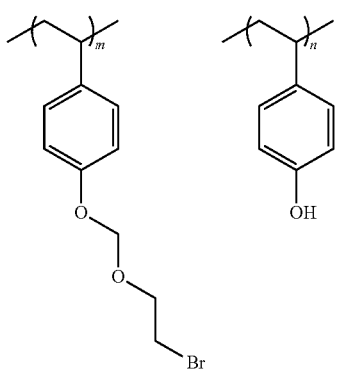

(04)

|  | Mn | Mw/Mn | m/n (molar ratio) |
|---|---|---|---|
| Production Example 3-3 | 2,900 | 1.36 | 30/70 |
| Production Example 3-4 | 3,800 | 1.40 | 70/30 |

Production Examples 3-5 to 3-6

Introduction of Ethoxyethyl Group

In a nitrogen atmosphere, to 20.0 g of the polymer obtained in Production Example 3-3 or Production Example 3-4, THF, trifluoroacetic acid and ethyl vinyl ether were added in the amounts indicated in Table 6 below, followed by stirring for 5 hours while maintaining the temperature at 30° C.

TABLE 6

| | Polymer solution used | Amount of THF added | Amount of trifluoroacetic acid added | Amount of ethylvinyl ether added |
|---|---|---|---|---|
| Production Example 3-5 | Production Example 3-3 | 46.7 g | 1.1 g | 8.0 g |
| Production Example 3-6 | Production Example 3-4 | 46.7 g | 0.7 g | 4.0 g |

Thereafter, the reaction was terminated by adding triethylamine to the reaction liquid. Then, toluene was added thereto, and the resulting organic layer was washed four times with ion exchanged water. Then, the organic layer was dried by adding anhydrous magnesium sulfate thereto. After filtration, the filtrate was concentrated under reduced pressure, thereby yielding a polymer (G0)-2 or (G0)-3 represented by formula (G0)-2 or (G0)-3 and Table 7 shown below, which was to serve as a trunk portion of a comb polymer, in the form of a 40 wt. % toluene solution.

TABLE 7

[Chemical Formula 89]

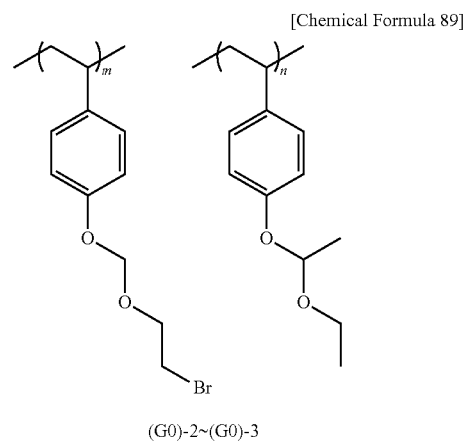

(G0)-2~(G0)-3

| | Polymer name | Mn | Mw/Mn | m/n (molar ratio) |
|---|---|---|---|---|
| Production Example 3-5 | (G0)-2 | 5,700 | 1.64 | 30/70 |
| Production Example 3-6 | (G0)-3 | 3,200 | 1.94 | 70/30 |

Production Example 4

Comb Polymers (Production of Polymers (G)-15 to (G)-16)

Production Examples 4-1 to 4-2

Synthesis of Branch Polymer and Synthesis of Acid Decomposable Polymer

Under a nitrogen atmosphere, 179.8 g of THF was cooled to −60° C. 42 mmol of s-butyl lithium was added thereto with stirring while maintaining the temperature at −60° C. Then, 40.5 g of PEES was dropwise added to this reaction solution over 30 minutes with stirring while maintaining the temperature at −60° C., and the reaction was further continued for 1 hour. At this stage, a small amount of the reaction solution was collected, and the reaction was terminated by the addition of methanol. Then, an analysis was conducted by GPC. As a result, the obtained PEES polymer was a monodisperse polymer having Mn=970 and Mw/Mn=1.22 (in terms of the polystyrene equivalent values).

Subsequently, while maintaining the temperature of the reaction system at −60° C., the solution of the polymer (G0)-2 obtained in Production Example 3-5 or the solution of the polymer (G0)-3 obtained in Production Example 3-6 was dropwise added thereto over 40 minutes in the amount indicated in Table 8 below.

TABLE 8

| | Polymer used | Amount of polymer solution added dropwise |
|---|---|---|
| Production Example 4-1 | (G0)-2 | 86.4 g |
| Production Example 4-2 | (G0)-3 | 42.7 g |

The reaction was further continued for 1 hour, and the reaction was then terminated by adding methanol to the reaction system, followed by an analysis conducted by GPC, thereby yielding a monodisperse, acid decomposable polymer indicated in Table 9 below.

TABLE 9

| | Mn | Mw/Mn |
|---|---|---|
| Production Example 4-1 | 9,500 | 1.08 |
| Production Example 4-2 | 12,900 | 1.05 |

Since an increase in the molecular weight was observed before and after the reaction with the trunk polymer while the acid decomposable polymer retained a monodisperse state, it was confirmed that a polymer having a comb shape was obtained as designed.

Production Examples 4-3 to 4-4

Hydrolysis of PEES (Removal of Protecting Group)

MIBK was added to the polymerization solutions obtained in Production Example 4-1 and Production Example 4-2, and the resulting organic layers were washed twice with ion exchanged water. The organic layers were then subjected to a concentration operation under reduced pressure to prepare MIBK solutions with a polymer content of 40% by weight, and the resulting solutions were further prepared into solutions with a polymer content of 20% by weight by the addition of IPA.

To 100.0 g of these solutions, 0.5 g of oxalic acid dihydrate and 10.0 g of ion exchanged water were added, followed by heating to 50° C. The reaction was further continued for 1 hour with stirring while maintaining the temperature of these reaction solutions at 50° C. Further, a GPC analysis was conducted with respect to the polymers after the reaction. As a result, it was confirmed that polymers indicated in Table 10 below were obtained.

TABLE 10

|  | Polymer solution used | Mn | Mw/Mn |
| --- | --- | --- | --- |
| Production Example 4-3 | Production Example 4-1 | 6,400 | 1.10 |
| Production Example 4-4 | Production Example 4-2 | 9,500 | 1.09 |

Further, in these reactions, analytical results of the polymers by $^{13}$C-NMR obtained before and after the reactions were compared. Absorptions attributed to a PEES polymer observed at about 117 ppm and 100 ppm disappeared after the reaction, and an absorption attributed to a p-hydroxystyrene polymer was newly observed at about 115 ppm. Furthermore, it was confirmed that a peak attributed to the O—$CH_2$—O bond observed at about 94 ppm was retained before and after the hydrolysis. Further, a measurement was conducted by GPC with respect to the polymer after the reaction. As a result, no great change in the peak shape was observed before and after the reaction. As is apparent from the observations described above, the hydrolysis reaction was conducted as designed to obtain an alkenylphenol-type polymer containing a PHS segment as a main skeleton. Furthermore, it was also confirmed that the O—$CH_2$—O bond introduced into the main chain skeleton was retained, thereby retaining the comb shape.

Production Examples 4-5 to 4-6

Introduction of Methyl Adamantyl Acetate Group

MIBK was added to the polymer solution obtained in Production Example 4-3 or Production Example 4-4, and the resulting organic layer was washed three times with ion exchanged water. Thereafter, the organic layer was concentrated under reduced pressure to prepare a solution with a polymer content of 40% by weight, and then the resulting solution was further prepared into a solution with a polymer content of 10% by weight by the addition of acetone.

To 200.0 g of the obtained polymer solution, potassium carbonate was added in the amount indicated in Table 11 below, and the resulting mixture was kept at 55° C. for 30 minutes with stirring. Then, methyl adamantyl iodoacetate was added to this solution in the amount indicated in Table 11, and the reaction was further continued at 55° C. for 5 hours.

TABLE 11

|  | Polymer solution used | Amount of potassium carbonate added | Amount of methyl adamantyl iodoacetate added |
| --- | --- | --- | --- |
| Production Example 4-5 | Production Example 4-3 | 6.0 g | 9.5 g |
| Production Example 4-6 | Production Example 4-4 | 5.8 g | 9.0 g |

MIBK was then added to the reaction system, and the resulting organic layer was washed once with an aqueous oxalic acid solution, and then washed three times with ion exchanged water. Thereafter, the organic layer was replaced with a PGMEA solution through a concentration operation under reduced pressure.

With respect to the obtained polymer, a measurement by $^{13}$C-NMR was conducted. As a result, absorptions attributed to the PHS-OAdE unit were newly observed at about 89 ppm, 114 ppm and 169 ppm.

Furthermore, it was confirmed that a peak at about 94 ppm attributed to the O—$CH_2$—O bond introduced into the main chain skeleton was retained. Further, the ratio between the PHS unit and PHS-OAdE was as shown in Table 12 below. Furthermore, a measurement was conducted by GPC with respect to the polymer after the reaction. As a result, the polymer was a monodisperse polymer as indicated in Table 12, and no change in the peak shape was observed before and after the reaction.

TABLE 12

|  | PHS/PHS-OAdE | Mn | Mw/Mn |
| --- | --- | --- | --- |
| Production Example 4-5 | 75/25 | 7,100 | 1.18 |
| Production Example 4-6 | 75/25 | 10,000 | 1.21 |

From the observations described above, it was confirmed that the introduction of a methyl adamantyl acetate group was conducted as designed to obtain an alkenylphenol-type polymer containing a PHS/PHS-OAdE segment as a main skeleton, and that the O—$CH_2$—O bond introduced into the main chain skeleton was retained, thereby retaining the comb shape.

The structure of the obtained comb polymer is shown below. In the chemical formula shown below, each of the subscript numerals at the lower right of the brackets ( ) indicate the amount (mol %; composition ratio) of the respective structural units constituting the polymer, and each amount was calculated by $^{13}$C-NMR. The formula shown below indicates that the carbon atoms of the ethylene group in the (b3) unit of the trunk polymer are bonded to the ends of the main chain in the units (a 1) and (a2) of the branch polymer.

TABLE 13

[Chemical Formula 90]

|  | Polymer name | (a1 + b1)/(a2 + b2) | b3/(b1 + b2) |
|---|---|---|---|
| Production Example 4-5 | (G)-15 | 75/25 | 30/70 |
| Production Example 4-6 | (G)-16 | 75/25 | 70/30 |

[(a1 + b1)/(a2 + b2) = (molar ratio; refer to Table 13)]
[(b1 + b2)/b3 = (molar ratio; refer to Table 13)]

<Preparation of Resist Compositions>

Examples 1 to 27, Comparative Examples 1 to 5

The components shown in Table 14 were mixed together and dissolved to obtain positive resist composition solutions.

TABLE 14

|  | Component (A) | Component (G) | Component (S) | |
|---|---|---|---|---|
| Comp. Ex. 1 | (A)-1 [100] | — | (S)-1 [2] | (S)-2 [5,390] |
| Comp. Ex. 2 | (A)-2 [100] | — | (S)-1 [2] | (S)-2 [5,390] |
| Comp. Ex. 3 | (A)-3 [100] | — | (S)-1 [2] | (S)-2 [5,390] |
| Example 1 | (A)-1 [90] | (G)-1 [10] | (S)-1 [2] | (S)-2 [5,390] |
| Example 2 | (A)-1 [80] | (G)-1 [20] | (S)-1 [2] | (S)-2 [5,390] |
| Example 3 | (A)-2 [90] | (G)-1 [10] | (S)-1 [2] | (S)-2 [5,390] |
| Example 4 | (A)-2 [80] | (G)-1 [20] | (S)-1 [2] | (S)-2 [5,390] |
| Example 5 | (A)-3 [90] | (G)-2 [10] | (S)-1 [2] | (S)-2 [5,390] |
| Example 6 | (A)-3 [80] | (G)-2 [20] | (S)-1 [2] | (S)-2 [5,390] |
| Example 7 | (A)-3 [90] | (G)-1 [10] | (S)-1 [2] | (S)-2 [5,390] |
| Example 8 | (A)-3 [80] | (G)-1 [20] | (S)-1 [2] | (S)-2 [5,390] |
| Example 9 | (A)-3 [90] | (G)-3 [10] | (S)-1 [2] | (S)-2 [5,390] |
| Example 10 | (A)-3 [80] | (G)-3 [20] | (S)-1 [2] | (S)-2 [5,390] |
| Example 11 | (A)-3 [90] | (G)-4 [10] | (S)-1 [2] | (S)-2 [5,390] |
| Example 12 | (A)-3 [80] | (G)-4 [20] | (S)-1 [2] | (S)-2 [5,390] |
| Example 13 | (A)-3 [90] | (G)-5 [10] | (S)-1 [2] | (S)-2 [5,390] |
| Example 14 | (A)-3 [80] | (G)-5 [20] | (S)-1 [2] | (S)-2 [5,390] |
| Example 15 | (A)-3 [90] | (G)-6 [10] | (S)-1 [2] | (S)-2 [5,390] |
| Example 16 | (A)-3 [80] | (G)-6 [20] | (S)-1 [2] | (S)-2 [5,390] |
| Example 17 | (A)-3 [90] | (G)-7 [10] | (S)-1 [2] | (S)-2 [5,390] |
| Example 18 | (A)-3 [80] | (G)-7 [20] | (S)-1 [2] | (S)-2 [5,390] |
| Example 19 | (A)-3 [80] | (G)-8 [20] | (S)-1 [2] | (S)-2 [5,390] |
| Example 20 | (A)-3 [80] | (G)-9 [20] | (S)-1 [2] | (S)-2 [5,390] |
| Example 21 | (A)-3 [80] | (G)-10 [20] | (S)-1 [2] | (S)-2 [5,390] |
| Example 22 | (A)-3 [80] | (G)-11 [20] | (S)-1 [2] | (S)-2 [5,390] |
| Example 23 | (A)-3 [80] | (G)-12 [20] | (S)-1 [2] | (S)-2 [5,390] |
| Example 24 | (A)-3 [80] | (G)-13 [20] | (S)-1 [2] | (S)-2 [5,390] |
| Example 25 | (A)-3 [80] | (G)-14 [20] | (S)-1 [2] | (S)-2 [5,390] |
| Example 26 | (A)-3 [80] | (G)-15 [20] | (S)-1 [2] | (S)-2 [5,390] |
| Example 27 | (A)-3 [80] | (G)-16 [20] | (S)-1 [2] | (S)-2 [5,390] |

TABLE 14-continued

|  | Component (A) | Component (G) | Component (S) | |
|---|---|---|---|---|
| Comp. Ex. 4 | (A)-3 [80] | (G)-17 [20] | (S)-1 [2] | (S)-2 [5,390] |
| Comp. Ex. 5 | (A)-3 [80] | (G)-18 [20] | (S)-1 [2] | (S)-2 [5,390] |

In Table 14, the reference characters indicate the following. Further, the values in brackets [ ] indicate the amount (in terms of parts by weight) of the component added. The "average arm length" is attributable to the $^{13}$C-NMR spectrum, and the term refers to the average value of the number of two different types of structural units combined, each of which forming 4 or 6 arms.

(A)-1: a polymeric compound (A)-1 represented by formula (A)-1 shown below [Mw=about 4,000, Mw/Mn=about 1.9, l/m/n/o=34.9/36.0/16.8/12.3]

(A)-2: a polymeric compound (A)-2 represented by formula (A)-2 shown below [Mw=about 4,000, Mw/Mn=about 1.9, l/m/n=45.0/42.0/13.0]

(A)-3: a polymeric compound (A)-3 represented by formula (A)-3 shown below [Mw=about 4,000, Mw/Mn=about 1.9, l/m/n/o=36.1/39.6/16.1/8.2]

(G)-1: represented by formula (G1-7) shown below (protection rate: 24.3 mol %; average arm length: 6.6-mer; Mw=3,700; Mw/Mn=1.13)

(G)-2: represented by formula (G1-7) shown below (protection rate: 25.3 mol %; average arm length: 4.2-mer; Mw=2,800; Mw/Mn=1.13)

(G)-3: represented by formula (G1-7) shown below (protection rate: 26.1 mol %; average arm length: 8.8-mer; Mw=4,600; Mw/Mn=1.18)

(G)-4: represented by formula (G1-7) shown below (protection rate: 14.7 mol %; average arm length: 9.5-mer; Mw=4,200; Mw/Mn=1.13)

(G)-5: represented by formula (G1-7) shown below (protection rate: 28.0 mol %; average arm length: 11.6-mer; Mw=5,400; Mw/Mn=1.16)

(G)-6: represented by formula (G1-7) shown below (protection rate: 27.4 mol %; average arm length: 20.0-mer; Mw=7,000; Mw/Mn=1.19)

(G)-7: represented by formula (G1-7) shown below (protection rate: 26.4 mol %; average arm length: 24.7-mer; Mw=8,700; Mw/Mn=1.21)

(G)-8: represented by formula (G8-13) shown below (protection rate: 15.7 mol %; average arm length: 6.8-mer; Mw=4,800; Mw/Mn=1.12)

(G)-9: represented by formula (G8-13) shown below (protection rate: 26.2 mol %; average arm length: 7.1-mer; Mw=5,200; Mw/Mn=1.10)

(G)-10: represented by formula (G8-13) shown below (protection rate: 35.5 mol %; average arm length: 7.8-mer; Mw=5,600; Mw/Mn=1.11)

(G)-11: represented by formula (G8-13) shown below (protection rate: 15.0 mol %; average arm length: 5.1-mer; Mw=3,900; Mw/Mn=1.12)

(G)-12: represented by formula (G8-13) shown below (protection rate: 24.4 mol %; average arm length: 5.3-mer; Mw=4,300; Mw/Mn=1.11)

(G)-13: represented by formula (G8-13) shown below (protection rate: 35.3 mol %; average arm length: 5.3-mer; Mw=4,600; Mw/Mn=1.10)

(G)-14 to (G)-16: the aforementioned polymeric compounds (G)-14 to (G)-16

(G)-17: a polymeric compound represented by formula (G)-17 shown below [Mw=7,300, Mw/Mn=1.06]

(G)-18: a polymeric compound represented by formula (G)-18 shown below [Mw=8,000, Mw/Mn=1.80]

(S)-1: γ-butyrolactone (S)-2: a mixed solvent of PGMEA/PGME/cyclohexanone=41/36/23 (weight ratio)

[Chemical Formula 91]

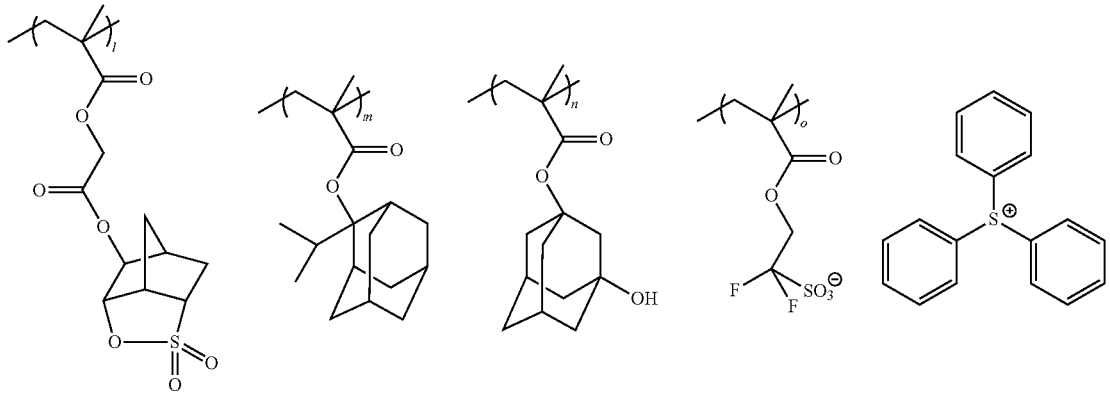

(A)-1

[Chemical Formula 92]

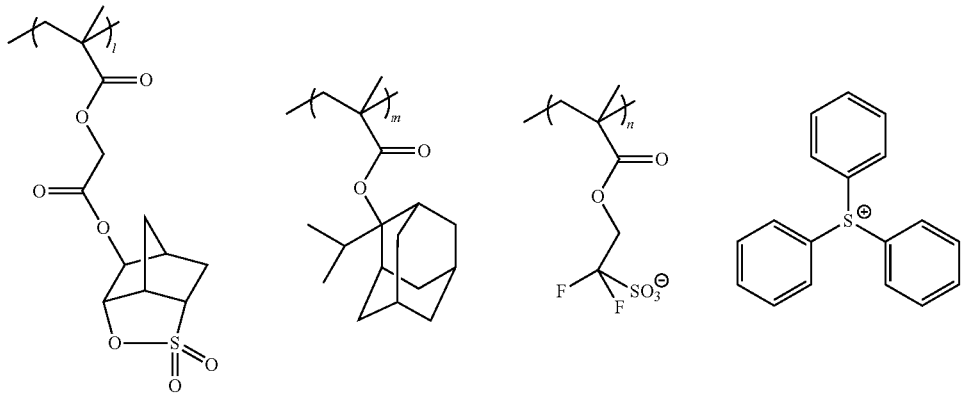

(A)-2

[Chemical Formula 93]
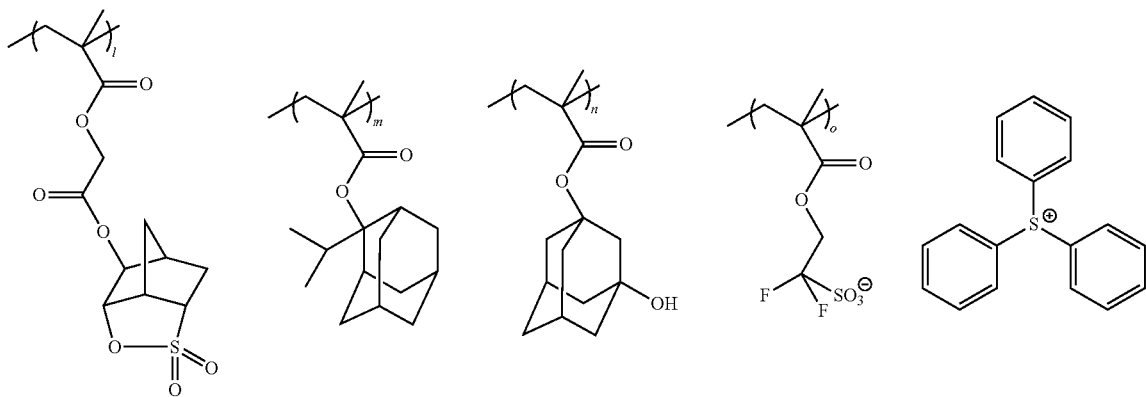
(A)-3
[Chemical Formula 94]
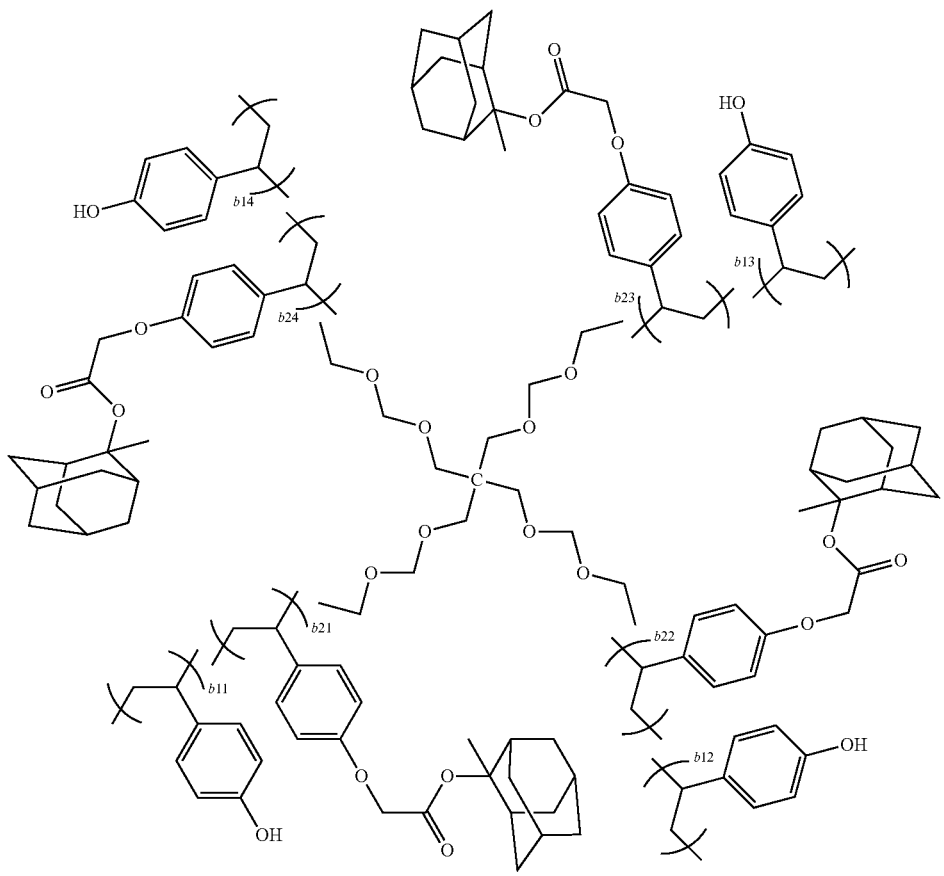
(G1-7)
(G)-1~(G)-7
[(b11 + b12 + b13 + b14)/(b21 + b22 + b23 + b24) = (molar ratio); the amount (b21 + b22 + b23 + b24) indicates the protection rate]

-continued
[Chemical Formula 95]
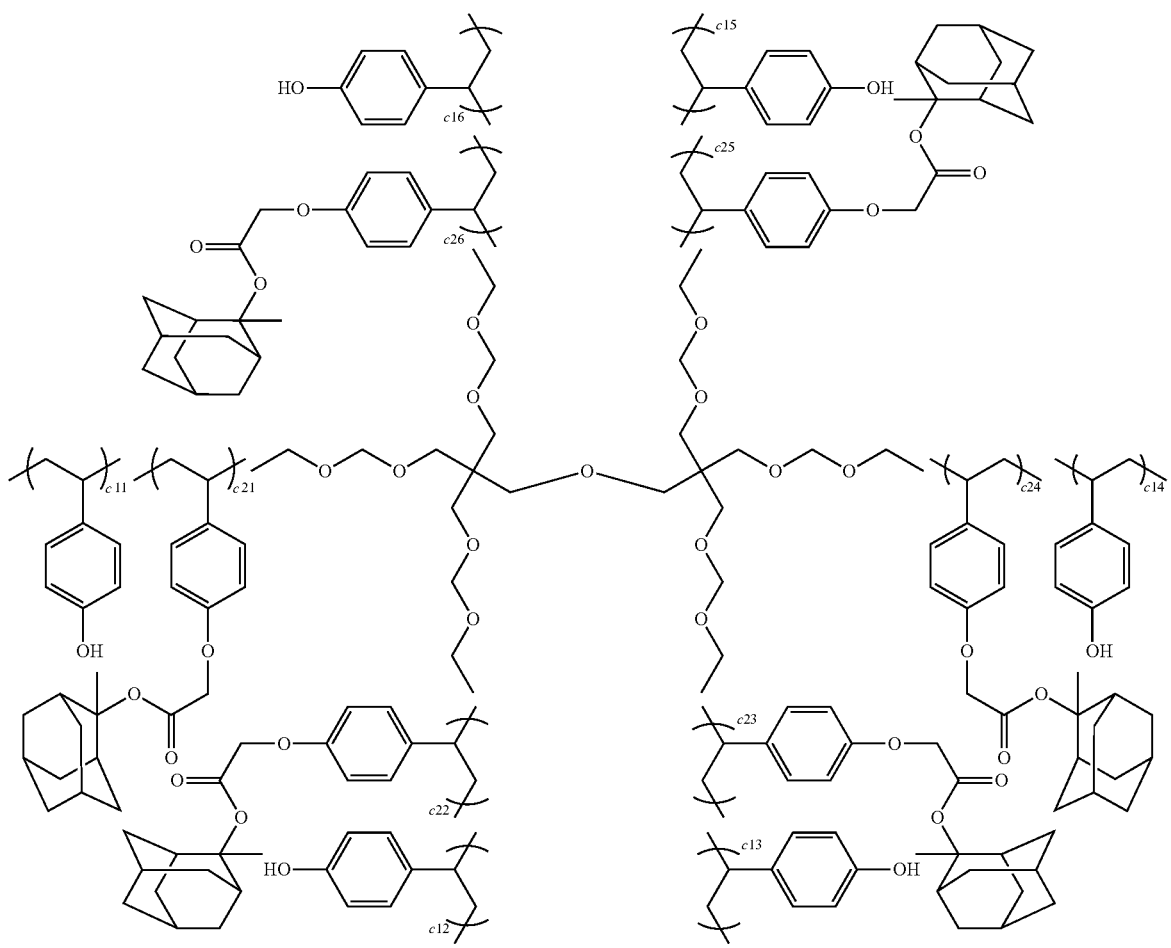
(G8-13)
(G)-8~(G)-13
[(c11 + c12 + c13 + c14 + c15 + c16)/(c21 + c22 + c23 + c24 + c25 + c26) = (molar ratio); the amount (c21 + c22 + c23 + c24 + c25 + c26) indicates the protection rate]
[Chemical Formula 96]     [Chemical Formula 97]
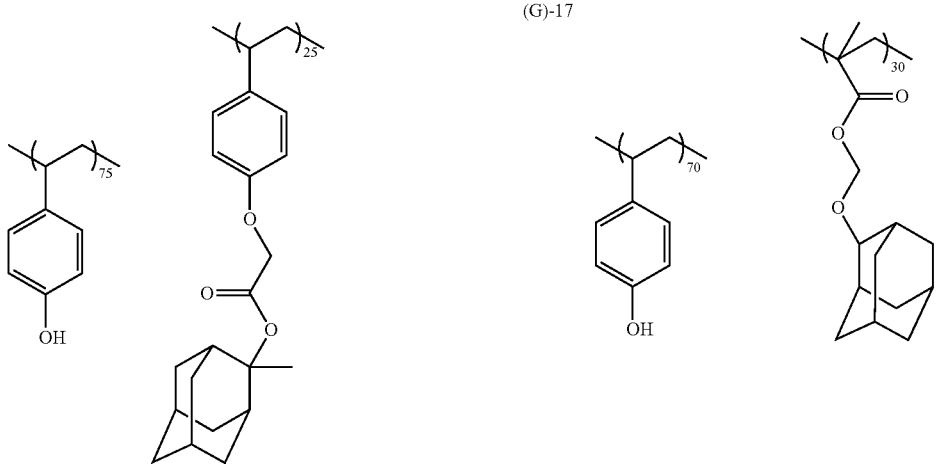
(G)-17     (G)-18

<Formation of Resist Pattern>[Sensitivity]

Using the obtained positive resist compositions, the resolution was evaluated.

Using a spinner, each of the positive resist composition solutions obtained in the respective Examples was uniformly applied onto an 8-inch silicon wafer that had been treated with hexamethyldisilazane (HMDS) at 90° C. for 36 seconds, followed by a bake treatment (PAB) at temperatures indicated in Table 15 for 60 seconds, thus forming resist films with a film thickness of 60 nm.

The thus obtained resist film was then subjected to direct patterning (exposure) with an electron beam lithography apparatus HL-800D (VSB) (manufactured by Hitachi, Ltd.) at an acceleration voltage of 70 kV, followed by a bake treatment (PEB) treatment at temperatures indicated in Table 15 for 60 seconds. The resist film was then developed for 30 seconds in a 2.38% by weight aqueous tetramethylammonium hydroxide (TMAH) solution (product name: NMD-3, manufactured by Tokyo Ohka Kogyo Co., Ltd.) at 23° C., and then rinsed with pure water for 15 seconds and shaken dry.

As a result, in each of the examples, a 1:1 space and line (S/L) pattern having a space width of 100 nm and a pitch of 200 nm was formed in the resist film. Further, the optimum exposure dose Eop ($\mu C/cm^2$) was determined. The results are shown in Table 15.

[Line Edge Roughness (LER)]

With respect to each of the S/L patterns, the deviation of the size of the lines was evaluated.

More specifically, the line widths of 16 lines were measured using a measuring scanning electron microscope (SEM) (acceleration voltage: 800V; product name: S-9220, manufactured by Hitachi, Ltd.), and from the results, the value of 3 times the standard deviation s (i.e., 3s) was determined.

The smaller this 3s value is, the lower the level of roughness, indicating an S/L pattern with a uniform width.

[Evaluation of Exposure Margin (EL Margin)]

At the Eop value described above, the exposure doses with which lines from the S/L pattern were able to be formed within a range of 10% from the target dimension (in terms of line width of 100 nm) (namely, within a range from 90 to 110 nm) were determined, and the EL margin (unit: %) was determined using the following formula. The results are shown in Table 15.

EL margin (%)=(|E1−E2|/Eop)×100

E1: exposure dose ($\mu C/cm^2$) for forming an S/L pattern with a space width of 90 nm E2: exposure dose ($\mu C/cm^2$) for forming an S/L pattern with a space width of 110 nm The larger the value of EL margin, the smaller the fluctuation in the pattern size accompanied by the variation in the exposure dose.

[Resolution]

The critical resolution (nm) at the above Eop value was determined using a scanning electron microscope S-9220 (manufactured by Hitachi, Ltd.). The results are shown in Table 15.

TABLE 15

| | PAB (° C.) | PEB (° C.) | Eop ($\mu C/cm^2$) | LER (nm) | EL ± 10% | Resolution (nm) |
|---|---|---|---|---|---|---|
| Comp. Ex. 1 | 110 | 100 | 71.7 | 6.1 | 21.3 | 70 |
| Example 1 | 110 | 100 | 56.8 | 6.5 | 21.2 | 70 |
| Example 2 | 110 | 100 | 46.4 | 6.6 | 22.2 | 60 |
| Comp. Ex. 2 | 100 | 90 | 73.3 | 8.7 | 15.1 | 60 |
| Example 3 | 100 | 90 | 54.0 | 9.9 | 10.5 | 60 |
| Example 4 | 100 | 90 | 46.3 | 7.9 | 23.1 | 60 |
| Comp. Ex. 3 | 120 | 105 | 62.4 | 5.8 | 25.8 | 70 |
| Example 5 | 120 | 105 | 45.2 | 7.4 | 25.2 | 70 |
| Example 6 | 120 | 105 | 34.5 | 8.4 | 24.0 | 70 |
| Example 7 | 120 | 105 | 47.8 | 6.8 | 25.0 | 70 |
| Example 8 | 120 | 105 | 38.4 | 7.7 | 24.0 | 70 |
| Example 9 | 120 | 105 | 47.3 | 7.3 | 24.1 | 70 |
| Example 10 | 120 | 105 | 39.8 | 8.9 | 23.1 | 70 |
| Example 11 | 120 | 105 | 45.6 | 7.7 | 22.4 | 70 |
| Example 12 | 120 | 105 | 37.5 | 8.3 | 24.5 | 70 |
| Example 13 | 120 | 105 | 46.2 | 6.8 | 24.1 | 70 |
| Example 14 | 120 | 105 | 39.5 | 7.8 | 24.2 | 70 |
| Example 15 | 120 | 105 | 46.0 | 7.1 | 24.6 | 70 |
| Example 16 | 120 | 105 | 39.2 | 7.7 | 23.6 | 70 |
| Example 17 | 120 | 105 | 46.7 | 6.8 | 24.1 | 70 |
| Example 18 | 120 | 105 | 38.9 | 9.2 | 24.3 | 70 |
| Example 19 | 120 | 105 | 35.8 | 7.5 | 24.8 | 60 |
| Example 20 | 120 | 105 | 36.0 | 7.2 | 25.2 | 60 |
| Example 21 | 120 | 105 | 36.8 | 7.0 | 25.2 | 70 |
| Example 22 | 120 | 105 | 34.0 | 8.2 | 24.6 | 70 |
| Example 23 | 120 | 105 | 34.8 | 8.5 | 24.0 | 70 |
| Example 24 | 120 | 105 | 35.0 | 8.7 | 24.2 | 70 |
| Example 25 | 120 | 105 | 39.5 | 8.6 | 25.6 | 70 |
| Example 26 | 120 | 105 | 38.5 | 7.8 | 24.0 | 60 |
| Example 27 | 120 | 105 | 38.8 | 8.9 | 24.8 | 70 |
| Comp. Ex. 4 | 120 | 105 | 52.0 | 9.2 | 25.3 | 80 |
| Comp. Ex. 5 | 120 | 105 | 64.0 | 10.2 | 25.0 | 80 |

From the results described above, it was confirmed that the positive resist compositions of Examples 1 to 27 according to the present invention exhibited superior sensitivity and excellent resolution, as compared to those obtained in Comparative Examples 1 to 5, while yielding substantially the same LER and EL margin values as those for the resist compositions of Comparative Examples 1 to 5.

What is claimed is:

1. A positive resist composition comprising:

a base component (A) that exhibits increased solubility in an alkali developing solution under action of acid; and a sensitizer (G), wherein said sensitizer (G) is at least one compound selected from the group consisting of a polymeric compound (G1) having a core portion that includes a hydrocarbon group or a heterocycle of two or more valences and also at least one arm portion that is bonded to said core portion and is represented by general formula (1) shown below, and a polymeric compound (G2) having a core portion that includes a polymer having a molecular weight of 500 or more and 20,000 or less and also at least one arm portion that is bonded to said core portion and is represented by general formula (1) shown below; and said base component (A) includes a resin component (A1) that generates acid upon exposure and also exhibits increased solubility in an alkali developing solution under action of acid, and said component (A1) includes a structural unit (a0-2) having a group represented by general formula (a0-2-10) or (a0-2-20) shown below and generating acid upon exposure;

the amount of the component (G) based on the combined total of said component (A) and said component (G) is 1 to 30% by weight:

—(X)—Y     (1)

wherein X represents a divalent linking group having an acid dissociable group; and Y represents a polymer chain;

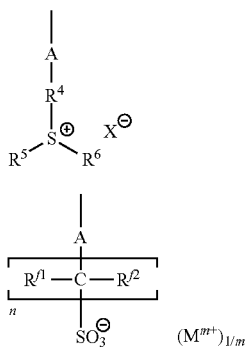

(a0-2-10)

(a0-2-20)

wherein A represents a single bond or a divalent linking group; $R^4$ represents an arylene group which may have a substituent; each of $R^5$ and $R^6$ independently represents an organic group, wherein $R^5$ and $R^6$ may be mutually bonded to form a ring with the sulfur atom in the formula;

$X^-$ represents a counter anion; each of $R^{f1}$ and $R^{f2}$ independently represents a hydrogen atom, an alkyl group, a fluorine atom or a fluorinated alkyl group, provided that at least one of $R^{f1}$ and $R^{f2}$ represents a fluorine atom or a fluorinated alkyl group; n represents an integer of 1 to 8; $M^{m+}$ represents a counter cation; and m represents an integer of 1 to 3.

2. The positive resist composition according to claim 1, wherein said structural unit (a0-2) is a structural unit represented by general formula (a0-2-1) or (a0-2-2) shown below:

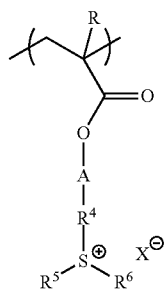

(a0-2-1)

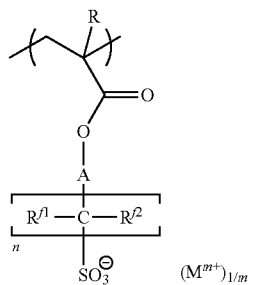

(a0-2-2)

wherein R represents a hydrogen atom, an alkyl group of 1 to 5 carbon atoms or a halogenated alkyl group of 1 to 5 carbon atoms; A represents a single bond or a divalent linking group; $R^4$ represents an arylene group which may have a substituent; each of $R^5$ and $R^6$ independently represents an organic group, wherein $R^5$ and $R^6$ may be mutually bonded to form a ring with the sulfur atom in the formula; $X^-$ represents a counter anion; each of $R^{f1}$ and $R^{f2}$ independently represents a hydrogen atom, an alkyl group, a fluorine atom or a fluorinated alkyl group, provided that at least one of $R^{f1}$ and $R^{f2}$ represents a fluorine atom or a fluorinated alkyl group; n represents an integer of 1 to 8; $M^{m+}$ represents a counter cation; and m represents an integer of 1 to 3.

3. A method of forming a resist pattern, comprising:

applying a positive resist composition of any one of claims 1 and 2 to a substrate to form a resist film on the substrate;

conducting exposure of said resist film; and alkali-developing said resist film to form a resist pattern.

* * * * *

UNITED STATES PATENT AND TRADEMARK OFFICE
CERTIFICATE OF CORRECTION

PATENT NO. : 8,586,281 B2
APPLICATION NO. : 13/156159
DATED : November 19, 2013
INVENTOR(S) : Jun Iwashita et al.

It is certified that error appears in the above-identified patent and that said Letters Patent is hereby corrected as shown below:

In the Specification

At Column 23, Lines 1-5 (Approx.),

Change " 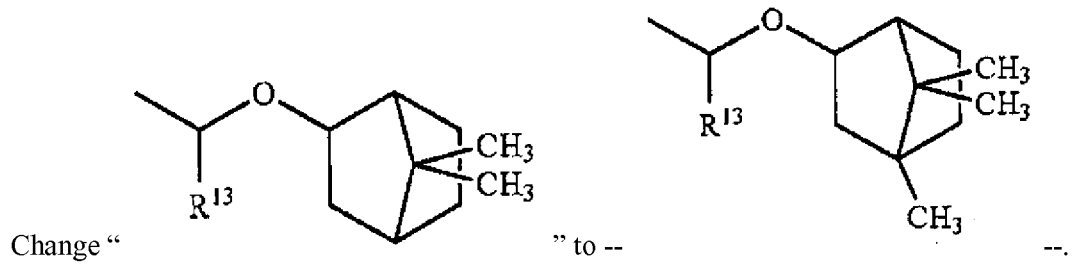 " to -- --.

At Column 24, Line 20 (Approx.), Change "—$(CH_2)_n$—" to -- —$(CH_2)_a$— --.

At Column 64, Line 33 (Approx.), Change "$O]_mB_1$" to --$O]_m$-$B_1$--.

At Column 69, Lines 21-30 (Approx.),

Change " 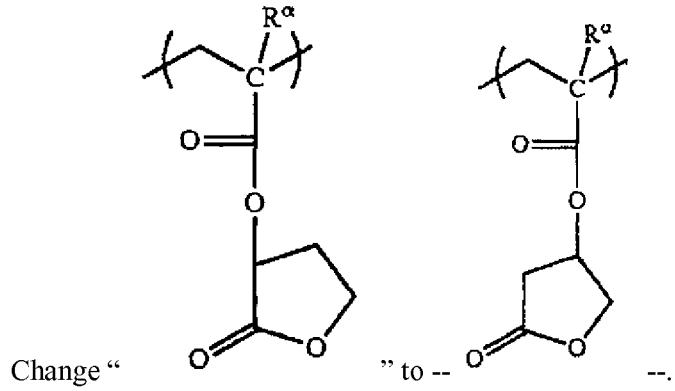 " to -- --.

Signed and Sealed this
Fifteenth Day of July, 2014

Michelle K. Lee
*Deputy Director of the United States Patent and Trademark Office*

CERTIFICATE OF CORRECTION (continued)
U.S. Pat. No. 8,586,281 B2

At Column 71, Lines 19-31 (Approx.),

Change " 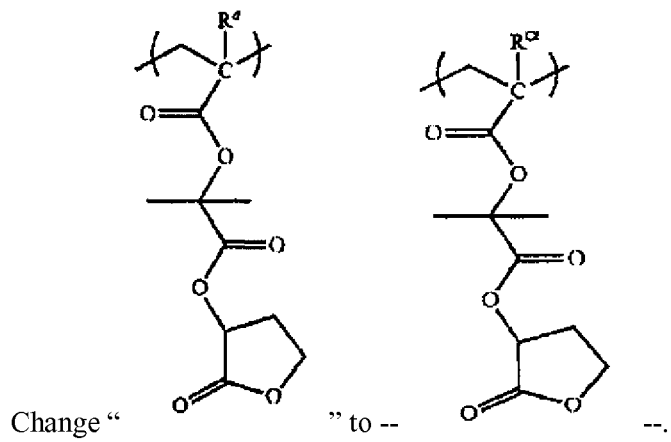 " to -- --.

At Column 71, Lines 35-50 (Approx.),

Change " 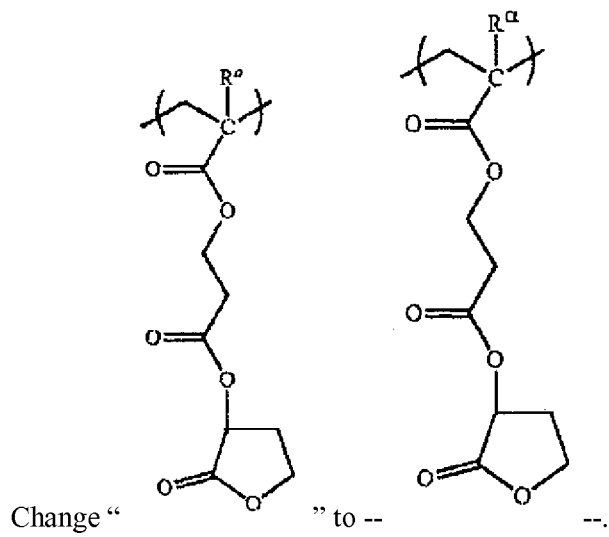 " to -- --.

At Column 76, Lines 57-67 (Approx.),

Change " 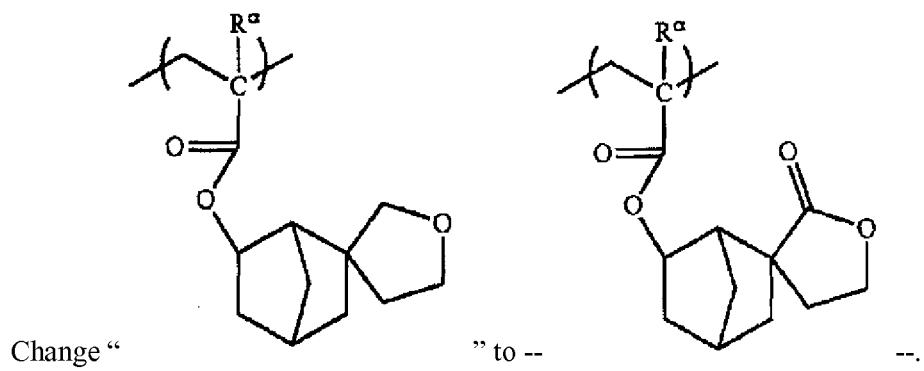 " to -- --.

At Column 77, Lines 25-34 (Approx.),

Change " 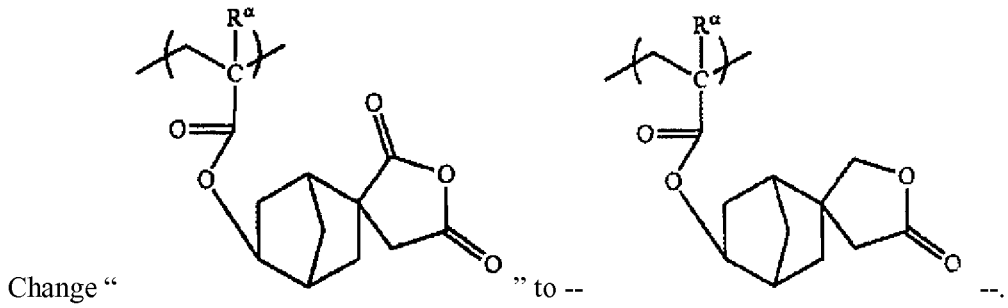 " to -- --.

At Column 83, Line 10 (Approx.), Change "off" to --of f--.

At Column 84, Line 49, Change "I'" to --1'--.

At Column 85, Line 38, Change "(a-4-1) to (a-4-5)" to --(a4-1) to (a4-5)--.

At Column 88, Line 53 (Approx.), Change "dicyclohexylcarboxylmide" to --dicyclohexylcarboxyimide--.

At Column 92, Lines 18-23 (Approx.),

Change " 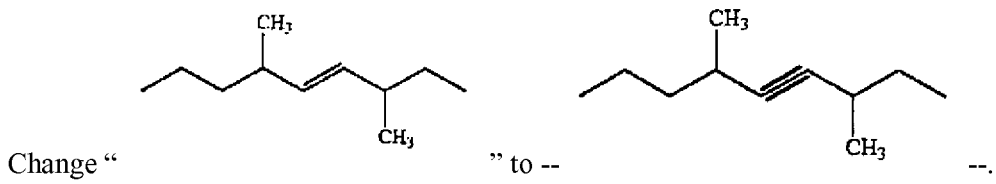 " to -- --.

At Column 98, Line 9 (Approx.), Change "(1)." to --(I).--.

At Column 99, Line 29, Change "Rc" to --$R^c$--.

At Column 100, Line 27, Change "(1)." to --(I).--.

At Column 101, Line 64, Change "(VH-b)" to --(VII-b)--.

At Column 107, Line 50, Change "—CH2)n-W"," to -- —$CH_2)_n$-W",--.

At Column 120, Line 63, Change "Cl" to --C1--.

At Column 133, Line 14, Change "Y'," to --$Y^1$,--.

At Column 134, Line 66, Change "(31)" to --(b1)--.

At Column 136, Line 31, Change "X'" to --X"--.

CERTIFICATE OF CORRECTION (continued)
U.S. Pat. No. 8,586,281 B2

At Column 137, Line 64, Change "SO3⁻)" to --$SO_3^-$)--.

At Column 140, Line 29, Change "a[(p" to --α-[(p--.

At Column 141, Line 37, Change "bis(phenylsulfonyldiazomethylsulfonyepropane," to --bis(phenylsulfonyldiazomethylsulfonyl)propane,--.

At Column 142, Line 22, Change "mono alkylamines" to --monoalkylamines--.

At Column 147, Line 5, Change "US2010-55606A 1." to --US2010-55606A1.--.

At Column 147, Line 11 (Approx.), Change "Synthesis" to --(Synthesis--.

At Column 150, Line 2, Change "though" to --through--.

At Column 156, Line 67, Change "(a 1)" to --(a1)--.

At Column 165, Line 48 (Approx.), Change "10%" to --±10%--.

At Column 165, Line 49 (Approx.), Change "widthof" to --width of--.

In the Claims

At Column 168, Line 35 (Approx.), In Claim 2, change "$R^{f2}$independently" to --$R^{f2}$ independently--.